(12) United States Patent
Shimoichi

(10) Patent No.: US 11,410,985 B2
(45) Date of Patent: Aug. 9, 2022

(54) CHIP COMPONENT

(71) Applicant: ROHM CO., LTD., Kyoto (JP)

(72) Inventor: Takuma Shimoichi, Kyoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 259 days.

(21) Appl. No.: 16/898,950

(22) Filed: Jun. 11, 2020

(65) Prior Publication Data
US 2020/0395353 A1 Dec. 17, 2020

(30) Foreign Application Priority Data

Jun. 17, 2019 (JP) .............................. JP2019-112235

(51) Int. Cl.
H01L 27/01 (2006.01)
H01L 23/522 (2006.01)
H01L 49/02 (2006.01)
H03H 7/01 (2006.01)

(52) U.S. Cl.
CPC ........ *H01L 27/016* (2013.01); *H01L 23/5223* (2013.01); *H01L 23/5227* (2013.01); *H01L 28/10* (2013.01); *H01L 28/40* (2013.01); *H03H 7/0115* (2013.01)

(58) Field of Classification Search
CPC ............... H01L 27/016; H01L 23/5223; H01L 23/5227; H01L 28/10; H01L 28/40; H03H 2001/0078; H03H 7/0115
See application file for complete search history.

(56) References Cited

U.S. PATENT DOCUMENTS

2007/0109719 A1* 5/2007 Kuwajima ............... H01G 4/40
361/311
2016/0307702 A1* 10/2016 Tanaka .................... H01G 4/012
2018/0316331 A1* 11/2018 Nakaiso ................ H01F 41/041

FOREIGN PATENT DOCUMENTS

JP 2016-201517 A 12/2016

* cited by examiner

*Primary Examiner* — Joseph C. Nicely
(74) *Attorney, Agent, or Firm* — Rabin & Berdo, P.C.

(57) ABSTRACT

The present invention provides a chip component that achieves outstanding LC characteristics.
The present invention provides a chip component (1), including: a substrate (12); an inorganic insulating layer (13), formed on the substrate (12); an organic insulating layer (14), formed on the inorganic insulating layer (13); and an LC circuit (6), including a first capacitor (C1) formed in the inorganic insulating layer (13), and a first inductor (L1) formed, in a manner of being electrically connected to the first capacitor (C1), in the organic insulating layer (14).

19 Claims, 44 Drawing Sheets

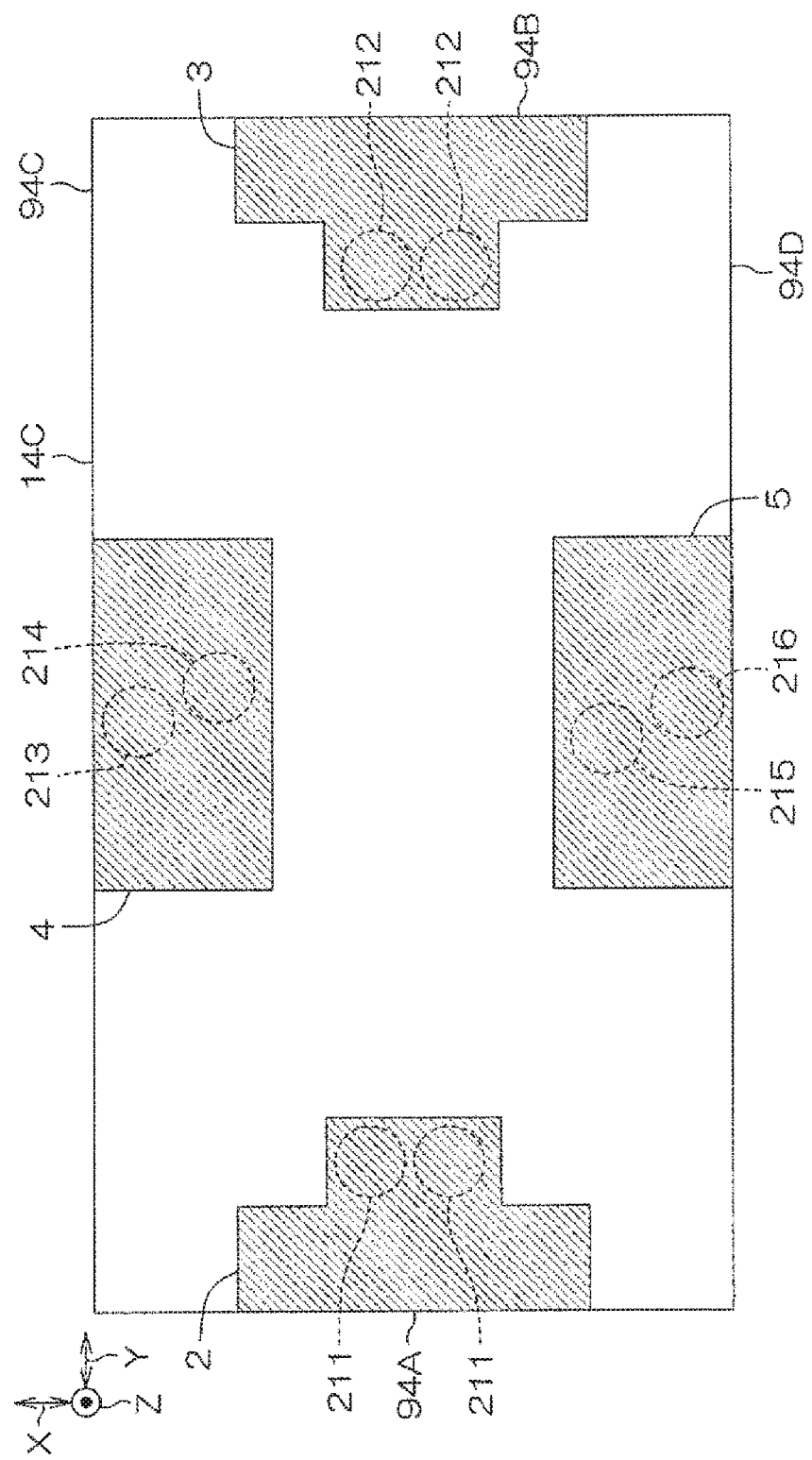

CHIP COMPONENT

BACKGROUND OF THE INVENTION

Field of the Invention

The present invention relates to a chip component comprising an LC circuit.

Description of the Prior Art

Patent document 1 discloses an electronic component, which includes an insulating layer, a coil formed in the insulating layer, and a capacitor formed in the insulating layer, wherein the coil and the capacitor form an LC circuit.

PRIOR ART DOCUMENT

[Patent Publication]
[Patent document 1] Japan Patent Publication No. 2016-201517

SUMMARY OF THE INVENTION

Problems to be Solved by the Invention

A chip component that achieves outstanding LC characteristics is provided according to an embodiment of the present invention.

Technical Means for Solving the Problem

A chip component is provided according to an embodiment of the present invention. The chip component includes: a substrate; an inorganic insulating layer, formed on the substrate; an organic insulating layer, formed on the inorganic insulating layer; and an LC circuit, including a capacitor formed in the inorganic insulating layer, and an inductor formed, in a manner of being electrically connected to the capacitor, in the organic insulating layer. The chip component is capable of achieving outstanding LC characteristics.

A chip component is provided according to an embodiment of the present invention. The chip component includes: a substrate; an inorganic insulating layer, formed on the substrate; an organic insulating layer, formed on the inorganic insulating layer; a capacitor, including a lower electrode disposed in the inorganic insulating layer, and an upper electrode disposed in the inorganic insulating layer by facing the lower electrode with a portion of the inorganic insulating layer spaced in between; and an inductor, including a spiral coil conductor disposed in the organic insulating layer, the inductor and the capacitor forming an LC circuit. The chip component is capable of achieving outstanding LC characteristics.

BRIEF DESCRIPTION OF THE DRAWINGS

FIG. 13 is a top view of a structure on the third organic insulating layer in FIG. 5;

FIG. 14H.

DETAILED DESCRIPTION OF THE EMBODIMENTS

Details of the present invention are given in preferred embodiments with the accompanying drawings below.

Figure 1:
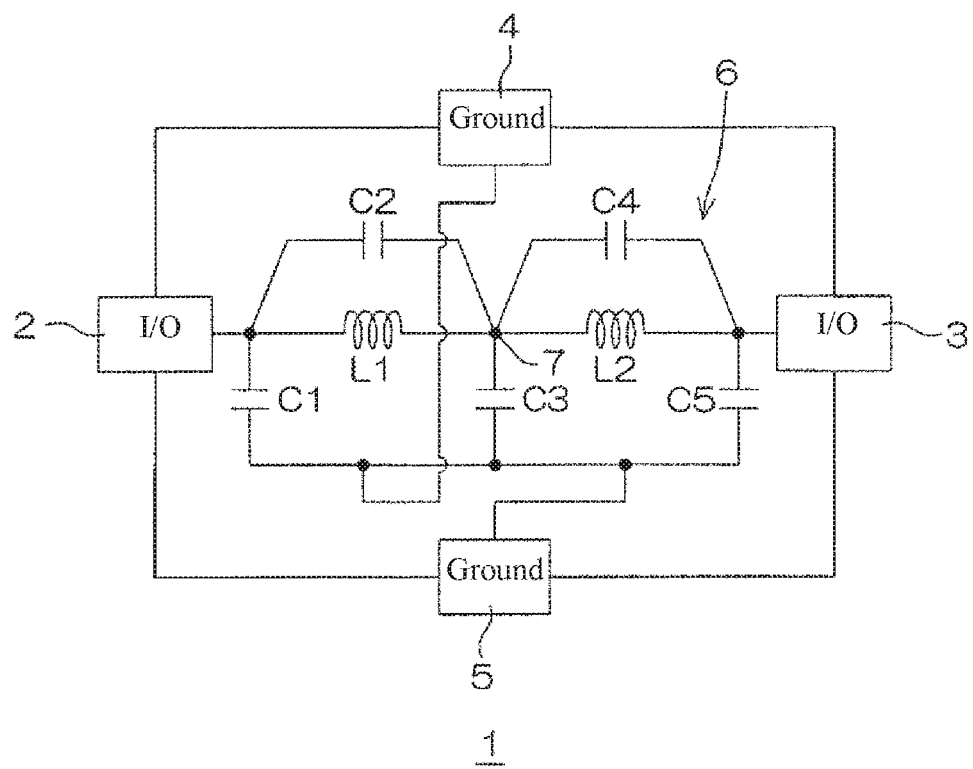
FIG. 1 is a circuit diagram of an electrical structure of a chip component to which an LC circuit of a first exemplary mode is incorporated according to an embodiment of the present invention.

FIG. 1 shows a circuit diagram of an electrical structure of a chip component 1 to which an LC circuit 6 of a first exemplary mode is incorporated according to an embodiment of the present invention.

The chip component 1 includes a plurality of external terminals 2, 3, 4 and 5, and an LC circuit 6. The plurality of external terminals 2 to 5 include a first input/output (I/O) terminal 2, a second I/O terminal 3, a first reference terminal 4 and a second reference terminal 5.

The first I/O terminal 2 functions as an input terminal for transmitting an input signal to the LC circuit 6, or an output terminal for transmitting an output signal from the LC circuit 6 to the exterior. The second I/O terminal 3 functions as an input terminal for transmitting an input signal to the input terminal of the LC circuit 6, or an output terminal for transmitting the output signal from the LC circuit 6 to the exterior.

When the first I/O terminal 2 functions as an input terminal, the second I/O terminal 3 functions as an output terminal. When the first I/O terminal 2 functions as an output terminal, the second I/O terminal 3 functions as an input terminal. The first reference terminal 4 transmits a reference voltage (for example, ground voltage) to the LC circuit 6. The second reference terminal 5 transits a reference voltage (for example, ground voltage) to the LC circuit 6.

The LC circuit 6 includes one or more (two in this mode) inductors L1 and L2, and one or more (five in this mode) capacitors C1, C2, C3, C4 and C5. The plurality of inductors L1 and L2 include a first inductor L1 and a second inductor L2. The plurality of capacitors C1 to C5 include a first capacitor C1, a second capacitor C2, a third capacitor C3, a fourth capacitor C4 and a fifth capacitor C5.

The first inductor L1 is connected to the first I/O terminal 2. The second inductor L2 is connected to the first inductor L1 and the second I/O terminal 3. In the description below, a connecting portion of the first inductor L1 and the second inductor L2 is to be referred to as an inductor connecting portion 7.

The first capacitor C1 is connected to the first I/O terminal 2 and the first reference terminal 4 (the second reference terminal 5). The second capacitor C2 is connected in parallel to the first inductor L1. The third capacitor C3 is connected to the inductor connecting portion 7 and the first reference terminal 4 (the second reference terminal 5). The fourth capacitor C4 is connected in parallel to the second inductor L2. The fifth capacitor C5 is connected to the second I/O terminal 3 and the second reference terminal 5 (the first reference terminal 4).

The LC circuit 6 includes a ladder filter circuit, which includes the first and second inductors L1 and L2, and the first to fifth capacitors C1 to C5. More specifically, the LC circuit 6 includes an elliptic filter circuit. The elliptic filter circuit consists of a ladder elliptic low-pass filter circuit.

The elliptic filter circuit includes, from the first I/O terminal 2 toward the second I/O terminal 3, an L-type filter circuit and a π-type filter circuit. The L-type filter circuit includes the first capacitor C1, the second capacitor C2 and the first inductor L1. The π-type filter circuit includes the third capacitor C3, the fourth capacitor C4, the fifth capacitor C5 and the second inductor L2.

The elliptic filter circuit includes, from the second I/O terminal 3 toward the first I/O terminal 2, an L-type filter circuit and a π-type filter circuit. The L-type filter circuit includes the fourth capacitor C4, the fifth capacitor C5 and the second inductor L2. The π-type filter circuit includes the first capacitor C1, the second capacitor C2, the third capacitor C3 and the first inductor L1.

The elliptic filter circuit includes, from the first I/O terminal 2 toward the second I/O terminal 3, the first capacitor C1, a T-type filter circuit and the fifth capacitor C5. The T-type filter circuit includes the second capacitor C2, the third capacitor C3, the fourth capacitor C4, the first inductor L1 and the second inductor L2.

Figure 2:
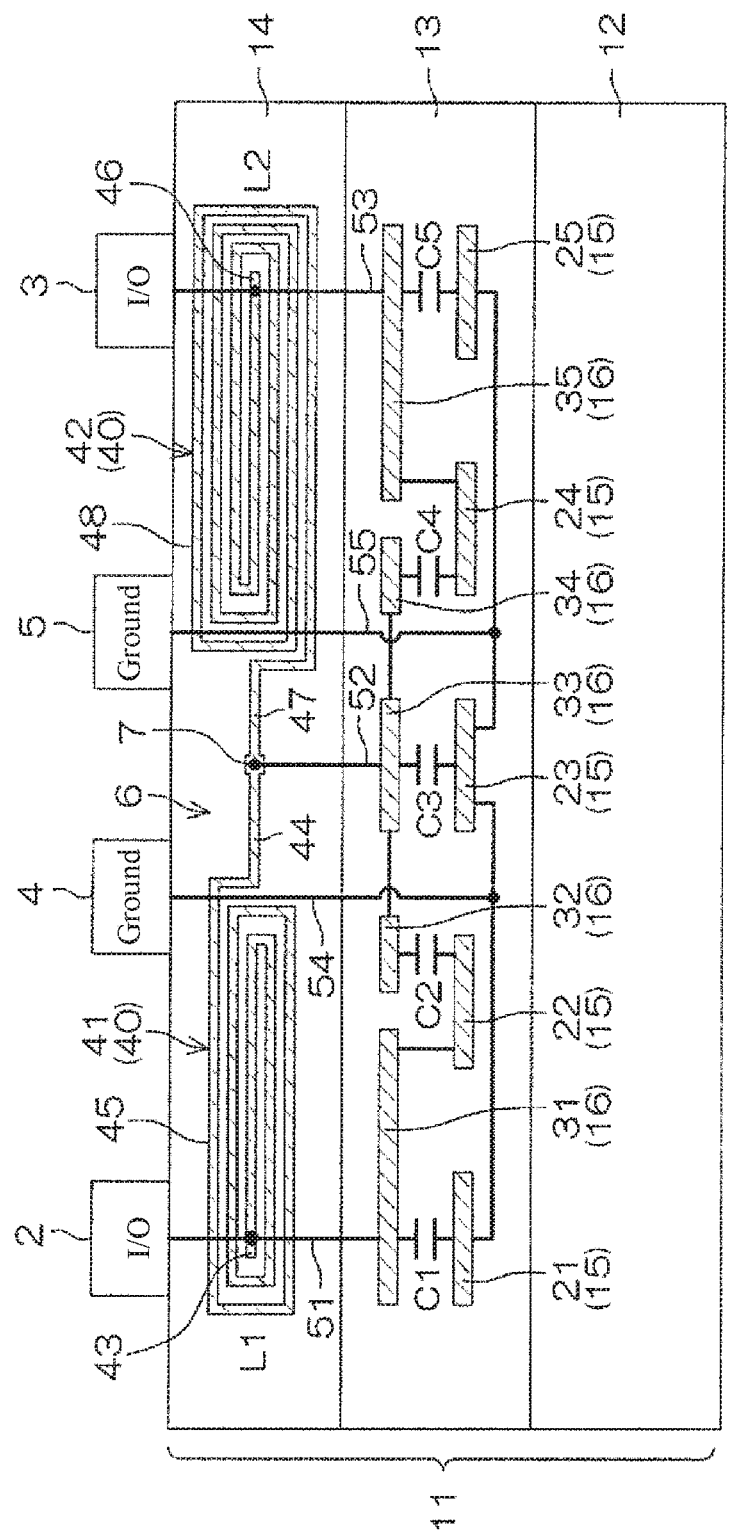
FIG. 2 is a section diagram of a brief configuration of the chip component in FIG. 1.

FIG. 2 shows a section view of a brief configuration of the chip component 1 in FIG. 1.

Referring to FIG. 2, the chip component 2 includes a chip body 11. The chip body 11 has a multilayer structure including a substrate 2, an inorganic insulating layer 13, and an organic insulating layer 14. The inorganic insulating layer 13 is deposited on the substrate 12. The organic insulating layer 14 is deposited on the inorganic insulating layer 13.

The chip component 1 includes a lower electrode 15 and an upper electrode 16 disposed in the inorganic insulating layer 13. The lower electrode 15 and the upper electrode 16 are formed as layers (films), respectively. In this mode, each lower electrode 15 includes a first lower electrode 21, a second lower electrode 22, a third lower electrode 23, a fourth lower electrode 24, and a fifth lower electrode 25.

The first to fifth lower electrodes 21 to 25 are sequentially formed at intervals from one end of the chip body 11 toward the other end. The first to fifth lower electrodes 21 to 25 are formed at the same layer in the inorganic insulating layer 13. The first lower electrode 21, the third lower electrode 23 and the fifth lower electrode 25 are fixed at the same potential.

The upper electrode 16 is disposed in the inorganic insulating layer 13 by facing the lower electrode 15 with a portion of the inorganic insulating layer 13 spaced in between. More specifically, the upper electrode 16 is disposed on the side of the organic insulating layer 14 by a space from the lower electrode 15 in the inorganic insulating layer 13. The upper electrode 16 faces the lower electrode 15 in a layering direction of the inorganic insulating layer 13 with a portion of the inorganic insulating layer 13 spaced in between.

In this mode, the upper electrode 16 includes a first upper electrode 31, a second upper electrode 32, a third upper electrode 33, a fourth upper electrode 34 and a fifth upper electrode 35. The first to fifth upper electrodes 31 to 35 are sequentially formed at intervals from one end of the chip body 11 toward the other end. The first to fifth upper electrodes 31 to 35 are formed at the same layer in the inorganic insulating layer 13.

The first upper electrode 31 faces the first lower electrode 21 with a portion of the inorganic insulating layer 13 spaced in between. The first capacitor C1 is formed between the first upper electrode 31 and the first lower electrode 21. The first upper electrode 31 and the second lower electrode 22 are fixed at the same potential.

The second upper electrode 32 faces the second lower electrode 22 with a portion of the inorganic insulating layer 13 spaced in between. The second capacitor C2 is formed between the second upper electrode 32 and the second lower electrode 22. The third upper electrode 33 faces the third lower electrode 23 with a portion of the inorganic insulating layer 13 spaced in between. The third capacitor C3 is formed between the third upper electrode 33 and the third lower electrode 23. The third upper electrode 33 and the second upper electrode 32 are fixed at the same potential.

The fourth upper electrode 34 faces the fourth lower electrode 24 with a portion of the inorganic insulating layer 13 spaced in between. The fourth capacitor C4 is formed between the fourth upper electrode 34 and the fourth lower electrode 24. The fourth upper electrode 34 and the third upper electrode 33 are fixed at the same potential.

The fifth upper electrode 35 faces the fifth lower electrode 25 with a portion of the inorganic insulating layer 13 spaced in between. The fifth capacitor C5 is formed between the fifth upper electrode 35 and the fifth lower electrode 25. The fifth upper electrode 35 and the fourth lower electrode 24 are fixed at the same potential.

The chip component 1 includes a spiral coil conductor 40 disposed in the organic insulating layer 14. In a top view from a layering direction of the organic insulating layer 14, the coil conductor 40 is formed as spiral-shaped.

In this mode, the coil conductor 40 includes a first coil conductor 41 and a second coil conductor 42. The first and second coil conductors 41 and 42 are sequentially formed at an interval from one end of the chip body 11 toward the other end. The first coil conductor 41 forms the first inductor L1 in the organic insulating layer 14. The second coil conductor 42 forms the second inductor L2 in the organic insulating layer 14.

The first coil conductor 41 includes a first inner end 43, a first outer end 44, and a first spiral portion 45 wound between the first inner end 43 and the first outer end 44. The first inner end 43 is located on one end side of the chip body 11 in a top view. The first outer end 44 is located on the other end side of the chip body 11 in a top view. In this mode, the first outer end 44 is located in a center portion of a first chip main surface 62 in a top view.

The first spiral portion 45 winds outward from the first inner end 43 toward the first outer end 44. The first inner end 43 and the first upper electrode 31 are fixed at the same potential. The first outer end 44 and the third upper electrode 33 are fixed at the same potential.

In this mode, the number of turns of the first coil conductor 41 is 3. The number of turns of the first coil conductor 41 is any desired value, and is adjusted according to an inductance value expected to achieve. The number of turns of the first coil conductor 41 may also be more than 2 and less than 20. The number of turns of the first coil conductor 41 may also be more than 2 and less than 5, more than 5 and less than 10, more than 10 and less than 15, or more than 15 and less than 20.

The second coil conductor 42 includes a second inner end 46, a second outer end 47, and a second spiral portion 48 wound between the second inner end 46 and the second outer end 47. The second inner end 46 is located on the other end side of the chip body 11 in a top view. The second outer end 47 is located on one end side of the chip body 11 in a top view. In this mode, the second outer end 47 is located in the center portion of the first chip main surface 62 in a top view.

The second spiral portion 48 winds outward from the second inner end 47 toward the second outer end 48. The second inner end 46 and the fifth upper electrode 35 are fixed at the same potential. The second outer end 47 and the third upper electrode 33 are fixed at the same potential. In this mode, the second outer end 47 is connected to the first outer end 44. The inductor connecting portion 7 is formed by a connecting portion of the first outer end 44 and the second outer end 47.

In this mode, the number of turns of the second coil conductor 42 is more than the number of turns of the first coil conductor 41. In this mode, the number of turns of the second coil conductor 42 is 4. The number of turns of the second coil conductor 42 is any desired value, and is adjusted according to an inductance value expected to achieve. The number of turns of the second coil conductor 42 may be more than 2 and less than 20. The number of turns of the second coil conductor 42 may also be more than 2 and less than 5, more than 5 and less than 10, more than 10 and less than 15, or more than 15 and less than 20.

The chip component 1 includes a first wiring 51, a second wiring 52, a third wiring 53, a fourth wiring 54 and a fifth wiring 55. The first wiring 51 is electrically connected to the first upper electrode 31 in the inorganic insulating layer 13, and is electrically connected to the first inner end 43 of the first coil conductor 41 in the organic insulating layer 14.

The second wiring 52 is electrically connected to the third upper electrode 33 in the inorganic insulating layer 13, and is electrically connected to the inductor connecting portion 7 in the organic insulating layer 14. The third wiring 53 is electrically connected to the fifth upper electrode 35 in the inorganic insulating layer 13, and is electrically connected to the second inner end 46 of the second coil conductor 42 in the organic insulating layer 14.

The fourth wiring 54 is electrically connected to the first lower electrode 21 and the third lower electrode 23 in the inorganic insulating layer 13. The fourth wiring 54 is pulled out from the inorganic insulating layer 13 into the organic insulating layer 14. The fifth wiring 55 is electrically connected to the third lower electrode 23 and the fifth lower electrode 25 in the inorganic insulating layer 13. The fifth wiring 55 is pulled out from the inorganic insulating layer 13 into the organic insulating layer 14.

The first I/O terminal 2, the second I/O terminal 3, the first reference terminal 4 and the second reference terminal 5 are exposed from the organic layer 14. The first I/O terminal 2 is electrically connected to the first wiring 51. Thus, the first I/O terminal 2 is electrically connected to the first inner end 43 of the first coil conductor 41 and the first upper electrode 31 by the first wiring 51.

The second I/O terminal 3 is electrically connected to the third wiring 53. Thus, the second I/O terminal 3 is electrically connected to the second inner end 46 of the second coil conductor 42 and the fifth upper electrode 35 by the third wiring 53.

The first reference terminal 4 is electrically connected to the fourth wiring 54. Thus, the first reference terminal 4 is electrically connected to the first lower electrode 21 and the third lower electrode 23 by the fourth wiring 54. The second reference terminal 5 is electrically connected to the fifth wiring 55. Thus, the second reference terminal 5 is electrically connected to the third lower electrode 23 and the fifth lower electrode 25 by the fifth wiring 55.

The inorganic insulating layer 13 has a relative dielectric constant larger than that of the organic insulating layer 14. Further, the inorganic insulating layer 13 is better than the organic insulating layer 14 from an aspect of thinness. Therefore, by forming the lower electrode 15 and the upper electrode 16 in the inorganic insulating layer 13, the first to fifth capacitors C1 to C5 in form of thin film and having outstanding capacitance values may be achieved.

Further, the first and second inductors L1 and L2 (the coil conductor 40) having sufficient thicknesses may be formed in the organic insulating layer 14. As an example, the first and second inductors L1 and L2 (the coil conductor 40) having thicknesses larger than that of the inorganic insulating layer 13 may be formed. Thus, parasitic resistance of the first and second inductors L1 and L2 may be suppressed. Further, parasitic capacitance of the first and second inductors L1 and L2 as well as the first to fifth capacitors C1 to C5 may be lowered by the organic insulating layer 14.

Further, the first and second inductors L1 and L2 and the first to fifth capacitors C1 to C5 are disposed in the inorganic insulating layer 13 and the organic insulating layer 14 deposited on the substrate 12. Thus, wiring distances among the first and second inductors L1 and L2 and the first to fifth capacitors C1 to C5 may be reduced, hence lowering wiring resistance.

Therefore, the chip component 1 is capable of increasing a Q value of the LC circuit 6, hence achieving outstanding LC characteristics. Further, two-dimensional upscaling in chip size may be restrained by the three-dimensional multilayer structure including the first and second inductors L1 and L2 and the first to fifth capacitors C1 to C5. Therefore, the chip component 1 may be miniaturized.

Figure 3:
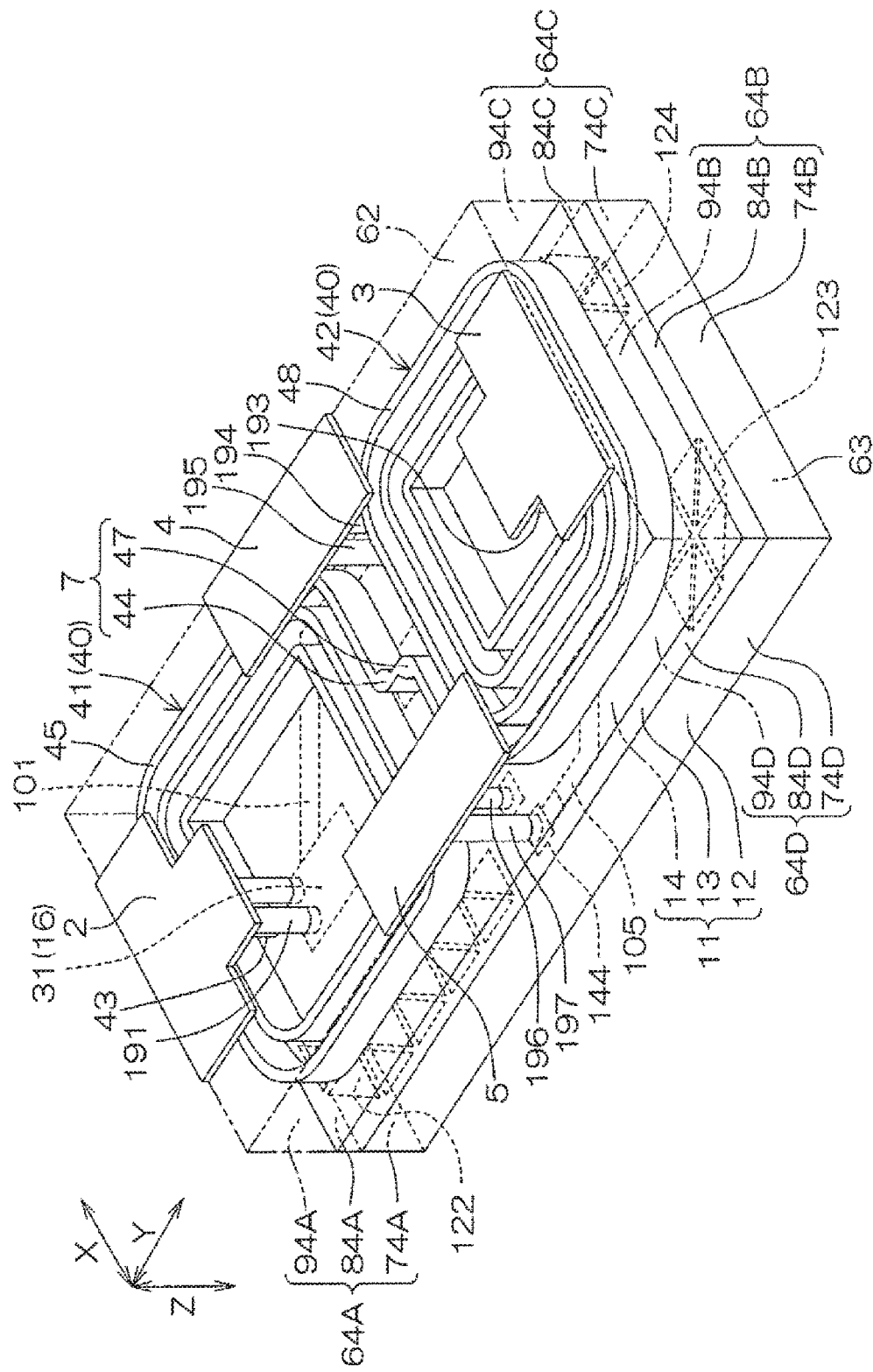
FIG. 3 is a perspective view of the chip component in FIG. 1.
Figure 4:
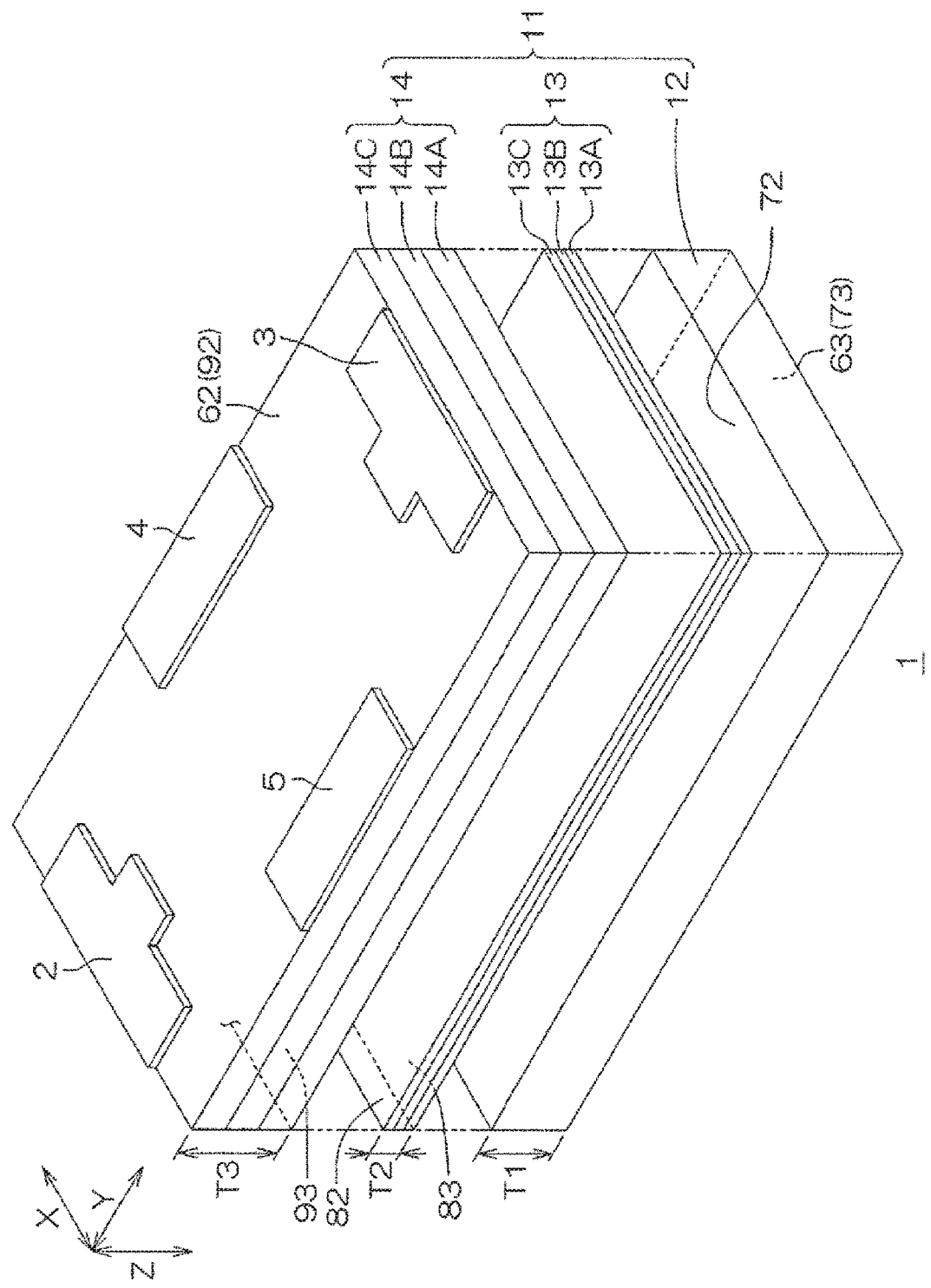
FIG. 4 is an exploded perspective view of the chip component in FIG. 3.

In the description below, referring to FIG. 3 to FIG. 13, the specific structure of the chip component 1 is described. FIG. 3 shows a perspective view of the chip component 1 in FIG. 1. FIG. 4 shows an exploded perspective view of the chip component 1 in FIG. 1.

Referring to FIG. 3 and FIG. 4, the chip component 1 is a miniature electronic device referred to as a 1005 (1 mm×0.5 mm) chip, 0603 (0.6 mm×0.3 mm) chip, 0402 (0.4 mm×0.2 mm) chip, and 03015 (0.3 mm×0.15 mm) chip based on the two-dimensional dimensions.

The chip body 11 is formed as rectangular in shape. The chip body 11 also serves as a package. That is to say, the chip component 1 consists of a chip size package, which has a chip size cut from a base substrate as the package size.

The chip body 11 includes a first chip main surface 62 on one side, a second chip main surface 63 on the other side, and four chip sidewalls 64A, 64B, 64C and 64D connected to the first chip main surface 62 and the second chip main surface 63. The first chip main surface 62 and the second chip main surface 63 are formed as quadrilateral in shape (rectangular in this mode) in a top view from a normal direction Z thereof.

More specifically, the chip sidewalls 64A to 64D include a first chip sidewall 64A, a second chip sidewall 64B, a third chip sidewall 64C and a fourth chip sidewall 64D. The first chip sidewall 64A and the second chip sidewall 64B extend along a first direction X, and face each other in a second direction Y crossing the first direction X. The third chip sidewall 64C and the fourth chip sidewall 64D extend along the second direction Y, and face each other in the first direction X. More specifically, the second direction Y is orthogonal to the first direction X.

The chip sidewalls 64A to 64D are formed as being perpendicular to the first chip main surface 62 and the second chip main surface 63, respectively. The chip sidewalls 64A to 64D flatly extend along the normal direction Z, respectively. "1005", "0603", "0402" and "03015" above are defined according to the lengths of the chip sidewalls 64A to 64D. The chip sidewalls 64A to 64D may adopt various values in a range of more than 0.1 mm and less than 20 mm.

The substrate 12 is formed as rectangular in shape. The substrate 12 includes a first substrate main surface 72 on one side, a second substrate main surface 73 on the other side, and four substrate sidewalls 74A, 74B, 74C and 74D connected to the first substrate main surface 72 and the second substrate main surface 73.

The first substrate main surface 72 and the second substrate main surface 73 are formed as quadrilateral in shape (rectangular in this mode) in a top view. The second substrate main surface 73 forms the second chip main surface 63. The substrate sidewalls 74A to 74D include a first substrate sidewall 74A, a second substrate sidewall 74B, a third substrate sidewall 74C and a fourth substrate sidewall 74D. The substrate sidewalls 74A to 74D form a portion of the chip sidewalls 64A to 64D, respectively.

The substrate 12 may have a thickness T1 of more than 50 μm and less than 500 μm. The thickness T1 may also be more than 50 μm and less than 100 μm, more than 100 μm and less than 150 μm, more than 150 μm and less than 200 μm, more than 200 μm and less than 250 μm, more than 250 μm and less than 300 μm, more than 300 μm and less than 400 μm, or more than 400 μm and less than 500 μm. The thickness T1 is preferably more than 50 μm and less than 150 μm.

The inorganic insulating layer 13 consists of an insulating layer formed by an inorganic insulator. The inorganic insulating layer 13 is deposited on the first substrate main surface 72. The inorganic insulating layer 13 includes a first inorganic main surface 82, a second inorganic main surface 83 on the other side, and inorganic sidewalls 84A, 84B, 84C and 84D connected to the first inorganic main surface 82 and the second inorganic main surface 83.

The second inorganic main surface 83 is airtightly connected to the first substrate main surface 72. The first inorganic main surface 82 and the second inorganic main surface 83 extend in parallel relative to the first substrate main surface 72. The first inorganic main surface 82 and the second inorganic main surface 83 are formed as quadrilaterals aligned with the first substrate main surface 72 in a top view.

The inorganic sidewalls 84A to 84D include a first inorganic sidewall 84A, a second inorganic sidewall 84B, a third inorganic sidewall 84C and a fourth inorganic sidewall 84D. The inorganic sidewalls 84A to 84D extend from the periphery of the first inorganic main surface 82 toward the substrate 12. The inorganic sidewalls 84A to 84D are connected to the substrate sidewalls 74A to 74D. Thus, the inorganic sidewalls 84A to 84D form a portion of the chip sidewalls 64A to 64D, respectively. The inorganic sidewalls 84A to 84D may also be formed on the same plane relative to the substrate sidewalls 74A to 74D.

The inorganic insulating layer 13 has a thickness T2 less than the thickness T of the substrate 12. The thickness T2 of the inorganic insulating layer 13 may be more than 0.3 μm and less than 12 μm. The thickness T2 may also be more than 0.3 μm and less than 2 μm, more than 2 μm and less than 4 μm, more than 4 μm and less than 6 μm, more than 6 μm and less than 8 μm, more than 8 μm and less than 10 μm, or more than 10 μm and less than 12 μm. The thickness T2 is preferably more than 0.6 μm and less than 6 μm.

The inorganic insulating layer 13 consists of one or two of a silicon oxide layer and silicon nitride layer. The inorganic insulating layer 13 has a multilayer structure formed by depositing a plurality of insulating layers. The number of layers of the deposited insulating layers may be any desired value in a range sufficient for forming the first to fifth capacitors C1 to C5, and is not limited to a specific value. In this mode, the inorganic insulating layer 13 includes a first inorganic insulating layer 13A, a second inorganic insulating layer 13B and a third inorganic insulating layer 13C sequentially deposited from the first substrate main surface 72.

The first inorganic insulating layer 13A consists of a silicon oxide layer or a silicon nitride layer. In this mode, the first inorganic insulating layer 13A consists of a silicon oxide layer. The second inorganic insulating layer 13B consists of a silicon oxide layer or a silicon nitride layer. In this mode, the second inorganic insulating layer 13B consists of a silicon nitride layer. The third inorganic insulating layer 13C consists of a silicon oxide layer or a silicon nitride layer. In this mode, the third inorganic insulating layer 13C is made of a silicon nitride layer.

The second inorganic insulating layer 13B forms a dielectric layer of the first to fifth capacitors C1 to C5. Therefore, the second inorganic insulating layer 13B preferably includes a silicon nitride layer. The second inorganic insulating layer 13B preferably consists of a silicon nitride layer. The second inorganic insulating layer 13B may also include an ONO layer, which includes a silicon oxide layer, a silicon nitride layer and a silicon oxide layer sequentially deposited from the first inorganic insulating layer 13A.

The first to third inorganic insulating layers 13A to 13C may have thicknesses of more than 0.1 μm and less than 4 μm, respectively. The thicknesses of the first to third inorganic insulating layers 13A to 13C may be more than 0.2 m and less than 2 μm, respectively. The thicknesses of the first to third inorganic insulating layers 13A to 13C may be equal or different from one another.

The organic insulating layer 14 consists of an insulating layer formed by an organic insulator. The organic insulating layer 14 is deposited on the first inorganic main surface 82 of the inorganic insulating layer 13. The organic insulating layer 14 includes a first organic main surface 92 on one side, a second organic main surface 93 on the other side, and organic sidewalls 94A, 94B, 94C and 94D connected to the first organic main surface 92 and the second organic main surface 93.

The first organic main surface 92 forms the first chip main surface 62. The second organic main surface 93 is airtightly connected to the inorganic insulating layer 13 (the third inorganic insulating layer 13C). The first organic main surface 92 and the second organic main surface 93 extend in parallel relative to the first substrate main surface 72. The first organic main surface 92 and the second organic main surface 93 are formed as rectangles aligned with the first substrate main surface 72 in a top view.

The organic sidewalls 94A, 94B, 94C and 94D include a first organic sidewall 94A, a second organic sidewall 94B, a third organic sidewall 94C and a fourth organic sidewall 94D. The organic sidewalls 94A to 94D extend from the periphery of the first organic main surface 92 toward the inorganic insulating layer 13. The organic sidewalls 94A to 94D are connected to the inorganic sidewalls 84A to 84D, respectively. Thus, the organic sidewalls 94A to 94D form a portion of the chip sidewalls 64A to 64D, respectively. The organic sidewalls 94A to 94D may also be formed on the same plane relative to the inorganic sidewalls 84A to 84D.

The organic insulating layer 14 has a thickness T3 more than the thickness T2 of the inorganic insulating layer 13. The thickness T3 may be more than 30 μm and less than 600 μm. The thickness T3 may also be more than 30 m and less than 100 μm, more than 100 μm and less than 150 μm, more than 150 μm and less than 200 μm, more than 200 μm and less than 250 μm, more than 250 μm and less than 300 μm, more than 300 μm and less than 400 μm, or more than 400 μm and less than 500 μm. The thickness T3 is preferably more than 60 μm and less than 210 μm. The thickness T3 is preferably more than the thickness T1 of the substrate 12.

The organic insulating layer 14 consists of an insulating layer including any one or two of a photosensitive resin layer and a thermosetting resin layer. The organic insulating layer 14 has a multilayer structure formed by a plurality of deposited insulating layers. The number of layers of the insulating layers may be any desired value in a range sufficient for forming the first and second inductors L1 and L2, and is not limited to a specific value. In this mode, the organic insulating layer 14 includes a first organic insulating layer 14A, a second organic insulating layer 14B and a third organic insulating layer 14C sequentially deposited from the inorganic insulating layer 13.

The first organic insulating layer 14A is made of a photosensitive resin layer or a thermosetting resin layer. In this mode, the first organic insulating layer 14A consists of an epoxy resin layer, as an example of the photosensitive resin layer. The second organic insulating layer 14B consists of a photosensitive resin layer or a thermosetting resin layer. In this mode, the second organic insulating layer 14B consists of an epoxy resin layer, as an example of the photosensitive resin layer. The third organic insulating layer 14C consists of a photosensitive resin layer or a thermosetting resin layer. In this mode, the third organic insulating layer 14C consists of an epoxy resin layer, as an example of the photosensitive resin layer. That is to say, in this mode, the organic insulating layer 14 is made of epoxy resin layers.

The thicknesses of the first to third organic insulating layers 14A to 14C may be more than 10 μm and less than 200 μm. The thicknesses of the first to third organic insulating layers 14A to 14C are preferably more than 20 μm and less than 70 μm, respectively. The thicknesses of the first to third organic insulating layers 14A to 14C may be equal or different from one another.

The second organic insulating layer 14B is a layer for placing the first and second inductors L1 and L2 (the coil conductor 40) therein. Therefore, preferably, at least the second organic insulating layer 14B among the first to third organic insulating layers 14A to 14B has a thickness more than the thickness T2 of the inorganic insulating layer 13. In this mode, the thicknesses of all the first to third organic insulating layers 14A to 14C are more than the thickness T2 of the inorganic insulating layer 13.

The parasitic capacitance in the organic insulating layer 14 is reduced by the first to third organic insulating layers 14A to 14C having large thicknesses. For example, the parasitic capacitance among the first to fifth capacitors C1 to C5 and the first and second inductors L1 and L2 is reduced by the first organic insulating layer 14A. Further, the parasitic capacitance among the external terminals 2 to 5 and the first and second inductors L1 and L2 is reduced by the third organic insulating layer 14C. Further, the parasitic capacitance among the external terminals 2 to 5 and the first to fifth capacitors C1 to C5 is reduced by the deposited layers of the first to third organic insulating layers 14A to 14C.

Figure 5:
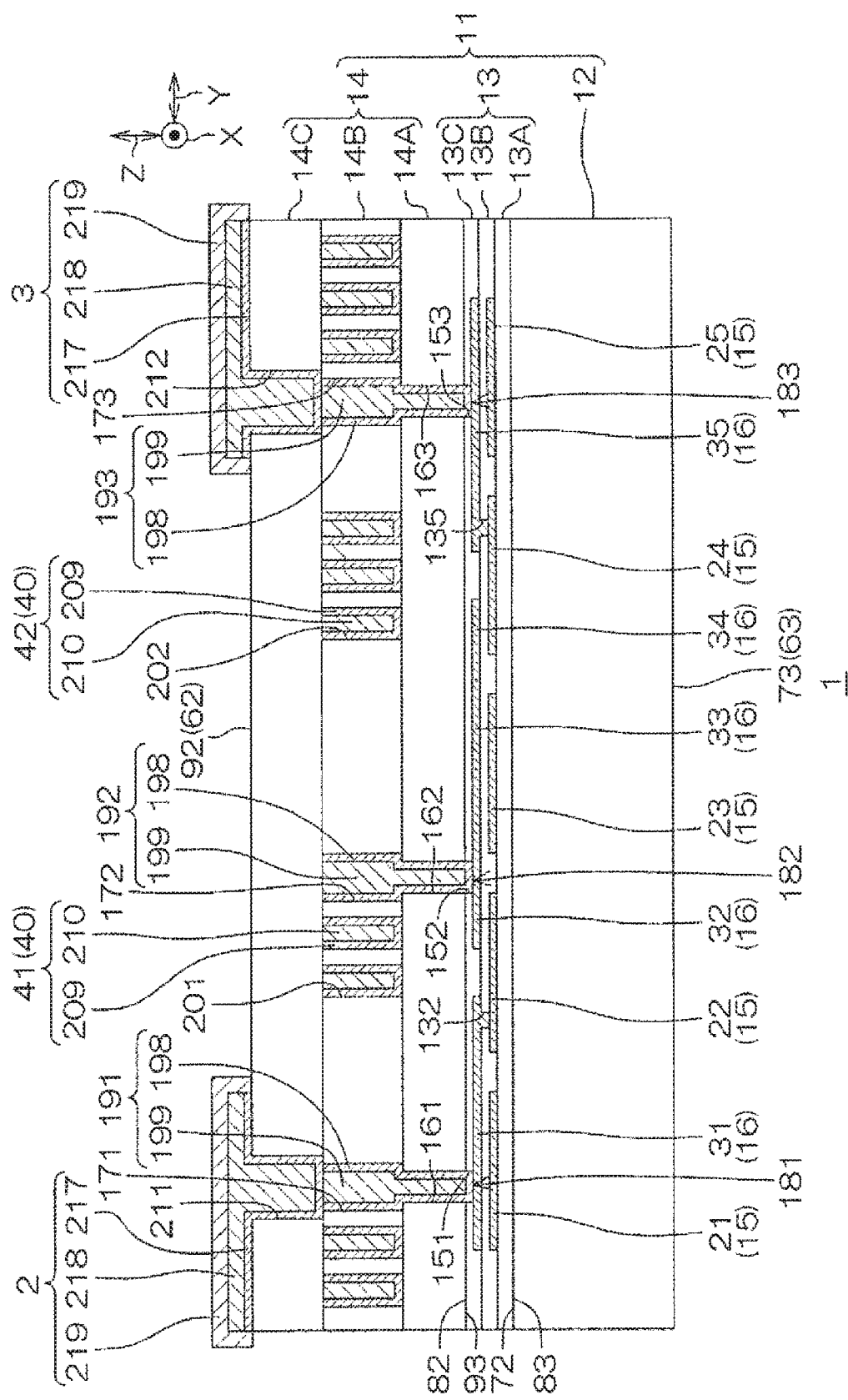
FIG. 5 is a section view of the chip component in FIG. 3.
Figure 6:
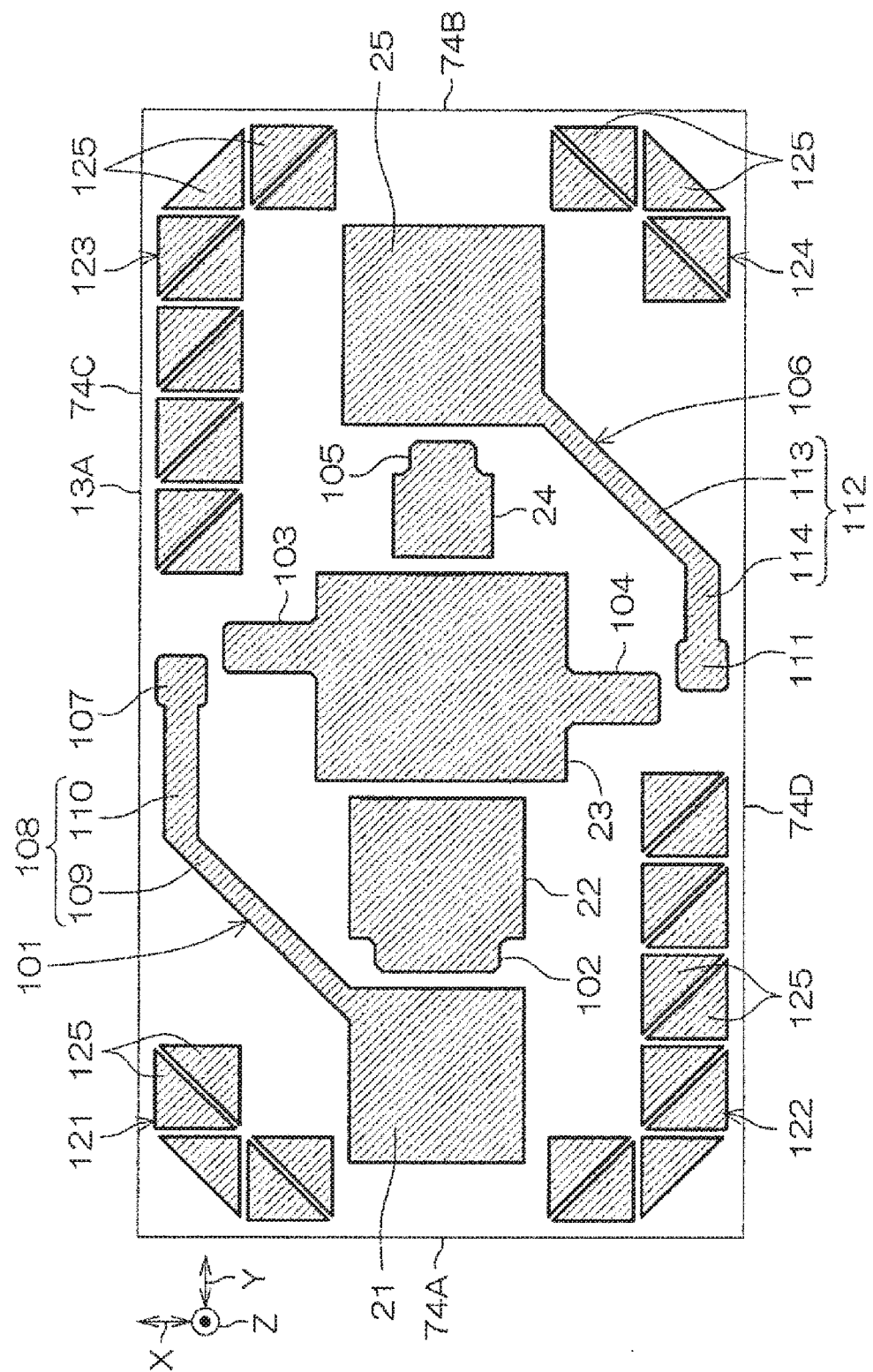
FIG. 6 is a top view of a structure on a first inorganic insulating layer in FIG. 5.
Figure 7:
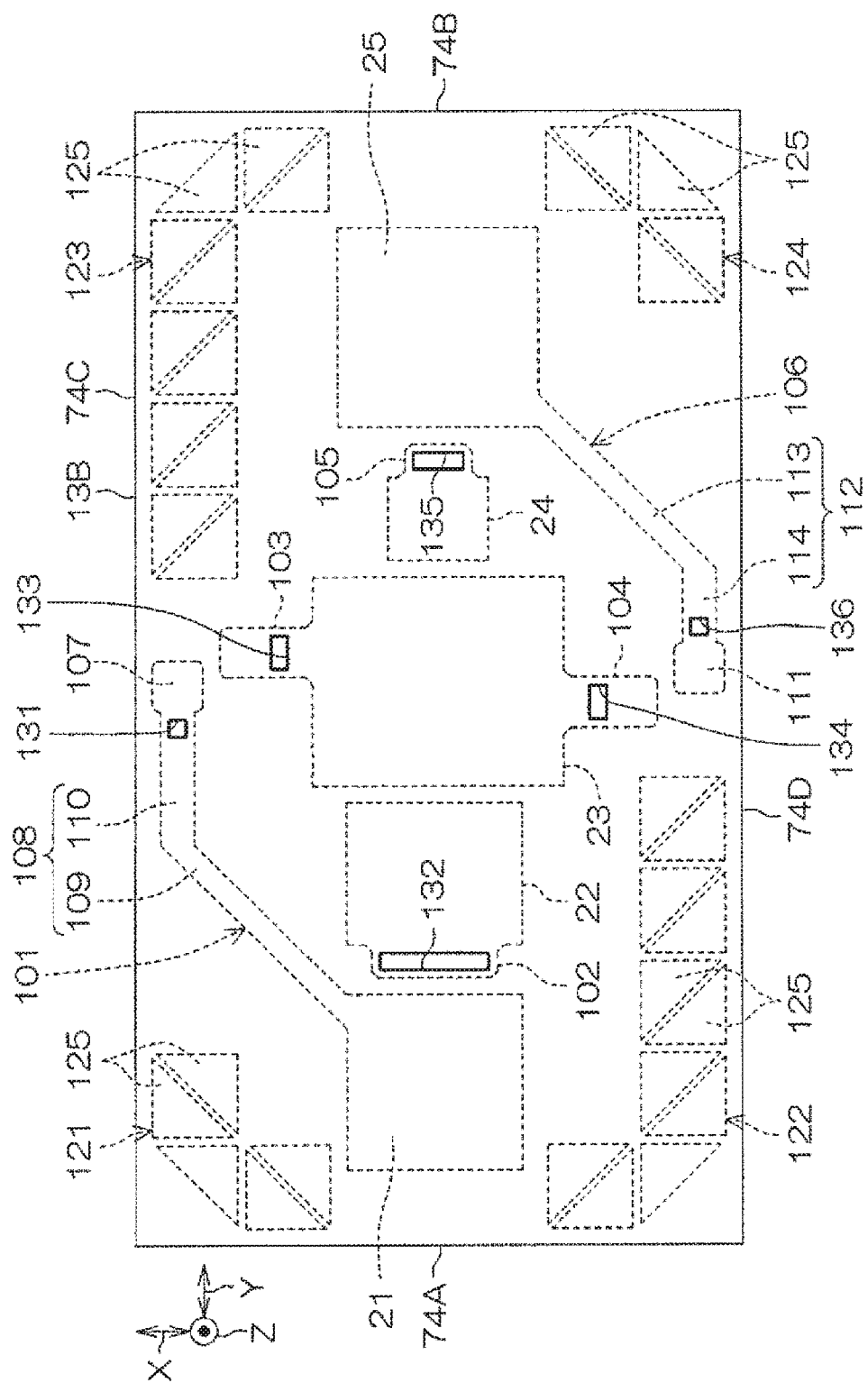
FIG. 7 is a top view of a second inorganic insulating layer in FIG. 5.
Figure 8:
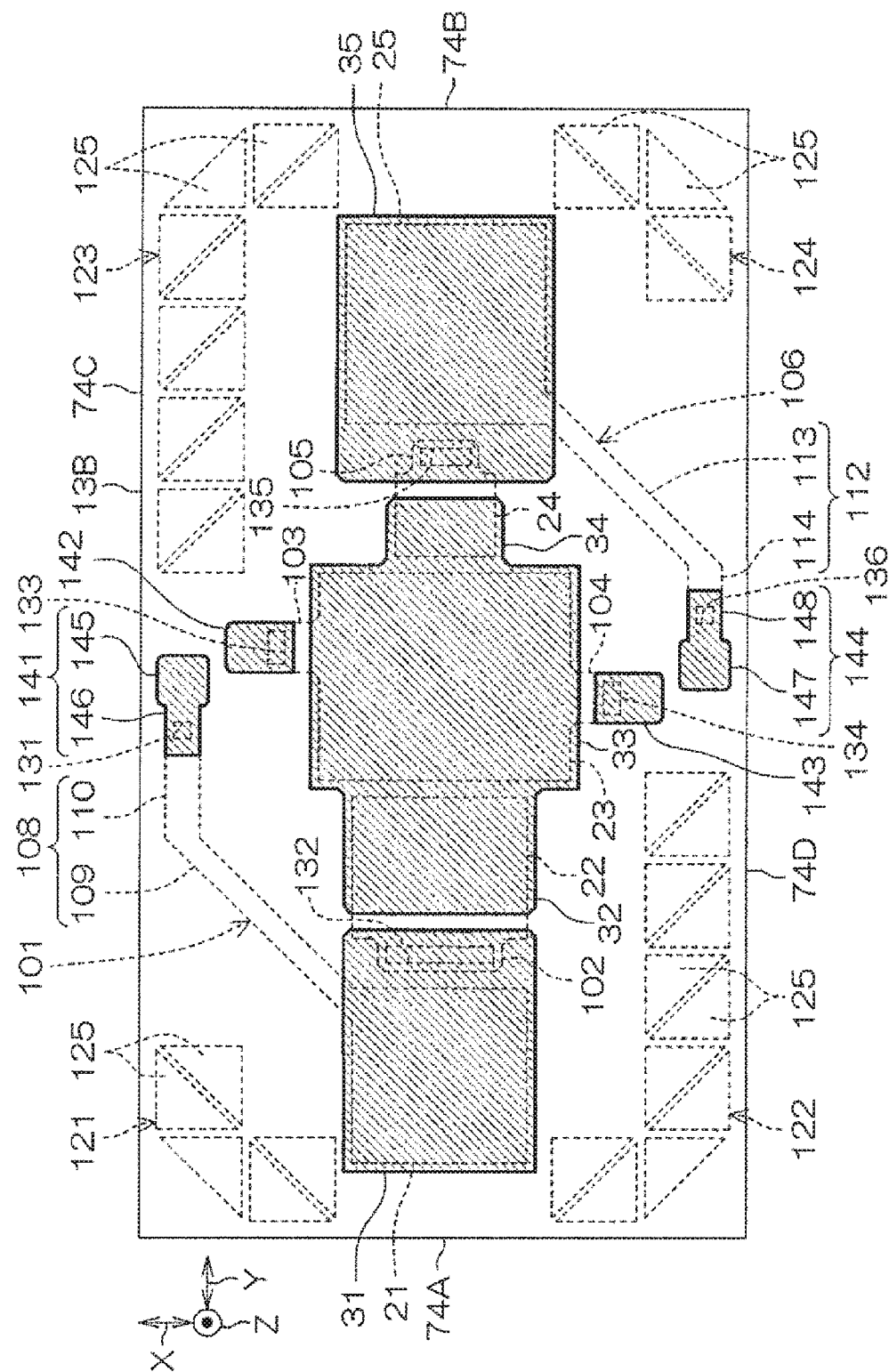
FIG. 8 is a top view of a structure on the second inorganic insulating layer in FIG. 5.
Figure 9:
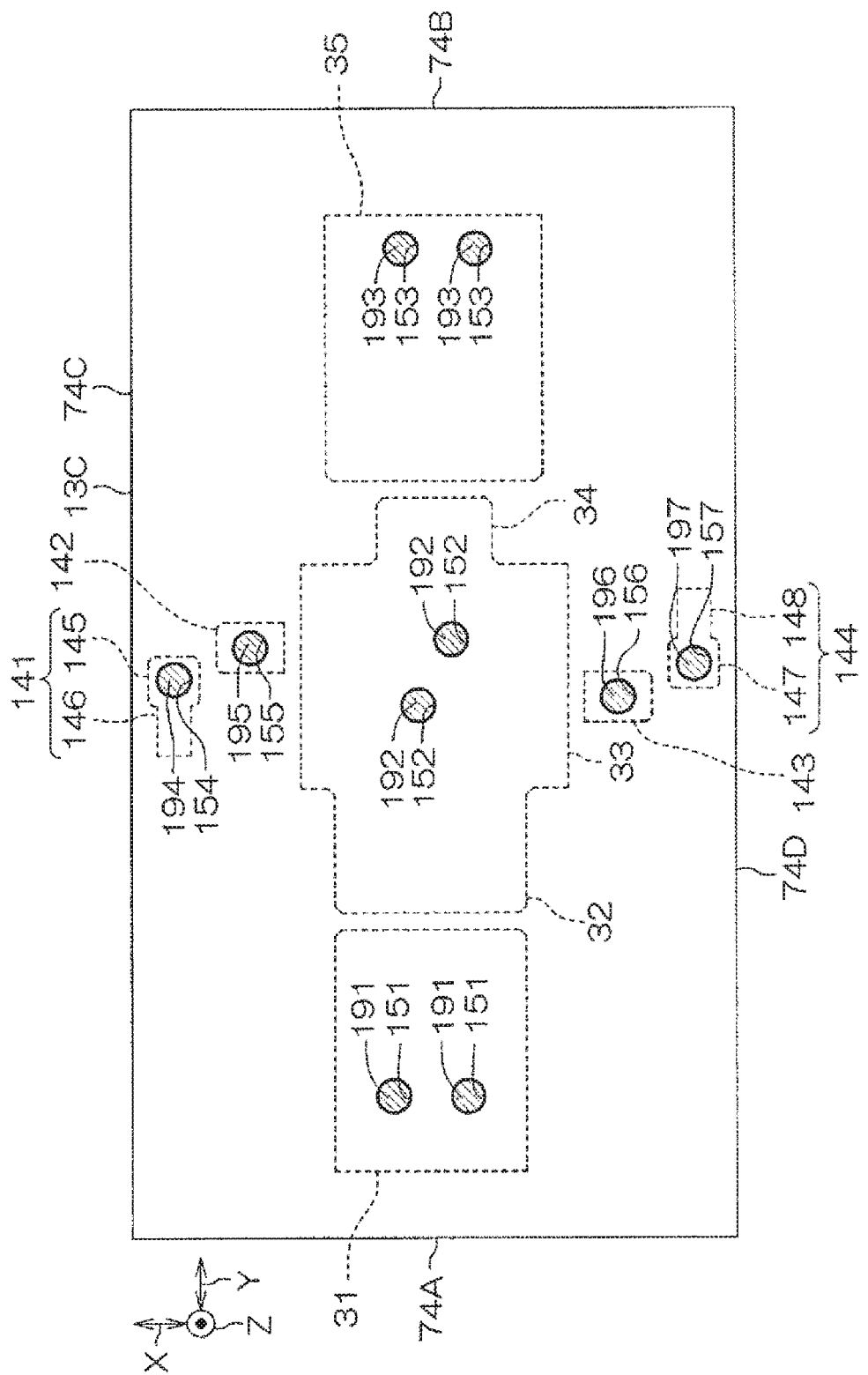
FIG. 9 is a top view of a third inorganic insulating layer in FIG. 5.
Figure 10:
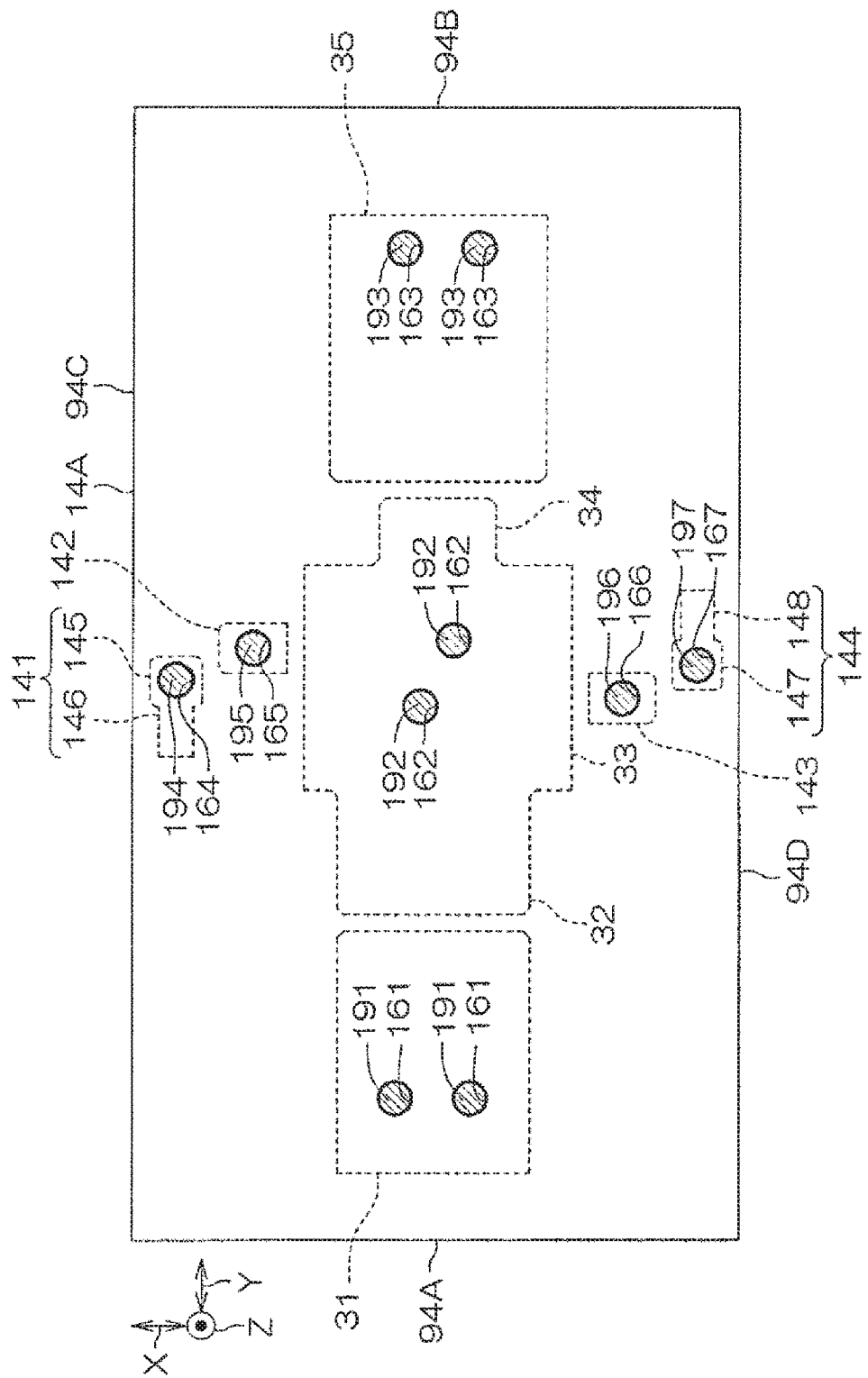
FIG. 10 is a top view of a first organic insulating layer in FIG. 5.
Figure 11:
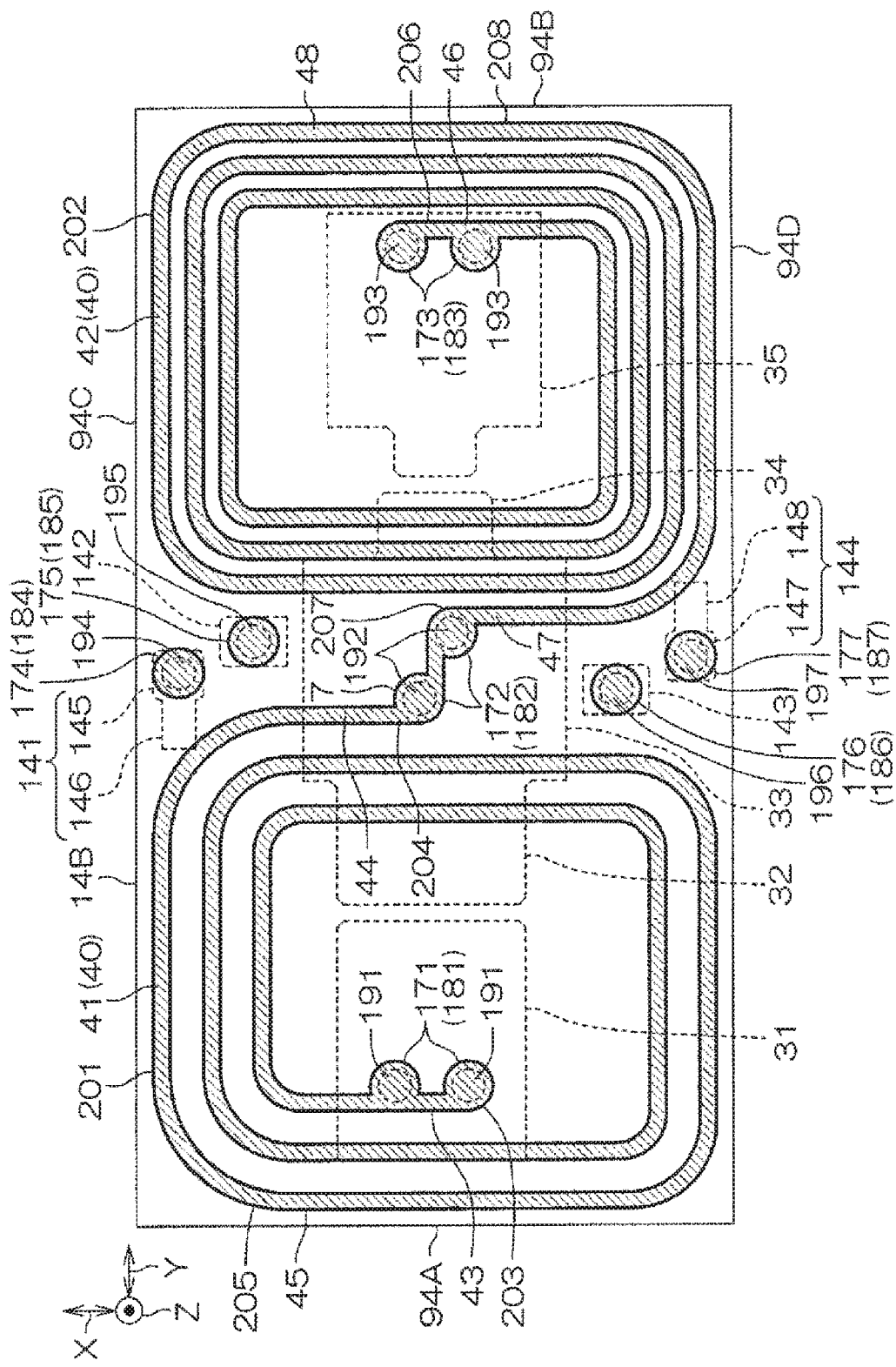
FIG. 11 is a top view of a second organic insulating layer in FIG. 5.
Figure 12:
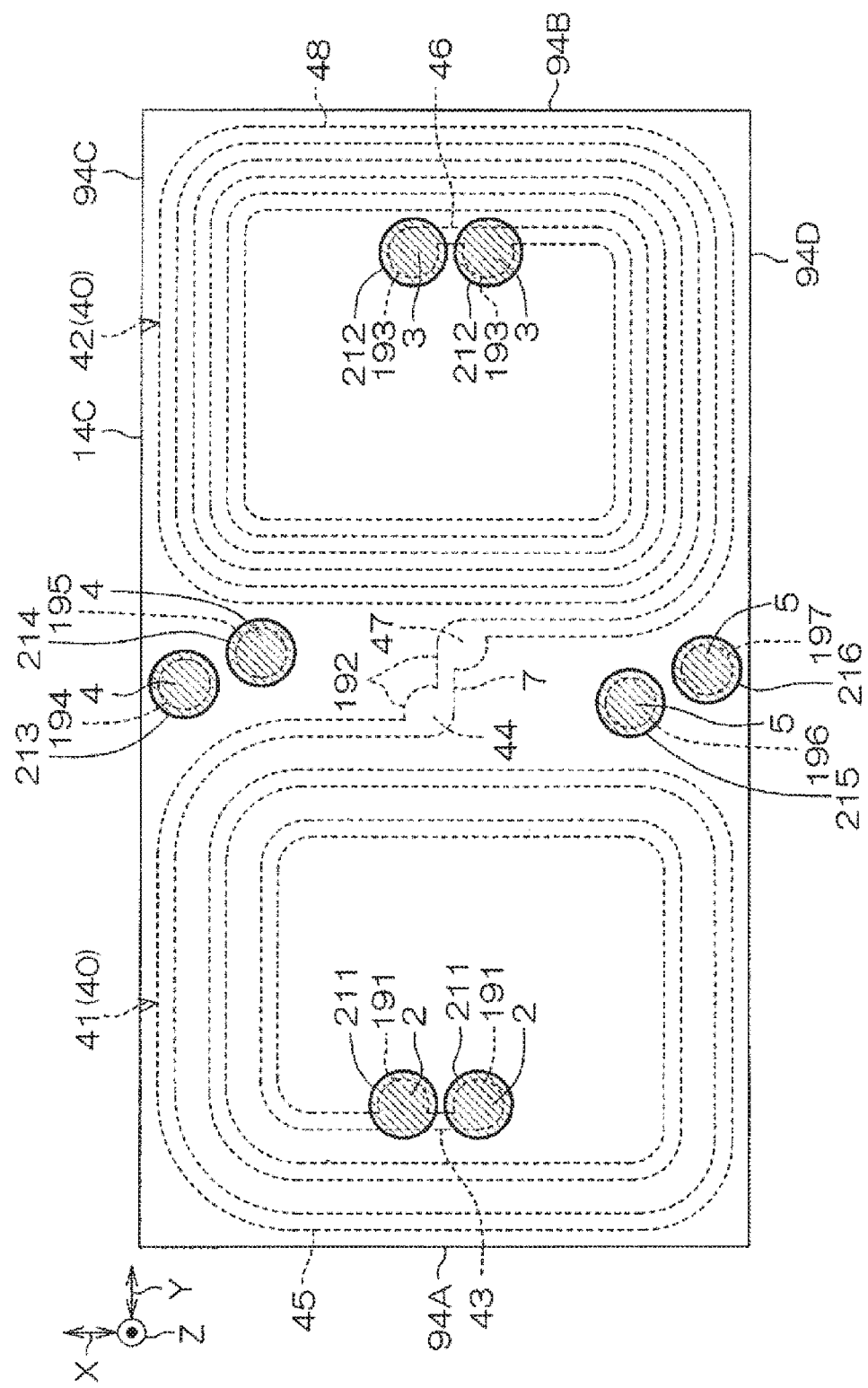
FIG. 12 is a top view of a third organic insulating layer in FIG. 5.

FIG. 5 shows a section view of the chip component 1 in FIG. 3. FIG. 6 shows a top view of a structure on the first inorganic insulating layer 13A in FIG. 5. FIG. 7 shows a top view of the second inorganic insulating layer 13B in FIG. 5. FIG. 8 shows a top view of a structure on the second inorganic insulating layer 13B in FIG. 5. FIG. 9 shows a top view of the third inorganic insulating layer 13C in FIG. 5. FIG. 10 shows a top view of the first organic insulating layer 14A in FIG. 5. FIG. 11 shows a top view of the second organic insulating layer 14B in FIG. 5. FIG. 12 shows a top view of the third organic insulating layer 14C in FIG. 5. FIG. 13 shows a top view of a structure on the third organic insulating layer 14C in FIG. 5.

Referring to FIG. 5 and FIG. 6, the first to fifth lower electrodes 21 to 25 are formed on the first inorganic insulating layer 13A. The first to fifth lower electrodes 21 to 25 are sequentially disposed at intervals from the side of the first substrate sidewall 74A toward the side of the second substrate sidewall 74B. In this mode, the first to fifth lower electrodes 21 to 25 are arranged side by side in one column in the second direction Y.

In this mode, the first to fifth electrodes 21 to 25 are formed as quadrilateral in shape in a top view, respectively. The planar dimensions and planar shapes of the first to fifth lower electrodes 21 to 25 may be any dimensions and shapes, and are not limited to specific designs. The planar dimensions and planar shapes of the first to fifth lower electrodes 21 to 25 may be implemented by any designs according to capacitance values expected to achieve.

The first to fifth lower electrodes 21 to 25 may have thicknesses of more than 0.1 μm and less than 1.5 μm. The thicknesses of the first to fifth lower electrodes 21 to 25 may also be more than 0.1 μm and less than 0.3 μm, more than 0.3 μm and less than 0.6 μm, more than 0.6 μm and less than 0.9 μm, more than 0.9 μm and less than 1.2 μm, or more than 1.2 μm and less than 1.5 μm. The thicknesses of the first to fifth lower electrodes 21 to 25 are preferably less than 1 μm. The thicknesses of the first to fifth lower electrodes 21 to 25 are preferably more than 0.2 μm and less than 0.8 μm.

In this mode, each of the first to fifth lower electrodes 21 to 25 has a multilayer structure including an Al layer and a TiN layer sequentially deposited from the side of the first inorganic insulating layer 13A. The Al layer may include at least one of a pure Al layer (that is, an Al layer having a purity of more than 99%), an AlSi alloy layer, an AlCu alloy layer and AlSiCu alloy layer. The TiN layer covers the full range of the Al layer.

The Al layer may have a thickness of more than 0.1 μm and less than 1.5 μm. The thicknesses of the Al layer may also be more than 0.1 μm and less than 0.3 μm, more than 0.3 μm and less than 0.6 μm, more than 0.6 μm and less than 0.9 μm, more than 0.9 μm and less than 1.2 μm, or more than 1.2 μm and less than 1.5 μm. The thicknesses of the Al layer is preferably less than 1 μm. The thicknesses of the Al layer is preferably more than 0.2 μm and less than 0.8 μm.

The TiN layer has a thickness less than that of the Al layer. The TiN layer may have a thickness of more than 0.01 μm and less than 0.1 μm. The thickness of the TiN layer may also be more than 0.01 μm and less than 0.02 μm, more than 0.02 μm and less than 0.04 μm, more than 0.04 μm and less than 0.06 μm, more than 0.06 μm and less than 0.08 μm, or more than 0.08 μm and less than 0.1 μm. The thickness of the TiN layer is preferably more than 0.01 μm and less than 0.05 μm.

The chip component 1 includes a plurality of (six in this mode) lower connecting electrodes 101, 102, 103, 104, 105 and 106 formed on the first inorganic insulating layer 13A. The plurality of lower connecting electrodes 101, 102, 103, 104, 105 and 106 are respectively formed as layers (films). The plurality of lower connecting electrodes 101, 102, 103, 104, 105 and 106 include a first lower connecting electrode 101, a second lower connecting electrode 102, a third lower connecting electrode 103, a fourth lower connecting electrode 104, a fifth lower connecting electrode 105, and a sixth lower connecting electrode 106.

The first lower connecting electrode 101 is integrally formed with the first lower electrode 21. The first lower connecting electrode 101 is formed as a lead-out portion led out from the first lower electrode 21 toward the third substrate sidewall 74C. The first lower connecting electrode 101 includes a lower dummy pad portion 107 and a first lower wiring portion 108. The first lower dummy pad portion 107 is disposed in a region on the side of the third substrate sidewall 74C with respect to the first to fifth lower electrodes 21 to 25 on the first inorganic insulating layer 13A.

In this mode, the first lower dummy pad portion 107 is disposed in a region between the third lower electrode 23 and the third substrate sidewall 74C on the first inorganic insulating layer 13A. In this mode, the first lower dummy pad portion 107 is formed as quadrilateral in shape in a top view. The planar dimensions and planar shape of the first lower dummy pad 107 may be any dimensions and shape, and are not limited to specific designs.

The first lower wiring portion 108 is led out linearly from the first lower electrode 21, and is connected to the first lower dummy pad portion 107. In this mode, the first lower wiring portion 108 is formed as an L shape including a first portion 109 and a second portion 110 in a top view.

The first portion 109 is led out from the first lower electrode 21 toward the third substrate sidewall 74C in a top view. The first portion 109 inclines toward a center portion of the third substrate sidewall 74C in a top view. The second portion 110 extends linearly in the second direction Y between the first portion 109 and the first lower dummy pad portion 107 in a top view.

A lead-out form of the first lower wiring 108 may be any form, and is not limited to a specific design. The first lower portion 108 has a linewidth of preferably less than the width of the first lower dummy pad portion 107. The linewidth of the first lower wiring portion 108 is the width in a direction orthogonal to an extension direction of the first lower wiring portion 108.

The second lower connecting electrode 102 is formed integrally with the second lower electrode 22. The second lower connecting electrode 102 forms a lead-out portion led out from the second lower electrode 22 toward the first lower electrode 21. In this mode, the second lower connecting electrode 102 is led out in a rectangular form in a top view. The lead-out dimensions and planar shape of the second lower connecting electrode 102 may be any dimensions and shape, and are not limited to specific designs.

The third lower connecting electrode 103 is formed integrally with the third lower electrode 23. The third lower connecting electrode 103 forms a lead-out portion led out from the third lower electrode 23 toward the third substrate sidewall 74C. The third lower connecting electrode 103 faces the first lower dummy pad portion 107 of the first lower connecting electrode 101 in the first direction X in a top view. In this mode, the third lower connecting electrode 103 is led out in a quadrilateral form in a top view. The lead-out dimensions and planar shape of the third lower connecting electrode 103 may be any dimensions and shape, and are not limited to specific designs.

The fourth lower connecting electrode 104 is formed integrally with the third lower electrode 23. The fourth lower connecting electrode 104 forms a lead-out portion led out from the third lower electrode 23 toward the fourth substrate sidewall 74D. In this mode, the fourth lower connecting electrode 104 is led out in a quadrilateral form in a top view. The lead-out dimensions and planar shape of the fourth lower connecting electrode 104 may be any dimensions and shape, and are not limited to specific designs.

The fifth lower connecting electrode 105 is formed integrally with the fourth lower electrode 24. The fifth lower connecting electrode 105 forms a lead-out portion led out from the fourth lower electrode 24 toward the fifth lower electrode 25. In this mode, the fifth lower connecting electrode 105 is led out in a quadrilateral form in a top view. The lead-out dimensions and planar shape of the fifth lower connecting electrode 105 may be any dimensions and shape, and are not limited to specific designs.

The sixth lower connecting electrode 106 is formed integrally with the fifth lower electrode 25. The sixth lower connecting electrode 106 forms a lead-out portion led out from the fifth lower electrode 25 toward the fourth substrate sidewall 74D. The sixth lower connecting electrode 106 includes a second lower dummy pad portion 111 and a second lower wiring portion 112. The second lower dummy pad portion 111 is disposed in a region on the side of the fourth substrate sidewall 74D with respect to the first to fifth lower electrodes 21 to 25 on the first inorganic insulating layer 13A.

In this mode, the second lower dummy pad portion 111 is disposed in a region between the third lower electrode 23 and the fourth substrate sidewall 74D on the first inorganic insulating layer 13A. The second lower dummy pad portion 111 faces the fourth lower connecting electrode 104 in the first direction X in a top view. In this mode, the second lower dummy pad portion 111 is formed as quadrilateral in shape in a top view. The planar dimensions and planar shape of the second lower dummy pad 111 may be any dimensions and shape, and are not limited to specific designs.

The second lower wiring portion 112 is led out linearly from the fifth lower electrode 25, and is connected to the second lower dummy pad portion 111. In this mode, the second lower wiring portion 112 is formed as an L shape including a first portion 113 and a second portion 114 in a top view.

The first portion 113 is led out from the fifth lower electrode 25 toward the fourth substrate sidewall 74D in a top view. The first portion 113 inclines toward a center portion of the fourth substrate sidewall 74D in a top view. The second portion 114 extends linearly in the second direction Y between the first portion 113 and the first lower dummy pad portion 111 in a top view.

A lead-out form of the second lower wiring 112 may be any form, and is not limited a specific design. The second lower wiring portion 112 has a linewidth of preferably less than the width of the second lower dummy pad portion 111. The linewidth of the second lower wiring portion 112 is the width in a direction orthogonal to an extension direction of the second lower wiring portion 112.

As described above, the first lower electrode 21, the third lower electrode 23 and the fifth lower electrode 25 are fixed at the same potential. Therefore, the third lower connecting electrode 103 may be formed integrally with the first lower connecting electrode 101 (the first lower dummy pad portion 107). Further, the sixth lower connecting electrode 106 (the second lower dummy pad portion 111) may also be formed integrally with the fourth lower connecting electrode 104.

However, in these cases, distances of wirings connecting the first lower electrode 21, the third lower electrode 23 and the fifth lower electrode 25 are increased. Hence, being affected by a magnetic field produced by current flowing in other regions (for example, the first and second inductors L1 and L2), it is possible that an eddy current starting from the first lower electrode 21, the third lower electrode 23 and the fifth lower electrode 25 is generated.

Therefore, the third lower connecting electrode 103 is preferably formed at an interval from the first lower connecting electrode 101. Further, the sixth lower connecting terminal 106 is preferably formed at an interval from the fourth lower connecting electrode 104. Thus, an eddy current starting from the first lower electrode 21, the third lower electrode 23 and the fifth lower electrode 25 may be suppressed. By suppressing the eddy current, noise is reduced to thereby enhance LC characteristics.

The first to sixth lower connecting electrodes 101 to 106 may have thicknesses of more than 0.1 µm and less than 1.5 µm. The first to sixth lower connecting electrodes 101 to 106 may also have thicknesses of more than 0.1 µm and less than 0.3 µm, more than 0.3 µm and less than 0.6 µm, more than 0.6 µm and less than 0.9 µm, more than 0.9 µm and less than 1.2 µm, and more than 1.2 µm and less than 1.5 µm. The thicknesses of the first to sixth lower connecting electrodes 101 to 106 are preferably less than 1 µm. The thicknesses of the first to sixth lower connecting electrodes 101 to 106 are preferably more than 0.2 µm and less than 0.8 µm.

The thicknesses of the first to sixth lower connecting electrodes 101 to 106 are preferably equal to the thicknesses of the first to fifth lower electrodes 21 to 25. The first to sixth lower connecting electrodes 101 to 106 have structures identical to those of the first to fifth lower electrodes 21 to 25. That is to say, each of the first to sixth lower connecting electrodes 101 to 106 has a multilayer structure including an Al layer and a TiN layer.

The chip component 1 includes one or a plurality of (fourth in this mode) dummy electrodes 121, 122, 123 and 124 formed at intervals from the first to fifth lower electrodes 21 to 25 and on the same layer as the first to fifth lower electrodes 21 to 25.

The plurality of dummy electrodes 121 to 124 and the first to fifth lower electrodes 21 and 25 are arranged at intervals on the first inorganic insulating layer 13A to form an electrically floating state. More specifically, the plurality of dummy electrodes 121 to 124 include a first dummy electrode 121, a second dummy electrode 122, a third dummy electrode 123 and a fourth dummy electrode 124.

The first to fourth dummy electrodes 121 to 124 are disposed in any number and any planar shapes on the first inorganic insulating layer 13A, in a manner that a ratio occupied by the electrodes present on the first inorganic insulating layer 13A is more than 30% and less than 70%.

The ratio occupied by the electrodes is a ratio of the total planar area of the first to fifth lower electrodes 21 to 25, the first to sixth lower connecting electrodes 101 to 106 and the first to fourth dummy electrodes 121 to 124, to the planar area of the first inorganic insulating layer 13A. The ratio occupied by the electrodes is preferably more than 40% and less than 60%. The ratio occupied by the electrodes is preferably more than 50%.

The first to fourth dummy electrodes 121 to 124 are disposed in any region other than a region disposed with the first to fifth lower electrodes 21 to 25 and a region disposed with the first to sixth lower connecting electrodes 101 to 106. In this mode, the first to fourth dummy electrodes 121 to 124 are respectively disposed on four corners of the first inorganic insulating layer 13A in a top view, in a manner of dividing a region disposed with the first to fifth lower electrodes 21 to 25 from an outer side.

The first dummy electrode 121 is disposed on the corner connecting the first substrate sidewall 74A and the third substrate sidewall 74C in a top view. The first dummy electrode 121 forms an L shape dividing an L path between the first substrate sidewall 74A and the third substrate sidewall 74C in a top view. The first dummy electrode 121 has an inclining outer angle.

The second dummy electrode 122 is disposed on the corner connecting the first substrate sidewall 74A and the fourth substrate sidewall 74D in a top view. The second dummy electrode 122 forms an L shape dividing an L path between the first substrate sidewall 74A and the fourth substrate sidewall 74D in a top view. The second dummy electrode 122 has an inclining outer angle.

The third dummy electrode 123 is disposed on the corner connecting the second substrate sidewall 74B and the third substrate sidewall 74C in a top view. The third dummy electrode 123 forms an L shape dividing an L path between the second substrate sidewall 74B and the third substrate sidewall 74C in a top view. The third dummy electrode 123 has an inclining outer angle.

The fourth dummy electrode 124 is disposed on the corner connecting the second substrate sidewall 74B and the fourth substrate sidewall 74D in a top view. The fourth dummy electrode 124 forms an L shape dividing an L path between the second substrate sidewall 74B and the fourth substrate sidewall 74D in a top view. The fourth dummy electrode 124 has an inclining outer angle.

The first to fourth dummy electrodes 121 to 124 are divided into a plurality of dummy electrode portions 125 by slits, respectively. The slits allow the wiring distances of the first to fourth dummy electrodes 121 to 124 to be decreased. The plurality of dummy electrode portions 125 are respectively divided into triangles in a top view, respectively. Accordingly, the first to fourth dummy electrodes 121 to 124 form dummy electrode portion groups formed by gathering and disposing the plurality of dummy electrode portions 125, respectively.

The planar shapes of the plurality of dummy electrode portions 125 may be any shapes, and are limited to specific designs. The plurality of dummy electrode portions 125 may be, for example, divided into stripes extending in the first direction X or the second direction Y by the slits in a top view. In this case, the plurality of dummy electrode portions 125 are preferably divided as stripes extending in the first direction X.

The slits may have widths of more than 0.1 μm and less than 5 μm. The widths of the slits may also be more than 0.1 μm and less than 0.5 μm, more than 0.5 μm and less than 1 μm, more than 1 μm and less than 1.5 μm, more than 1.5 μm and less than 2 μm, more than 2 μm and less than 2.5 μm, more than 2.5 μm and less than 3 μm, more than 3 μm and less than 4, or more than 4 μm and less than 5 μm. The widths of the slits are preferably more than 1 μm and less than 3 μm.

The first to fourth dummy electrodes 121 to 124 may also be formed as without the slits. However, in this case, the wiring distances of the first to fourth dummy electrodes 121 to 124 are increased. Therefore, being affected by a magnetic field produced by current flowing in other regions (for example, the first and second inductors L1 and L2), it is possible that an eddy current starting from the first to fourth dummy electrodes 121 to 124 is generated.

Therefore, the first to fourth dummy electrodes 121 to 124 are preferably formed as having the slits. Thus, the wiring distances of the first to fourth dummy electrodes 121 to 124 may be decreased, hence suppressing the eddy current starting from the first to fourth dummy electrodes 121 to 124. By suppressing the eddy current, noise is reduced to thereby enhance LC characteristics.

The first to fourth dummy electrodes 121 to 124 may have thicknesses of more than 1 μm and less than 1.5 μm. The thicknesses of the first to fourth dummy electrodes 121 to 124 may also be more than 0.1 μm and less than 0.3 μm, more than 0.3 μm and less than 0.6 μm, more than 0.6 μm and less than 0.9 μm, more than 0.9 μm and less than 1.2 μm, or more than 1.2 μm and less than 1.5 μm. The thicknesses of the first to fourth dummy electrodes 121 to 124 are preferably less than 1 μm. The thicknesses of the first to fourth dummy electrodes 121 to 124 are preferably more than 0.2 μm and less than 0.8 μm.

The thicknesses of the first to fourth dummy electrodes 121 to 124 are preferably equal to the thicknesses of the first to fifth lower electrodes 21 to 25. The first to fourth dummy electrodes 121 to 124 also have structures identical to those of the first to fifth lower electrodes 21 to 25. That is to say, each of the first to fourth dummy electrodes 121 to 124 is a multilayer structure including an Al layer and a TiN layer.

Referring to FIG. 5 and FIG. 7, the second inorganic insulating layer 13B is formed on the first inorganic insulating layer 13A. The second inorganic insulating layer 13B altogether covers the first to fifth lower electrodes 21 to 25, the first to sixth lower connecting electrodes 101 to 106, and the first to fourth dummy electrodes 121 to 124.

The second inorganic insulating layer 13B includes a first lower opening 131, a second lower opening 132, a third lower opening 133, a fourth lower opening 134, a fifth lower opening 135 and a sixth lower opening 136. The number of the first to sixth lower openings 131 to 136 may be any desired value. In this mode, the first to sixth lower openings 131 to 136 are sequentially formed.

The first lower opening 131 exposes the first lower connecting electrode 101. More specifically, the first lower opening 131 is spaced from the first lower dummy pad portion 107 such that the first lower wiring portion 108 is exposed. Further, more specifically, the first lower opening 131 exposed the second portion 110 of the first lower wiring portion 108.

The second lower opening 132 exposes any region of the second lower connecting electrode 102. The third lower opening 133 exposes the third lower connecting electrode 103. More specifically, the third lower opening 133 is spaced from a front end portion of the third lower connecting electrode 103 on the side of the third lower connecting electrode 103 in a top view, such that the third lower connecting electrode 103 is exposed.

The fourth lower opening 134 exposes the fourth lower connecting electrode 104. More specifically, the fourth lower opening 134 is spaced from a front end portion of the fourth lower connecting electrode 104 on the side of the third lower connecting electrode 103 in a top view, such that the fourth lower connecting electrode 104 is exposed.

The fifth lower opening 135 exposes any region of the fifth lower connecting electrode 105. The sixth lower opening 136 exposes the sixth lower connecting electrode 106. More specifically, the sixth lower opening 136 is spaced from the second lower dummy pad portion 11, such that the second lower wiring portion 112 is exposed. Further, more specifically, the sixth lower opening 136 exposes the second portion 114 of the second lower wiring portion 112.

Referring to FIG. 5 and FIG. 8, the first to fifth upper electrodes 31 to 35 are formed on the second inorganic insulating layer 13B. The first to fifth upper electrodes 31 to 35 are sequentially disposed from the side of the first substrate sidewall 74A toward the side of the second substrate sidewall 74B. In this mode, the first to fifth upper electrodes 31 to 35 are arranged side by side into one column in the second direction Y.

In this mode, the first to fifth upper electrodes 31 to 35 are formed as rectangular in shape in a top view, respectively. The planar dimensions and planar shapes of the first to fifth upper electrodes 31 to 35 may be any dimensions and shapes, and are not limited to specific designs. The planar dimensions and planar shapes of the first to fifth upper electrodes 31 to 35 may be implemented by any designs according to capacitance values expected to achieve.

The first upper electrode 31 faces the first lower electrode 21 with the first inorganic insulating layer 13A spaced in between. The first capacitor C1 is formed between the first upper electrode 31 and the first lower electrode 21. The first upper electrode 31 enters the second lower opening 132 from the second inorganic insulating layer 13B. The first upper electrode 31 is electrically connected to the second lower electrode 22 in the second lower opening 132. Thus, the first upper electrode 31 and the second lower electrode 22 are fixed at the same potential.

The second upper electrode 32 faces the second lower electrode 22 with the first inorganic insulating layer 13A spaced in between. The second capacitor C2 is formed between the second upper electrode 32 and the second lower electrode 22.

The third upper electrode 33 faces the third lower electrode 23 with the first inorganic insulating layer 13A spaced in between. The third capacitor C3 is formed between the third upper electrode 33 and the third lower electrode 23. The third upper electrode 33 is formed integrally with the second upper electrode 32. Thus, the third upper electrode 33 and the second upper electrode 32 are fixed at the same potential.

The fourth upper electrode 34 faces the fourth lower electrode 24 with the first inorganic insulating layer 13A spaced in between. The capacitor C4 is formed between the fourth upper electrode 34 and the fourth lower electrode 24. The fourth upper electrode 34 is formed integrally with the third upper electrode 33. Thus, the fourth upper electrode 34, the second upper electrode 32 and the third upper electrode 33 are fixed at the same potential.

The fifth upper electrode 35 faces the fifth lower electrode 25 with the first inorganic insulating layer 13A spaced in between. The capacitor C5 is formed between the fifth upper electrode 35 and the fifth lower electrode 25. The fifth upper electrode 35 enters the fifth lower opening 135 from the second inorganic insulating layer 13B. The fifth upper electrode 35 is electrically connected to the fourth lower electrode 24 in the fifth lower opening 135. Thus, the fifth upper electrode 35 and the fourth lower electrode 24 are fixed at the same potential.

The first to fifth upper electrodes 31 to 35 may have thicknesses of more than 0.1 µm and less than 2 µm. The thicknesses of the first to fifth upper electrodes 31 to 35 may be more than 0.1 µm and less than 0.5 µm, more than 0.5 µm and less than 1 µm, more than 1 µm and less than 1.5 µm, or more than 1.5 µm and less than 2 µm. The thicknesses of the first to fifth upper electrodes 31 to 35 are preferably more than 0.5 µm and less than 1.5 µm. The thicknesses of the first to fifth upper electrodes 31 to 35 are preferably more than the thicknesses of the first to fifth lower electrodes 21 to 25.

In this mode, each of the first to fifth upper electrodes 31 to 35 has a single-layer structure consisting of an Al layer. The Al layer may include at least one of a pure Al layer (that is, an Al layer having a purity of more than 99%), an AlSi alloy layer, an AlCu alloy layer and AlSiCu alloy layer.

The first to fifth upper electrodes 31 to 35 may also have structures identical to those of the first to fifth lower electrodes 21 to 25. That is to say, each of the first to fifth upper electrodes 31 to 35 may also have a multilayer structure including an Al layer and a TiN layer sequentially deposited from the side of the second inorganic insulating layer 13B. In this case, the first to fifth upper electrodes 31 to 35 having thicknesses equal to those of the first to fifth lower electrodes 21 to 25 may also be formed.

The first to fifth upper electrodes 31 to 35 are disposed in regions divided by the first to fourth dummy electrodes 121 to 124 in a top view. The first to fifth upper electrodes 131 to 135 are formed at intervals from the first to fourth dummy electrodes 121 to 124 in a top view. The first to fifth upper electrodes 31 to 35 are spaced by the first inorganic insulating layer 13A and do not face the first to fourth dummy electrodes 121 to 124.

The chip component 1 includes a plurality of (four in this mode) upper connecting electrodes 141, 142, 143 and 144 formed on the second inorganic insulating layer 13B. The plurality of upper connecting electrodes 141, 142, 143 and 144 are formed as layers (films), respectively. The plurality of upper connecting electrodes 141, 142, 143 and 144 include a first upper connecting electrode 141, a second upper connecting electrode 142, a third upper connecting electrode 143, and a fourth upper connecting electrode 144.

The first upper connecting electrode 141 is disposed at intervals from the first to fifth upper electrodes 31 to 35. The upper connecting electrode 141 faces the first lower connecting electrode 101 with the second inorganic insulating layer 13B spaced in between. The first upper connecting electrode 141 includes a first upper pad portion 145 and a first upper wiring portion 146.

The first upper pad portion 145 faces the first lower dummy pad portion 107 of the first lower connecting electrode 101 with the second inorganic insulating layer 13B spaced in between. In this mode, the first upper pad portion 145 is formed as quadrilateral in shape in a top view. The planar dimensions and planar shape of the first upper pad portion 145 may be any dimensions and shape, and are not limited to specific designs.

The first upper wiring portion 146 is led out as a band from the first upper pad portion 145 along the first lower wiring portion 108 of the first lower connecting electrode 101 in a top view. The lead-out form of the first upper wiring portion 146 may be any form, and is not limited to a specific design. The first upper wiring portion 146 has a linewidth preferably less than the width of the first upper pad portion 145. The linewidth of the first upper wiring portion 145 is the width in a direction orthogonal to an extension direction of the first upper wiring portion 146.

The first upper wiring portion 146 enters the first lower opening 131 from the second inorganic insulating layer 13B. The first upper wiring portion 146 is electrically connected to the first lower wiring portion 108 (the second portion 110) of the first lower connecting electrode 101 in the first lower opening 131. Thus, the first upper connecting electrode 141 is electrically connected to the first lower electrode 21 by the first lower connecting electrode 101.

The second upper connecting electrode 142 is disposed at an interval from the first to fifth upper electrodes 31 to 35. The second upper connecting electrode 142 faces the third lower connecting electrode 103 with the second inorganic insulating layer 13B spaced in between.

The second upper connecting electrode 142 enters the third lower opening 133 from the second inorganic insulating layer 13B. The second upper connecting electrode 142 is electrically connected to the third lower connecting electrode 103 in the third lower opening 133. Thus, the second upper connecting electrode 142 is electrically connected to the third lower electrode 23 by the third lower connecting electrode 103.

The third upper connecting electrode 143 is disposed at intervals from the first to fifth upper electrodes 31 to 35. The third upper connecting electrode 143 faces the fourth lower connecting electrode 104 with the second inorganic insulating layer 13B spaced in between.

The third upper connecting electrode 143 enters the fourth lower opening 134 from the second inorganic insulating layer 13B. The third upper connecting electrode 143 is electrically connected to the fourth lower connecting electrode 104 in the fourth lower opening 134. Thus, the third upper connecting electrode 143 is electrically connected to the third lower electrode 23 by the fourth lower connecting electrode 104.

The fourth lower connecting electrode 144 is disposed at intervals from the first to fifth upper electrodes 31 to 35. The fourth lower connecting electrode 144 faces the sixth lower connecting electrode 106 with the second inorganic insulating layer 13B spaced in between. The fourth lower connecting electrode 144 includes a second upper pad portion 147 and a second upper wiring portion 148.

The second upper pad portion 147 faces the second lower dummy pad portion 111 of the sixth lower connecting electrode 106 with the second inorganic insulating layer 13B spaced in between. In this mode, the second upper pad portion 147 is formed as quadrilateral in shape in a top view. The planar dimensions and planar shape of the second upper pad portion 147 may be any dimensions and shape, and are not limited to specific designs.

The second upper wiring portion 148 is led out as a band from the second upper pad portion 147 along the second lower wiring portion 112 of the sixth lower connecting electrode 106 in a top view. The lead-out form of the second upper wiring portion 148 may be any form, and is not limited to a specific design. The second upper wiring portion 148 has a linewidth preferably less than the width of the second upper pad portion 147. The linewidth of the second upper wiring portion 148 is the width in a direction orthogonal to an extension direction of the second upper wiring portion 148.

The second wiring portion 148 enters the sixth lower opening 136 from the second inorganic insulating layer 13B. The second upper wiring portion 148 is electrically connected to the second lower wiring portion 112 (the second portion 114) of the sixth lower connecting electrode 106 in the sixth lower opening 136. Thus, the fourth upper connecting electrode 144 is electrically connected to the fifth lower electrode 25 by the sixth lower connecting electrode 106.

The first to fourth upper connecting electrodes 141 to 144 may have thickness of more than 0.1 μm and less than 2 μm. The thicknesses of the first to fourth upper connecting electrodes 141 to 144 may be more than 0.1 μm and less than 0.5 μm, more than 0.5 μm and less than 1 μm, more than 1 m and less than 1.5 μm, or more than 1.5 μm and less than 2 μm. The thicknesses of the first to fourth upper connecting electrodes 141 to 144 are preferably more than 0.5 μm and less than 1.5 μm.

The thicknesses of the first to fourth upper connecting electrodes 141 to 144 are preferably more than the thicknesses of the first to fifth lower electrodes 21 to 25. The thicknesses of the first to fourth upper connecting electrodes 141 to 144 are preferably equal to the thicknesses of the first to fifth electrodes 31 to 35.

The first to fourth upper connecting electrodes 141 to 144 may have structures identical to those of the first to fifth upper electrodes 31 to 35. That is to say, each of the first to fourth upper connecting electrodes 141 to 144 has a single-layer structure consisting of an Al layer. However, each of the first to fourth upper connecting electrodes 141 to 144 may also have, according to the structures of the first to fifth upper electrodes 31 to 35, a multilayer structure including an Al layer and a TiN layer sequentially deposited from the side of the inorganic insulating layer 13B.

Referring to FIG. 5 and FIG. 3, the third inorganic insulating layer 13C is formed on the second inorganic insulating layer 13B. The third inorganic insulating layer 13C altogether covers the first to fifth upper electrodes 31 to 35 and the first to fourth upper connecting electrodes 141 to 144.

The third inorganic insulating layer 13C includes a first upper opening 151, a second upper opening 152, a third upper opening 153, a fourth upper opening 154, a fifth upper opening 155, a sixth upper opening 156 and a seventh upper opening 157. The number of the first to seventh upper openings 151 to 157 is any desired value. In this mode, two first upper openings 151, two second upper openings 152, two third upper openings 153, one fourth upper opening 154, one fifth upper opening 155, one sixth upper opening 156 and one seventh upper opening 157 are formed.

The first upper opening 151 exposes any region of the first upper electrode 31. The second upper opening 152 exposes any region of the third upper electrode 33. The third upper opening 153 exposed any region of the fifth upper electrode 35.

The fourth upper opening 154 exposed any region of the first upper connecting electrode 141. More specifically, the fourth upper opening 154 is spaced from the first lower opening 131 in a top view, such that the first upper pad portion 145 of the first upper connecting electrode 141 is exposed.

The fifth upper opening 155 exposes any region of the second upper connecting electrode 142. More specifically, the fifth upper opening 155 is spaced from the third lower opening on the side of a front end portion of the second upper connecting electrode 142 in a top view, such that the second upper connecting electrode 142 is exposed.

The sixth upper opening 155 exposes any region of the third upper connecting region 143. More specifically, the sixth upper opening 156 is spaced from fourth lower opening 134 on the side of a front end portion of the third upper connecting electrode 143 in a top view, such that the third upper connecting electrode 143 is exposed.

The seventh upper opening 157 exposes any region of the fourth upper connecting electrode 144. More specifically, the seventh upper opening 157 is spaced from the sixth lower opening 136 in a top view, such that the second upper pad portion 147 of the fourth upper connecting electrode 144 is exposed.

The first to seventh upper openings 151 to 157 are formed as circular in shape in a top view, respectively. The planar shapes of the first to seventh upper openings 151 to 157 are may be any shapes, and are not limited to specific designs. The first to seventh upper openings 151 to 157 may have widths of more than 5 μm and less than 20 μm.

The widths of the first to seventh upper openings 151 to 157 may be more than 5 μm and less than 10 μm, more than 10 μm and less than 15 μm, or more than 15 μm and less than 20 μm. The widths of the first to seventh upper openings 151 to 157 are preferably more than 8 μm and less than 16 μm.

Referring to FIG. 5 and FIG. 10, the first organic insulating layer 14A is formed on the inorganic insulating layer 13 (the third inorganic insulating layer 13C). The first organic insulating layer 14A includes a first lower via hole 161, a second lower via hole 162, a third lower via hole 163, a fourth lower via hole 164, a fifth lower via hole 165, a sixth lower via hole 166 and a seventh lower via hole 167 formed correspondingly to the first to seventh upper openings 151 to 157.

The number of the first to seventh lower via holes 161 to 167 is adjusted according to the number of the first to seventh upper openings 151 to 157. In this mode, two first lower via holes 161, two second lower via holes 162, two third lower via holes 163, one fourth lower via hole 164, one fifth lower via hole 165, one sixth lower via hole 166 and one seventh lower via hole 167 are formed.

The first lower via hole 161 is in communication with the first upper opening 151, such that the first upper electrode 31 is exposed. The second lower via hole 162 is in communication with the second upper opening 152, such that the third upper electrode 33 is exposed. The third lower via hole 163 is in communication with the third upper opening 153, such that the fifth upper electrode 35 is exposed.

The fourth lower via hole 164 is in communication with the fourth upper opening 154, such that the first upper pad portion 145 of the first upper connecting electrode 141 is exposed. The fifth lower via hole 165 is in communication with the fifth upper opening 155, such that the second upper connecting electrode 142 is exposed. The sixth lower via hole 166 is in communication with the sixth upper opening 156, such that the third upper connecting electrode 143 is exposed. The seventh lower via hole 167 is in communication with the seventh upper opening 157, such that the second upper pad portion 147 of the fourth upper connecting electrode 144 is exposed.

The first to seventh lower via holes 161 to 167 are formed as circular in shape in a top view, respectively. The planar shapes of the first to seventh lower via holes 161 to 167 may be any shapes, and are not limited to any specific design. The first to seventh lower via holes 161 to 167 may have widths of more than 5 μm and less than 20 μm.

The widths of the first to seventh lower via holes 161 to 167 may be more than 5 μm and less than 10 μm, more than 10 μm and less than 15 μm, or more than 15 μm and less than 20 μm. The widths of the first to seventh lower via holes 161 to 167 are preferably more than 8 μm and less than 16 μm. The widths of the first to seventh lower via holes 161 to 167 are preferably more than the widths of the first to seventh upper openings 151 to 157.

Referring to FIG. 5 and FIG. 11, the second organic insulating layer 14B is formed on the first organic insulating layer 14A. The second organic insulating layer 14B includes a first upper via hole 171, a second upper via hole 172, a third upper via hole 173, a fourth upper via hole 174, a fifth upper via hole 175, a sixth upper via hole 176 and a seventh upper via hole 177 formed correspondingly to the first to seventh lower via holes 161 to 167.

The number of the first to seventh upper via holes 171 to 177 is adjusted according to the number of the first to seventh lower via hole 161 to 167. In this mode, two first upper via holes 171, two second upper via holes 172, two third upper via holes 173, one fourth upper via hole 174, one fifth upper via hole 175, one sixth upper via hole 166 and one seventh upper via hole 177 are formed.

The first upper via hole 171 is in communication with the first lower via hole 161 and first upper opening 151, such that the first upper electrode 31 is exposed. A first through hole 181 is formed among the first upper via hole 171, the first lower via hole 161 and the first upper opening 151.

The second upper via hole 172 is in communication with the second lower via hole 162 and the second upper opening 152, such that the third upper electrode 33 is exposed. A second through hole 182 is formed among the second upper via hole 172, the second lower via hole 162 and the second upper opening 152.

The third upper via hole 173 is in communication with the third lower via hole 163 and the third upper opening 153, such that the fifth upper electrode 35 is exposed. A third through hole 183 is formed among the third upper via hole 173, the third lower via hole 163 and the third upper opening 153.

The fourth upper via hole 174 is in communication with the fourth lower via hole 164 and the fourth upper opening 154, such that the first upper pad portion 145 of the first upper connecting electrode 141 is exposed. A fourth through hole 184 is formed among the fourth upper via hole 174, the fourth lower via hole 164 and the fourth upper opening 154.

The fifth upper via hole 175 is in communication with the fifth lower via hole 165 and the fifth upper opening 155, such that the second upper connecting electrode 142 is exposed. A fifth through hole 185 is formed among the fifth upper via hole 175, the fifth lower via hole 165 and the fifth upper opening 155.

The sixth upper via hole 166 is in communication with the sixth lower via hole 166 and the sixth upper opening 156, such that the third upper connecting electrode 143 is exposed. A sixth through hole 186 is formed among the sixth upper via hole 176, the sixth lower via hole 166 and the sixth upper opening 156.

The seventh upper via hole 177 is in communication with the seventh lower via hole 167 the seventh upper opening 157, such that the second upper pad portion 147 of the fourth upper connecting electrode 144 is exposed. A seventh through hole 187 is formed among the seventh upper via hole 177, the seventh lower via hole 167 and the seventh upper opening 157.

The first to seventh upper via holes 171 to 177 are formed as circular in shape in a top view, respectively. The planar shapes of the first to seventh upper via holes 171 to 177 may be any shapes, and are not limited to any specific design. The first to seventh upper via holes 171 to 177 may have widths of more than 5 μm and less than 40 μm.

The widths of the first to seventh upper via holes 171 to 177 may be more than 5 μm and less than 10 μm, more than 10 μm and less than 20 μm, more than 20 μm and less than 30 μm, or more than 30 μm and less than 40 μm. The widths of the first to seventh upper via holes 171 to 177 are preferably more than the widths of the first to seventh lower via holes 161 to 167.

The chip component 1 includes a first via electrode 191, a second via electrode 192, a third via electrode 193, a fourth via electrode 194, a fifth via electrode 195, a sixth via electrode 196 and a seventh via electrode 197 embedded in the first to seventh through holes 181 to 187, respectively.

The first via electrode 191 is embedded in the first through hole 181. The first via electrode 191 is electrically connected to the first upper electrode 31 in the first through hole 181. That is to say, the first via electrode 191 crosses the boundary between the inorganic insulating layer 13 and the organic insulating layer 14. Further, the first via electrode 191 passes through the second organic insulating layer 14B, the first organic insulating layer 14A and the third inorganic insulating layer 13C, and is thus electrically connected to the first upper electrode 31.

The second via electrode 192 is embedded in the second through hole 182. The second via electrode 192 is electrically connected to the third upper electrode 33 in the second through hole 182. That is to say, the second via electrode 191 crosses the boundary between the inorganic insulating layer 13 and the organic insulating layer 14. Further, the second via electrode 192 passes through the second organic insulating layer 14B, the first organic insulating layer 14A and the third inorganic insulating layer 13C, and is thus electrically connected to the third upper electrode 33.

The third via electrode 193 is embedded in the third through hole 183. The third via electrode 193 is electrically connected to the fifth upper electrode 35 in the third through hole 183. That is to say, the third via electrode 193 crosses the boundary between the inorganic insulating layer 13 and the organic insulating layer 14. Further, the third via electrode 193 passes through the second organic insulating layer 14B, the first organic insulating layer 14A and the third inorganic insulating layer 13C, and is thus electrically connected to the fifth upper electrode 35.

The fourth via electrode 194 is embedded in the fourth through hole 184. The fourth via electrode 194 is electrically connected to the first upper pad portion 145 of the first upper connecting electrode 141 in the fourth through hole 184. That is to say, the fourth via electrode 194 crosses the boundary between the inorganic insulating layer 13 and the organic insulating layer 14. Further, the fourth via electrode 194 passes through the second organic insulating layer 14B, the first organic insulating layer 14A and the third inorganic insulating layer 13C, and is thus electrically connected to the first upper pad portion 145.

The fourth via electrode 194 is connected to the first upper pad portion 145 with the first lower opening 131 spaced in between in a top view. That is to say, the fourth via electrode 194 is formed on a flat structure including the first lower dummy pad portion 107, the second inorganic insulating layer 13B and the first upper pad portion 145. The fourth via electrode 194 faces the first lower dummy pad portion 107 with the second inorganic insulating layer 138B spaced in between with respect to the connecting portion of the first upper pad portion 145. Therefore, the fourth via electrode 194 is not affect by a bulge produced by the first lower opening 131, and is properly connected to the first upper pad portion 145.

The fifth via electrode 195 is embedded in the fifth through hole 195. The fifth via electrode 195 is electrically connected to the second upper connecting electrode 142 in the fifth through hole 185. That is to say, the fifth via electrode 195 crosses the interface between the inorganic insulating layer 13 and the organic insulating layer 14. Further, the fifth via electrode 195 passes through the second organic layer 14B, the first organic insulating layer 14A and the third inorganic insulating layer 13C, and is thus electrically connected to the third upper connecting electrode 143.

The fifth via electrode 195 is connected to the second upper connecting electrode 142 with the third lower opening 133 spaced in between in a top view. That is to say, the fifth via electrode 95 is formed on a flat structure including the third lower connecting electrode 103, the second inorganic insulating layer 13B and the second upper connecting electrode 142. The fifth via electrode 195 faces the third lower connecting electrode 103 with the second inorganic insulating layer 13B spaced in between with respect to the connecting portion of the second upper connecting electrode 142. Therefore, the fifth via electrode 195 is not affect by a bulge produced by the third lower opening 133, and is properly connected to the second upper connecting electrode 142.

The sixth via electrode 196 is embedded in the sixth through hole 186. The sixth via electrode 196 is electrically connected to the third connecting electrode 143 in the sixth through hole 186. That is to say, the sixth via electrode 196 crosses the interface between the inorganic insulating layer 13 and the organic insulating layer 14. Further, the sixth via electrode 196 passes through the second organic layer 14B, the first organic insulating layer 14A and the third inorganic insulating layer 13C, and is thus electrically connected to the third upper connecting electrode 143.

The sixth via electrode 196 is connected to the third upper electrode 143 with the fourth lower opening 134 spaced in between in a top view. That is to say, the sixth via electrode 196 is formed on a flat structure including the fourth lower connecting electrode 104, the second inorganic insulating layer 13B and the third upper connecting electrode 143. The sixth via electrode 196 faces the fourth lower connecting electrode 104 with the second inorganic insulating layer 13B spaced in between with respect to the connecting portion of the third upper connecting electrode 143. Therefore, the sixth via electrode 196 is not affect by a bulge produced by the fourth lower opening 134, and is properly connected to the third upper connecting electrode 143.

The seventh via electrode 197 is embedded in the seventh through hole 187. The seventh via electrode 197 is electrically connected to the second upper pad portion 147 of the fourth upper connecting electrode 144 in the seventh through hole 187. That is to say, the seventh via electrode 197 crosses the interface between the inorganic insulating layer 13 and the organic insulating layer 14. Further, the seventh via electrode 197 passes through the second organic insulating layer 14B, the first organic insulating layer 14A and the third inorganic insulating layer 13C, and is thus electrically connected to the second upper pad portion 147.

The seventh via electrode 197 is connected to the second upper pad portion 147 with the sixth lower opening 136 spaced in between in a top view. That is to say, the seventh via electrode 197 is formed on a flat structure including the second lower dummy pad portion 111, the second inorganic insulating layer 13B and the second upper pad portion 147. The seventh via electrode 197 faces the second dummy pad portion 111 with the second inorganic insulating layer 13B spaced in between with respect to the connecting portion of the second upper pad portion 147. Thus, the seventh via electrode 197 is not affect by a bulge produced by the sixth lower opening 136, and is properly connected to the second upper pad portion 147.

Each of the first to seventh via electrodes 191 to 197 has a multilayer structure including a Ti layer 198 and a Cu layer 199 sequentially deposited from the side of inner walls of the first to seventh through holes 181 to 187. The Ti layer 198 is formed as a film along the inner walls of the first to seventh through holes 181 to 187. The Ti layer 198 are divided with recess spaces in the first to seventh through holes 181 to 187.

The Cu layer 199 is embedded in the recess spaces divided by the Ti layer 198 in the first to seventh through holes 181 to 187. The Cu layer 199 has a thickness that is more than the thickness of the Ti layer 198. The Ti layer 198 may have a thickness of more than 0.01 μm and less than 0.5 μm. The thickness of the Ti layer 198 is preferably more than 0.1 μm and less than 0.2 μm.

Referring to FIG. 5 and FIG. 11, the second organic insulating layer 14B further includes a first coil hole 201 and a second coil hole 202. The first coil hole 201 passes through the second organic insulating layer 14B such that the first organic insulating layer 14A is exposed. The first coil hole 201 integrally includes a first inner end hole 203, a first outer end hole 204, and a first spiral hole 205 wound between the first inner end hole 203 and the first outer end hole 204.

The first inner end hole 203 is located on the side of the first substrate sidewall 74A in a top view. The first inner end hole 203 is in communication with the first upper via hole 171. The first outer end hole 204 is located on the side of the second substrate sidewall 74B in a top view. In this mode, the first outer end hole 204 is located in a center portion of the first substrate main surface 72 in a top view. The first outer end hole 204 is in communication with the second upper via hole 172. The first spiral hole 205 winds outward from the first inner end hole 203 toward the first outer end hole 204.

The second coil hole 202 passes through the second organic insulating layer 14B, such that the first organic insulating layer 14A is exposed. the second coil hole 202 integrally includes a second inner end hole 206, a second outer end hole 207, and a second spiral hole 208 wound between the second inner end hole 206 and the second outer end hole 207.

The second inner end hole 206 is located on the side of the second substrate sidewall 74B in a top view. The second inner end hole 206 is in communication with the third upper via hole 173. The second outer end hole 207 is located on the side of the first substrate sidewall 74A in a top view. In this mode, the second outer end hole 207 is located in a center portion of the first substrate main surface 72 in a top view. The second outer end hole 207 is in communication with the second upper via hole 172. The second outer end hole 207 is further in communication with the first outer end hole of the first coil hole 201. The second spiral hole 208 winds outward from the second inner end hole 206 toward the second outer end hole 207.

The first coil hole 201 winds in a manner of encircling the first lower electrode 21 and the first upper electrode 31 (the first capacitor C1) in a top view. Accordingly, the first lower electrode 21 and the first upper electrode 31 (the first capacitor C1) are formed in a region encircled by an inner periphery of the first coil hole 201. The first coil hole 201 overlaps the first and second dummy electrodes 121 and 122 in a top view.

The second coil hole 202 winds in a manner encircling the fifth lower electrode 25 and the fifth upper electrode 35 (the fifth capacitor C5) in a top view. Thus, the fifth lower electrode 25 and the fifth upper electrode 35 (the fifth capacitor C5) are formed in a region encircled by an inner periphery of the second coil hole 202. The second coil hole 202 overlaps the third and fourth dummy electrodes 123 and 124 in a top view.

Further, the second coil hole 202 winds in a manner of having a communicating portion thereof and the first coil hole 201 be located above the third lower electrode 23 and the third upper electrode 33 (the third capacitor C3) in a top view. Thus, the third lower electrode 23 and the third upper electrode 33 (the third capacitor C3) are formed in a region between the first coil hole 201 (the first spiral hole 205) and the second coil hole 202 (the second spiral hole 208) in a top view.

The first and second coil holes 201 and 202 may have widths of more than 5 μm and less than 40 μm. The widths of the first and second coil holes 201 and 202 may also be more than 5 μm and less than 10 μm, more than 10 μm and less than 20 μm, more than 20 μm and less than 30 μm, or more than 30 μm and less than 40 μm. The widths of the first and second coil holes 201 and 202 are preferably more than 5 μm and less than 20 μm.

The first coil conductor 41 is embedded in the first coil hole 201. The first inner end 43 of the first coil conductor 41 is located in the first inner end hole 203 of the first coil hole 201. The first outer end 44 of the first coil conductor 41 is located in the first outer end hole 204 of the first coil hole 201. The first spiral portion 45 of the first coil conductor 41 is located in the first spiral hole 205 of the first coil hole 201.

The first inner end 43 of the first coil conductor 41 is electrically connected to the first via electrode 191 in a communicating portion of the first inner end hole 203 and the first upper via hole 171. Thus, the first inner end 43 of the first coil conductor 41 is electrically connected to the first upper electrode 31 by the first via electrode 191.

The first outer end 44 of the first coil conductor 41 is electrically connected to the second via electrode 192 in a communicating portion of the first outer end hole 204 and the second upper via hole 172. Thus, the first outer end 44 of the first coil conductor 41 is electrically connected to the third upper electrode 33 by the second via electrode 192.

The second coil conductor 42 is embedded in the second coil hole 202. The second inner end 46 of the second coil conductor 42 is located in the second inner end hole 206 of the second coil hole 202. The second outer end 47 of the second coil conductor 42 is located in the second outer end hole 207 of the second coil hole 202. The second spiral portion 48 of the second coil conductor 42 is located in the second spiral hole 208 of the second coil hole 202.

The second inner end 46 of the second coil conductor 42 is electrically connected to the third via electrode 193 in a communicating portion of the second inner end hole 206 and the third upper via hole 173. Thus, the second inner end 46 of the second coil conductor 42 is electrically connected to the fifth upper electrode 35 by the third via electrode 193.

The second outer end 47 of the second coil conductor 42 is electrically connected to the second via electrode 192 in a communicating portion of the second outer end hole 207 and the second upper via hole 172. Thus, the second outer end 47 of the second coil conductor 42 is electrically connected to the third upper electrode 33 by the second via electrode 192.

Further, the second outer end 47 of the second coil conductor 42 is electrically connected to the first outer end 44 of the first coil conductor 41 in a communicating portion of the first outer end hole 204 and the second outer end hole 207. The inductor connecting portion 7 is formed by a connecting portion of the first outer end 44 and the second outer end 47.

The first coil conductor 41 winds in a manner of encircling the first lower electrode 21 and the first upper electrode 31 (the first capacitor C1). Thus, the first lower electrode 21 and the first upper electrode 31 (the first capacitor C1) are formed in a region encircled by an inner periphery of the first coil conductor 41 in a top view. The first coil conductor 41 overlaps the first and second dummy electrodes 121 and 122 in a top view.

The second coil conductor 42 winds in a manner of encircling the fifth lower electrode 25 and the fifth upper electrode 35 (the fifth capacitor C5) in a top view. Thus, the fifth lower electrode 25 and the fifth upper electrode 35 (the fifth capacitor C5) are formed in a region encircled by an inner periphery of the first coil conductor 41 in a top view. The second coil conductor 42 overlaps the third and fourth dummy electrodes 123 and 124 in a top view.

Further, the first and second coil conductors 41 and 42 wind in a manner of having the inductor connecting portion 7 be located above the third lower electrode 23 and the third upper electrode 33 in a top view. Thus, the third lower electrode 23 and the third upper electrode 33 (the third capacitor C3) are formed in a region between the first coil conductor 41 (the first spiral portion 45) and the second conductor 42 (the second spiral portion 48) in a top view.

The first and second coil conductors 41 and 42 have thicknesses corresponding to the thickness of the second organic insulating layer 14B. That is to say, the first and second coil conductors 41 and 42 may have thicknesses of more than 10 μm and less than 200 μm. The thicknesses of the first and second coil conductors 41 and 42 are preferably more than 20 μm and less than 70 μm. The first and second coil conductors 41 and 42 have thicknesses of preferably more than the thickness T2 (more than 0.3 μm and less than 12 μm) of the inorganic insulating layer 13.

The first and second coil conductors 41 and 42 may have linewidths of more than 5 μm and less than 40 μm. The linewidths of the first and second coil conductors 41 and 42 are widths orthogonal to extension directions of the first and second coil conductors 41 and 42. The linewidths of first and second coil conductors 41 and 42 may be more than 5 μm and less than 10 μm, more than 10 μm and less than 20 μm, more than 20 μm and less than 30 μm, or more than 30 μm and less than 40 μm. The linewidths of the first and second coil conductors 41 and 42 are preferably more than 5 μm and less than 20 μm.

The linewidths of the first and second coil conductors 41 and 42 have aspect ratios of preferably more than 1 and less than 5. The aspect ratios of the first and second coil conductors 41 and 42 are ratios of the thicknesses of the first and second coil conductors 41 and 42 to the linewidths of the first and second coil conductors 41 and 42. The aspect ratios of the first and second coil conductors 41 and 42 may also be more than 1 and less than 2, more than 2 and less than 3, more than 3 and less than 4, or more than 4 and less than 5.

Each of the first and second coil conductors 41 and 42 has a multilayer structure including a Ti layer 209 and a Cu layer 210 sequentially deposited from the side of inner walls of the first and second coil holes 201 and 202. The Ti layer 209 is formed as a film along the inner walls of the first and second conductor holes 201 and 202. The Ti layer 209 is divided into recess spaces in the first and second coil holes 201 and 202. The Ti layer 209 is formed integrally with the Ti layer 198 of the first to seventh via electrodes 191 to 197.

The Cu layer 210 is embedded in the recess spaces divided by the Ti layer 209 in the first and second coil holes 201 and 202. The Cu layer 210 is formed integrally with the Cu layer 199 of the first to seventh via electrodes 191 to 197. The Cu layer 210 has a thickness that is more than the thickness of the Ti layer 209. The Ti layer 209 may have a thickness of more than 0.01 μm and less than 0.5 μm. The thickness of the Ti layer 209 is preferably more than 0.1 μm and less than 2 μm. The thickness of the Ti layer 209 is preferably equal to the thicknesses of the first to seventh via electrodes 191 to 197.

Referring to FIG. 5 and FIG. 12, the third organic insulating layer 14C is formed on the second organic insulating layer 14B. The third organic insulating layer 14C altogether covers the first and second coil conductors 41 and 42. The third organic insulating layer 14C includes a first uppermost via hole 211, a second uppermost via hole 212, a third uppermost via hole 213, a fourth uppermost via hole 214, a fifth uppermost via hole 215 and a sixth uppermost via hole 216.

The number of the first to sixth uppermost via holes 211 and 216 is adjusted according to the number of the first to seventh upper via holes 171 to 177 (except for the second upper via hole 172). In this mode, two uppermost via holes 211, two second uppermost via holes 212, one third uppermost via hole 213, one fourth uppermost via hole 214, one fifth uppermost via hole 215, and one sixth uppermost via hole 216 are formed.

The first uppermost via hole 211 is in communication with the first upper via hole 171, such that the first via electrode 191 is exposed. The second uppermost via hole 212 is in communication with the third upper via hole 173, such that the third via electrode 193 is exposed.

The third uppermost via hole 213 is in communicating with the fourth upper via hole 174, such that the fourth via electrode 194 is exposed. The fourth uppermost via hole 214 is in communication with the fifth upper via hole 175, such that the fifth via electrode 195 is exposed. The fifth uppermost via hole 215 is in communication with the sixth upper via hole 176, such that the sixth via electrode 196 is exposed. The sixth uppermost via hole 216 is in communication with the seventh upper via hole 177, such that the seventh via electrode 197 is exposed.

The first to sixth uppermost via holes 211 to 216 are formed as circular in shape in a top view, respectively. The planar shapes of the first to sixth uppermost via holes 211 to 216 may be any shapes, and are not limited to specific designs. The first to sixth uppermost via holes 211 to 216 may have widths of more than 5 μm and less than 50 μm.

The widths of the first to sixth uppermost via holes 211 to 216 may also be more than 5 μm and less than 10 μm, more than 10 μm and less than 20 μm, more than 20 μm and less than 30 μm, more than 30 μm and less than 40 μm, or more than 40 μm and less than 50 μm. The widths of the first to sixth uppermost via holes 211 to 216 are preferably more than the widths of the first to seventh upper via holes 171 to 177.

Referring to FIG. 5 and FIG. 13, the plurality of external terminals 2 to 5 (the first I/O terminal 2, the second I/O terminal 3, the first reference terminal 4 and the second reference terminal 5) are exposed from the third organic insulating layer 14C (the first chip main surface 62). More specifically, the plurality of external terminals 2 to 5 are formed on the third organic insulating layer 14C. Further, more specifically, the plurality of external terminals 2 to 5 are formed on the third organic insulating layer 14C in a manner of protruding from the third organic insulating layer 14C (the first chip main surface 62).

The first I/O terminal 2 is disposed in a region on the side of the first substrate sidewall 74A in a top view. In this mode, the first I/O terminal 2 is formed as a T shape having a portion protruding toward the side of the second substrate sidewall 74B in a top view. The planar shape of the first I/O terminal 2 may also be any shape, and is not limited to a specific design. The first I/O terminal 2 may also be formed as quadrilateral in shape in a top view.

The first I/O terminal 2 enters the first uppermost via hole 211 from the third organic insulating layer 14C. The first I/O terminal 2 is electrically connected to the first via electrode 191 in the first uppermost via hole 211. Thus, the first I/O terminal 2 is electrically connected to the first inner end 43 of the first coil conductor 41, the first upper electrode 31 and the second lower electrode 22 by the first via electrode 191.

The second I/O terminal 3 is disposed in a region on the side of the second substrate sidewall 74B in a top view. In this mode, the second I/O terminal 3 is formed as a T shape having a portion protruding toward the side of the first substrate sidewall 74A in a top view. The planar shape of the second I/O terminal 3 may be any shape, and is not limited to a specific design. The second I/O terminal 3 may also be formed as quadrilateral in shape in a top view.

The second I/O terminal 3 enters the second uppermost via hole 212 from the third organic insulating layer 14C. The second I/O terminal 3 is electrically connected to the third via electrode 193 in the second uppermost via hole 212. Thus, the second I/O terminal 3 is electrically connected to the second inner end 46 of the second coil conductor 42, the fifth upper electrode 35 and the fourth lower electrode 24 by the third via electrode 193.

The first reference terminal 4 is disposed in a region on the side of the third substrate sidewall 74C in a top view. In this mode, first reference terminal 4 is formed as quadrilateral in shape in a top view. The planar shape of the first reference terminal 4 is any shape, and is not limited to a specific design.

The first reference terminal 4 enters the third uppermost via hole 213 and the fourth uppermost via hole 214 from the third organic insulating layer 14C. The first reference terminal 4 is electrically connected to the fourth via electrode 194 in the third uppermost via hole 213, and is electrically connected to the fifth via electrode 195 in the fourth uppermost via hole 214.

Thus, the first reference terminal 4 is electrically connected to the first upper connecting electrode 141, the first lower connecting electrode 101 and the first lower electrode 21 by the fourth via electrode 194. Further, the first reference terminal 4 is electrically connected to the second upper connecting electrode 142, the third lower connecting electrode 103 and the third lower electrode 23 by the fifth via electrode 195.

The second reference terminal 5 is disposed on the side of the fourth substrate sidewall 74D in a top view. In this mode, the second reference terminal 5 is formed as quadrilateral in shape in a top view. The planar shape of the second reference terminal 5 is any shape, and is not limited to a specific design.

The second reference terminal 5 enters the fifth uppermost via hole 215 and the sixth uppermost via hole 216 from the third organic insulating layer 14C. The second reference terminal 5 is electrically connected to the sixth via electrode 196 in the fifth uppermost via hole 215, and is electrically connected to the seventh via electrode 197 in the sixth uppermost via hole 216.

Thus, the second reference terminal 5 is electrically connected to the third upper connecting electrode 143, the fourth lower connecting electrode 104 and the third lower electrode 23 by the sixth via electrode 196. Further, the second reference terminal 5 is electrically connected to the fourth upper connecting electrode 144, the fifth lower connecting electrode 105 and the fifth lower electrode 25 by the seventh via electrode 197.

Each of the plurality of external terminals 2 to 5 includes a Ti layer 217 and a Cu layer 218 sequentially deposited from the side of the organic insulating layer 14. The Ti layer 217 enters the first to sixth uppermost via holes 211 to 216 from the third organic insulating layer 14C (the first organic main surface 92). The Ti layer 217 is formed as a film along the third organic insulating layer 14C (the first organic main surface 92) and inner walls of the first to sixth uppermost via holes 211 to 216. The Ti layer 217 is divided into recess spaces in the first to sixth uppermost via holes 211 to 216.

The Cu layer 218 covers the Ti layer 217. The Cu layer 218 enters the first to sixth uppermost via holes 211 to 216 from the third organic insulating layer 14 C (the first organic main surface 92). The Cu layer 218 is embedded in the recess spaces divided by the Ti layer 217 in the first to sixth uppermost via holes 211 to 216. The Cu layer 218 has a thickness that is more than the thickness of the Ti layer 217. The thickness of the Ti layer 217 may be more than 0.01 μm and less than 0.5 μm. The thickness of the Ti layer 217 is preferably more than 0.1 μm and less than 0.2 μm.

In this mode, each of the plurality of external terminals 2 to 5 includes an outer surface electrode 219 covering the outer surface of the Cu layer 218. The outer surface electrode 219 includes a conductive material different from the Cu layer 218. The outer surface electrode 219 may have a multilayer structure sequentially including an Ni layer, a Pd layer and an Au layer that are sequentially deposited from the side of the Cu layer 218. The outer surface electrode 219 may also be connected to the first organic main surface 92 of the organic insulating layer 14. The outer surface electrode 219 may also be connected to the organic sidewalls 94A to 94D.

The foregoing first wiring 51 (referring to FIG. 2) is formed by the first via electrode 191. The foregoing second wiring 52 (referring to FIG. 2) is formed by the second via electrode 192. The foregoing third wiring 53 (referring to FIG. 2) is formed by the second via electrode 193.

The foregoing fourth wiring 54 (referring to FIG. 2) is formed by the fourth via electrode 194, the fifth via electrode 195, the first lower connecting electrode 101, the third lower connecting electrode 103, the first upper connecting electrode 141 and the second upper connecting electrode 142.

The foregoing fifth wiring 55 (referring to FIG. 2) is formed by the sixth via electrode 196, the seventh via electrode 197, the fourth lower connecting electrode 104, the fifth lower connecting electrode 105, the third upper connecting electrode 143 and the fourth upper connecting electrode 144.

As described above, the chip component 1 includes the substrate 2, the inorganic insulating layer 13, the organic insulating layer 14 and the LC circuit 6. The inorganic insulating layer 13 is formed on the substrate 2. The organic insulating layer 14 is formed on the inorganic insulating layer 13. The LC circuit 6 includes the first to fifth capacitors C1 to C5 formed in the inorganic insulating layer 13, and the first and second inductors L1 and L2 formed in the organic insulating layer 14. The structure above is capable of achieving outstanding LC characteristics.

More specifically, the relative dielectric constant of the inorganic insulating layer 13 is more than the relative dielectric constant of the organic insulating layer 14. Further, the inorganic insulating layer 13 is better than the organic insulating layer 14 from an aspect of thinness. Therefore, a film and outstanding capacitance values may be achieved by forming the first to fifth capacitors C1 to C5 in the inorganic insulating layer 13.

Further, the coil conductor 40 having a sufficient thickness may be formed in the organic insulating layer 14. As an example, the first and second inductors L1 and L2 having thicknesses (more than 10 μm and less than 200 μm) more than the thickness T2 (more than 0.3 μm and less than 12 μm) of the inorganic insulating layer 13 may be formed. Thus, parasitic resistance of the first and second inductors L1 and L2 may be suppressed. Further, parasitic capacitance of the first and second inductors L1 and L2 as well as the first to fifth capacitors C1 to C5 may be lowered by the organic insulating layer 14.

Further, the first and second inductors L1 and L2 and the first to fifth capacitors C1 to C5 are disposed in the inorganic insulating layer 13 and the organic insulating layer 14 deposited on the substrate 12. Thus, wiring distances among the first and second inductors L1 and L2 and the first to fifth capacitors C1 to C5 may be reduced, hence lowering wiring resistance.

Thus, the chip component 1 is capable of increasing the Q value of the LC circuit 6, hence achieving outstanding LC characteristics. Further, two-dimensional upscaling of chip size may be restrained by the three-dimensional multilayer structure including the first and second inductors L1 and L2 and the first to fifth capacitors C1 to C5. Therefore, the chip component 1 may be miniaturized.

Figure 14A:
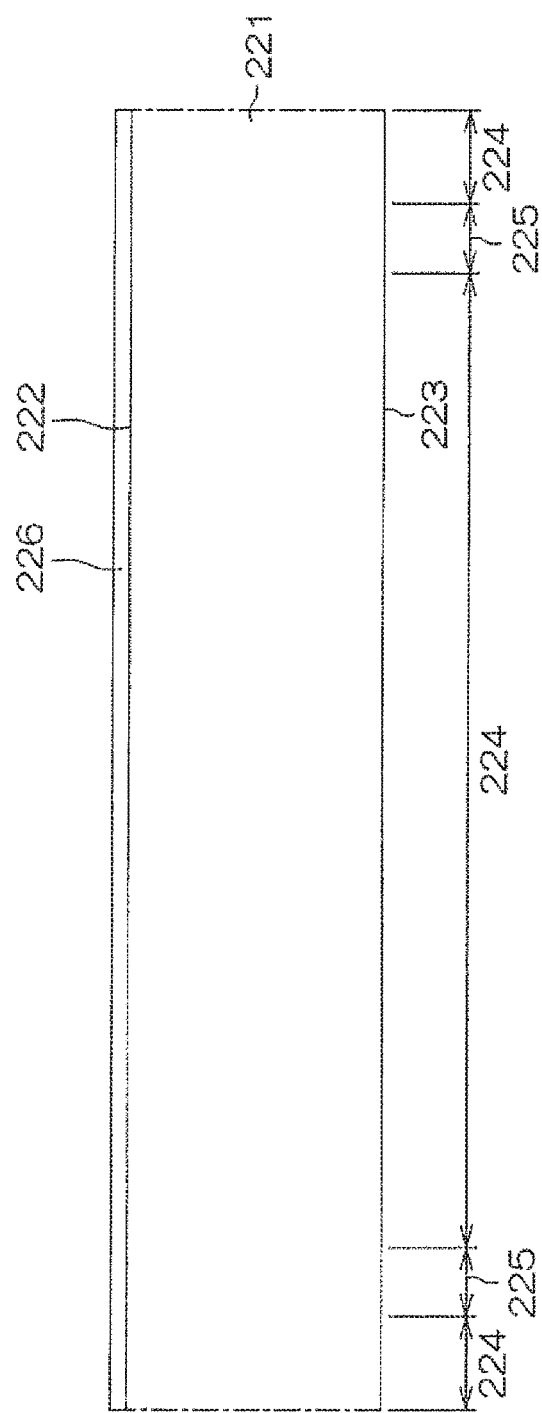
FIG. 14A is a section view for illustrating an example of a manufacturing step of the chip component in FIG. 3.
Figure 14B:
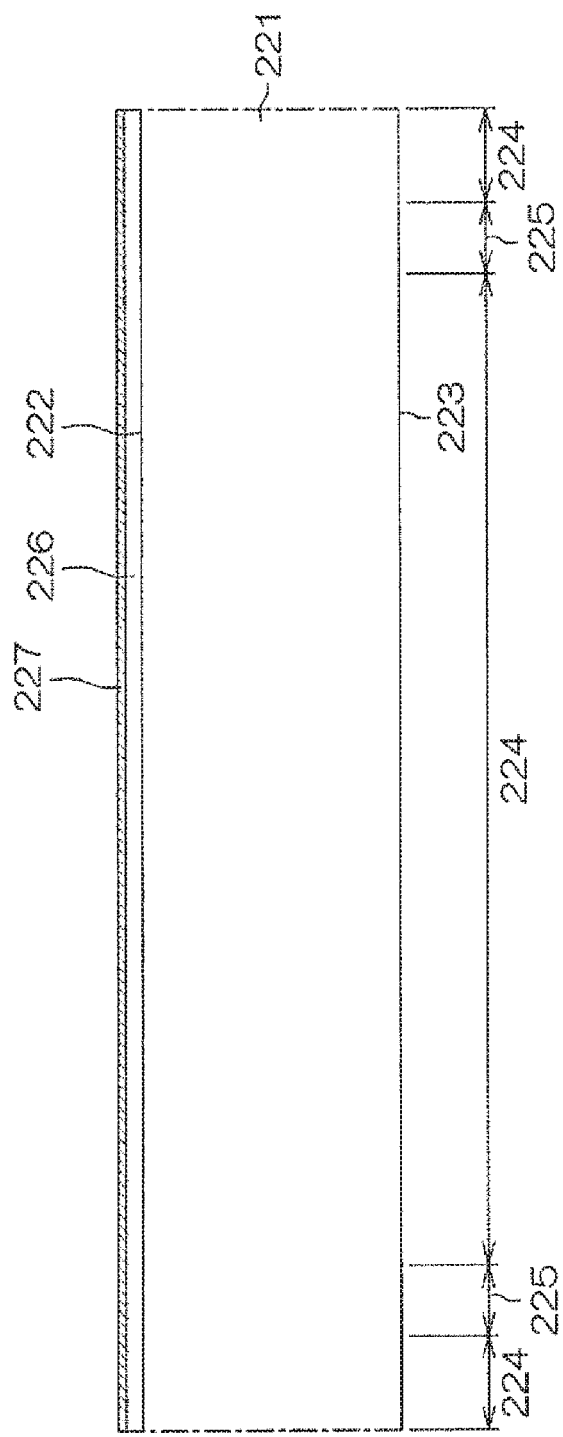
FIG. 14B is a section view of a step after FIG. 14A.
Figure 14C:
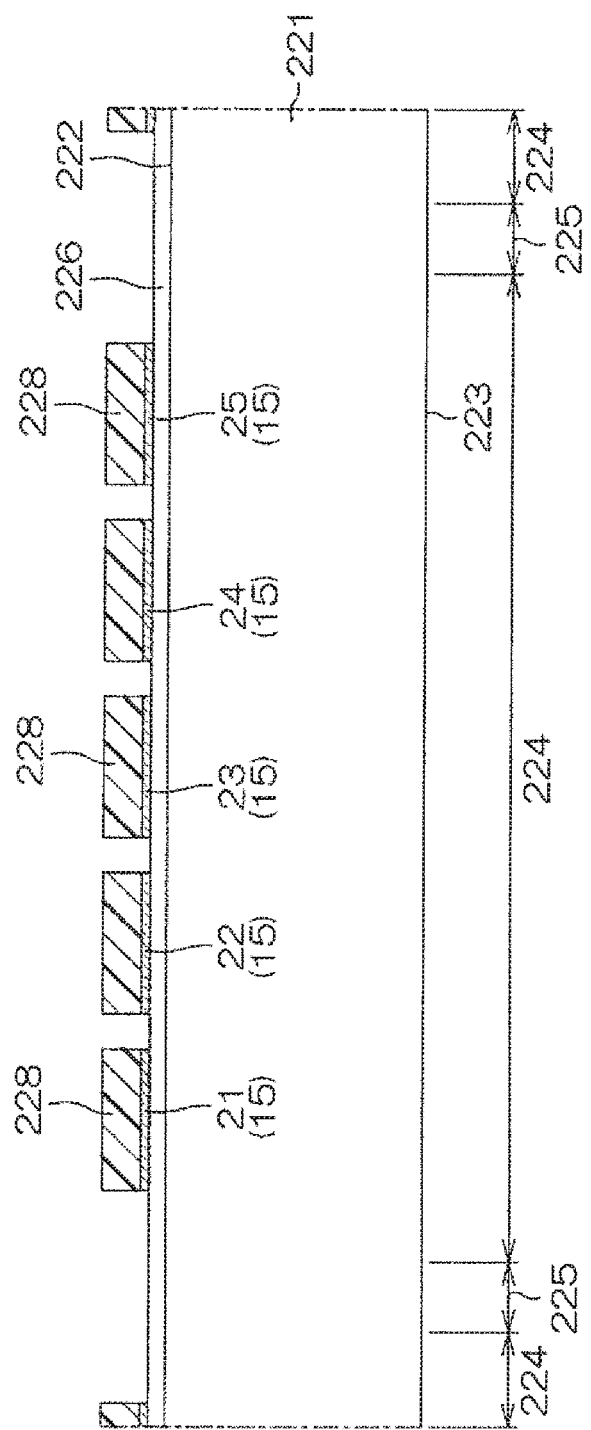
FIG. 14C is a section view of a step after FIG. 14B.
Figure 14D:
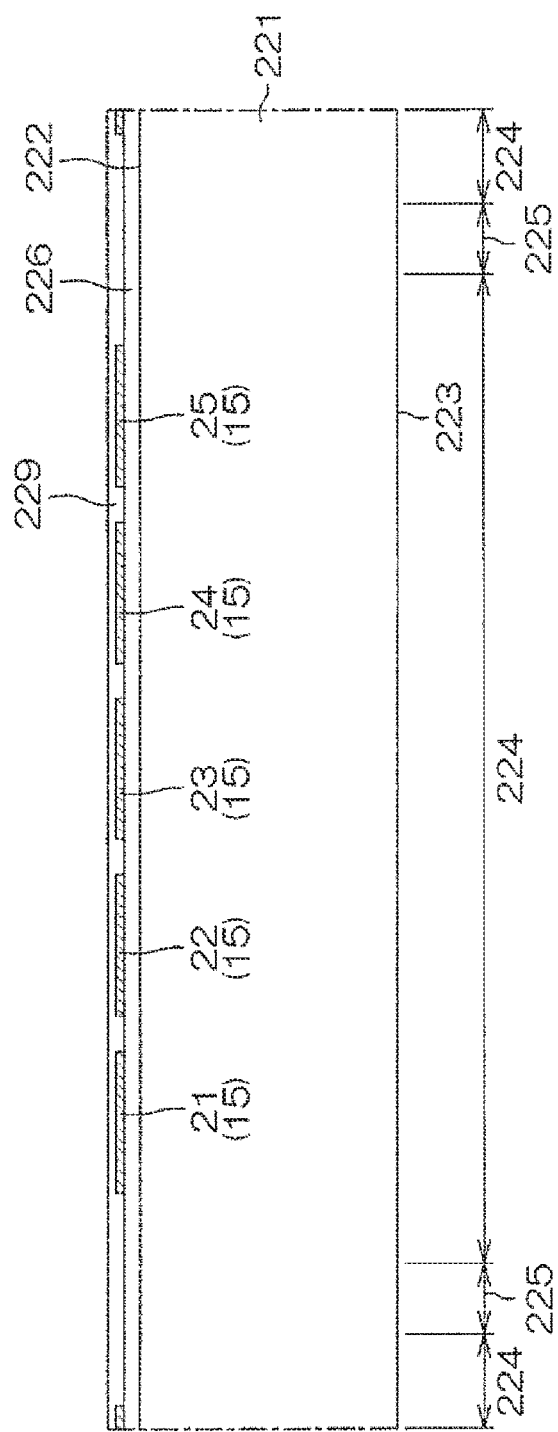
FIG. 14D is a section view of a step after FIG. 14C.
Figure 14E:
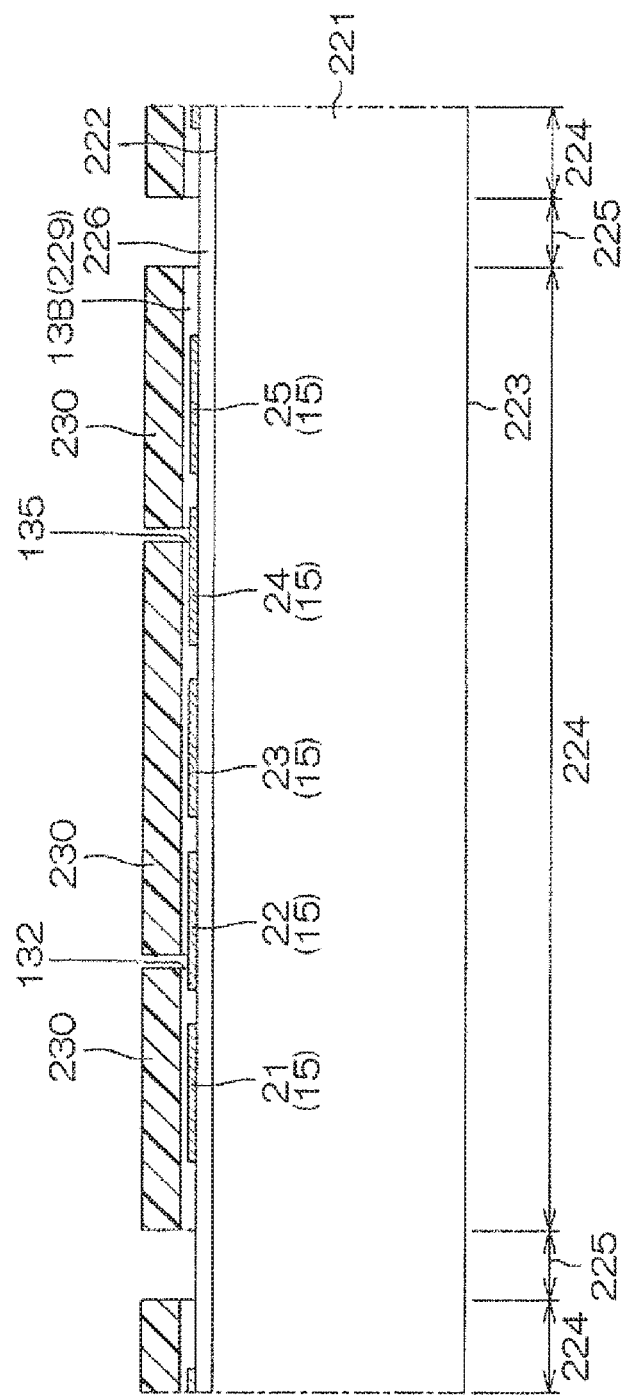
FIG. 14E is a section view of a step after FIG. 14D.
Figure 14F:
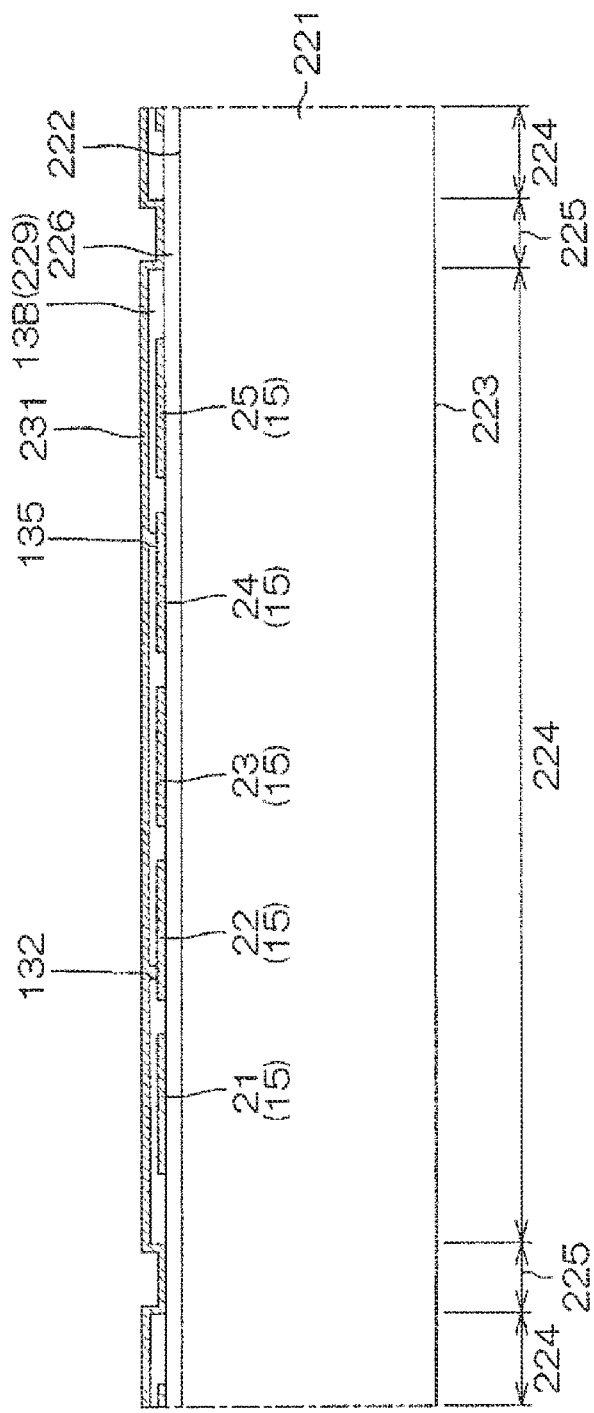
FIG. 14F is a section view of a step after FIG. 14E.
Figure 14G:
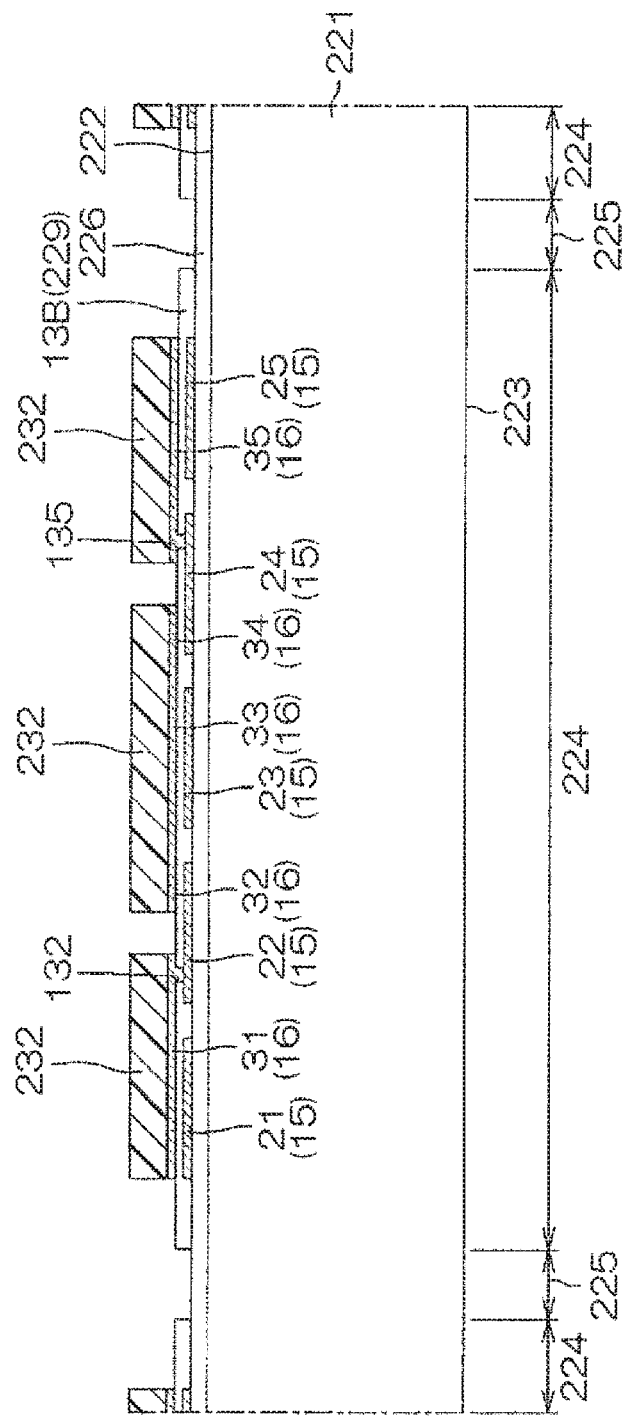
FIG. 14G is a section view of a step after FIG. 14F.
Figure 14H:
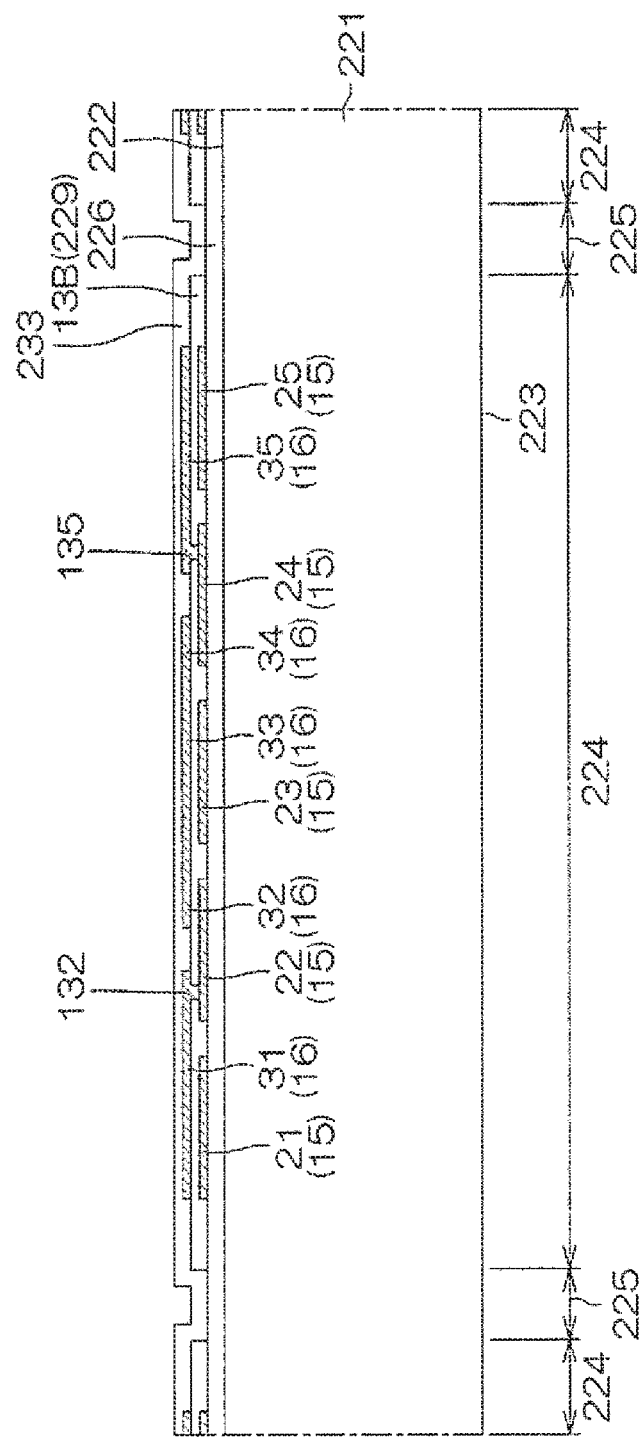
FIG. 14H is a section view of a step after FIG. 14G.
Figure 14I:
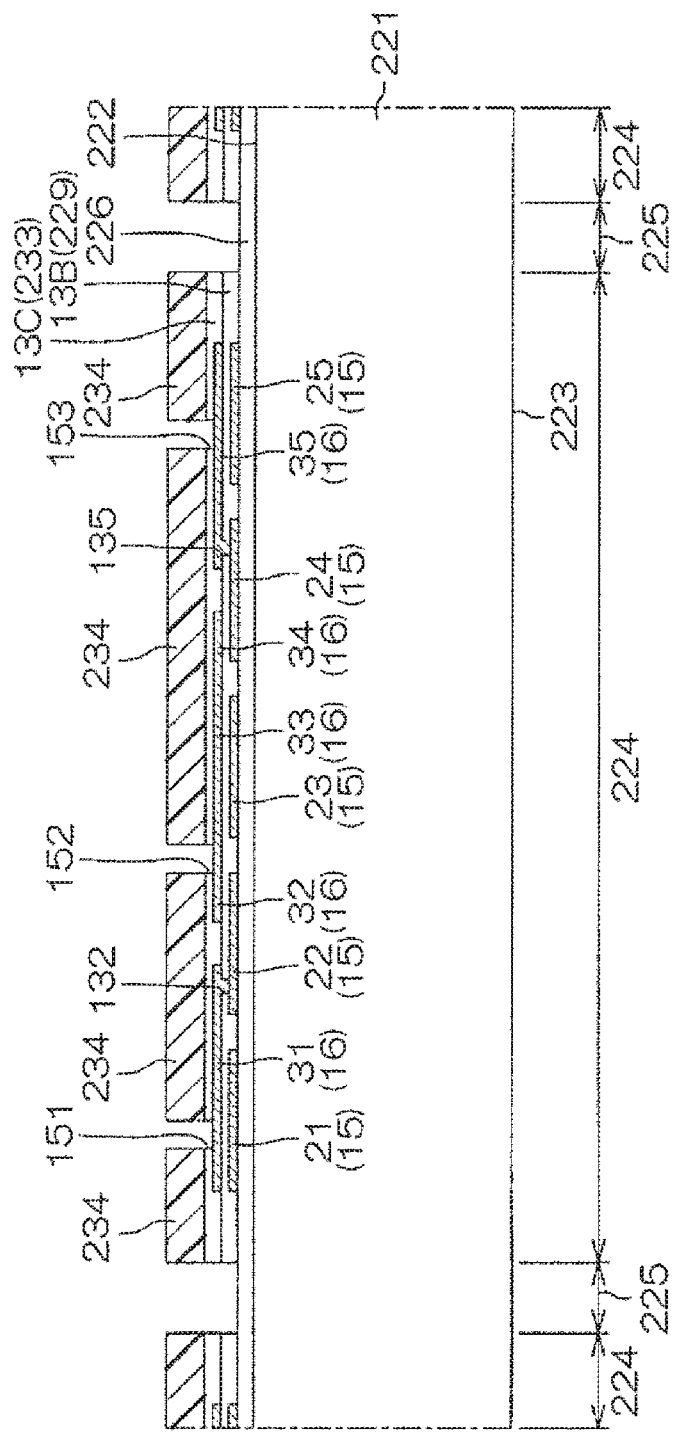
FIG. 14I is a section view of a step after
Figure 14J:
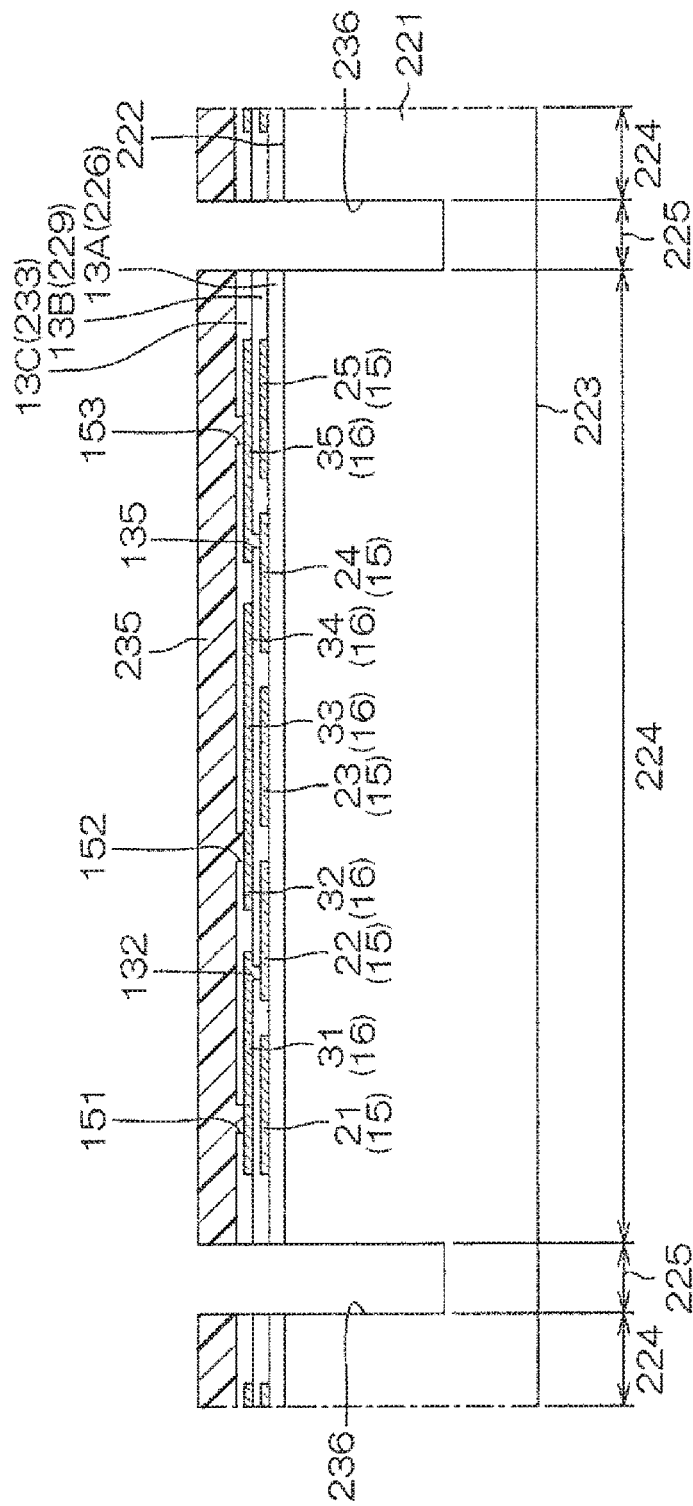
FIG. 14J is a section view of a step after FIG. 14I.
Figure 14K:
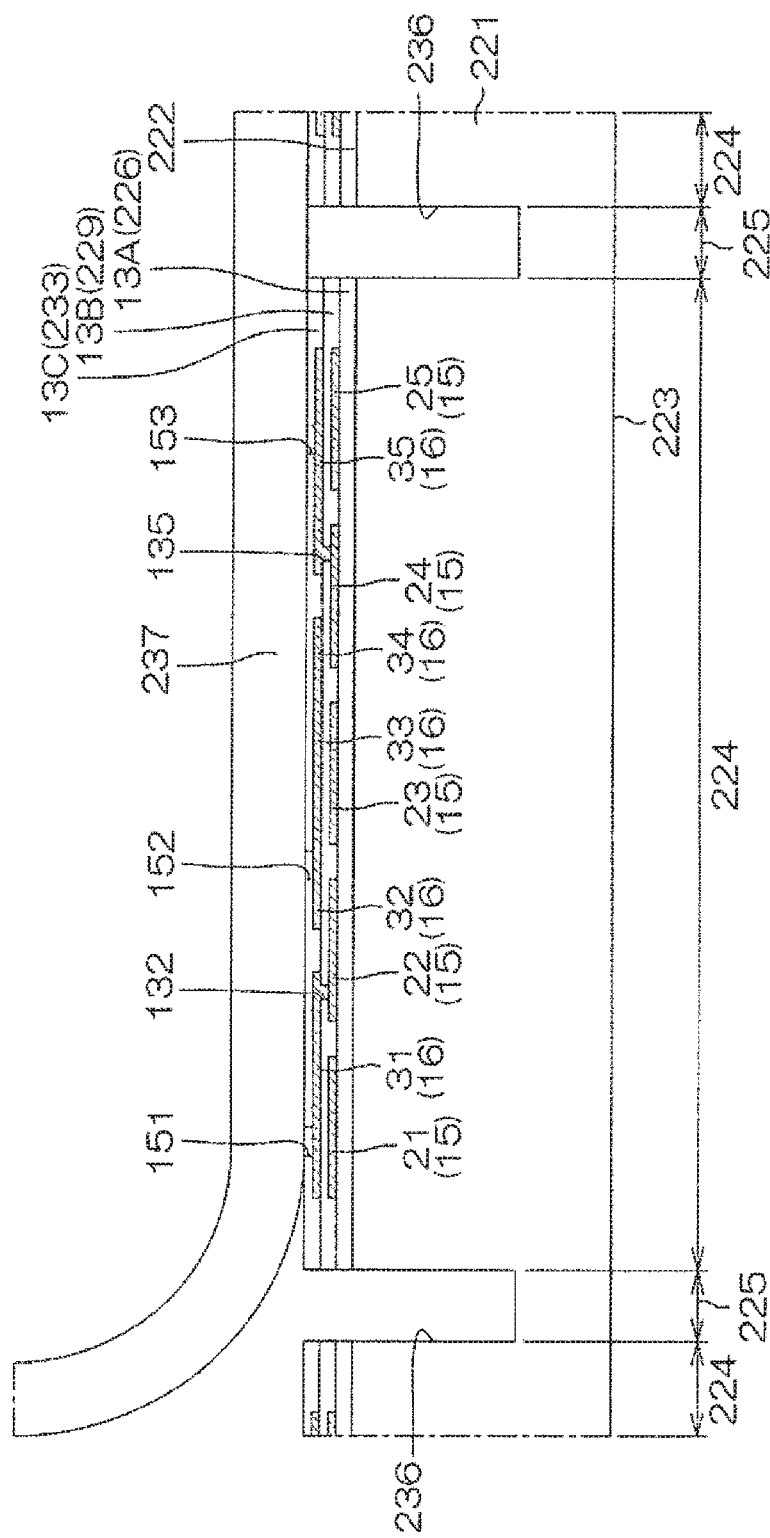
FIG. 14K is a section view of a step after FIG. 14J.
Figure 14L:
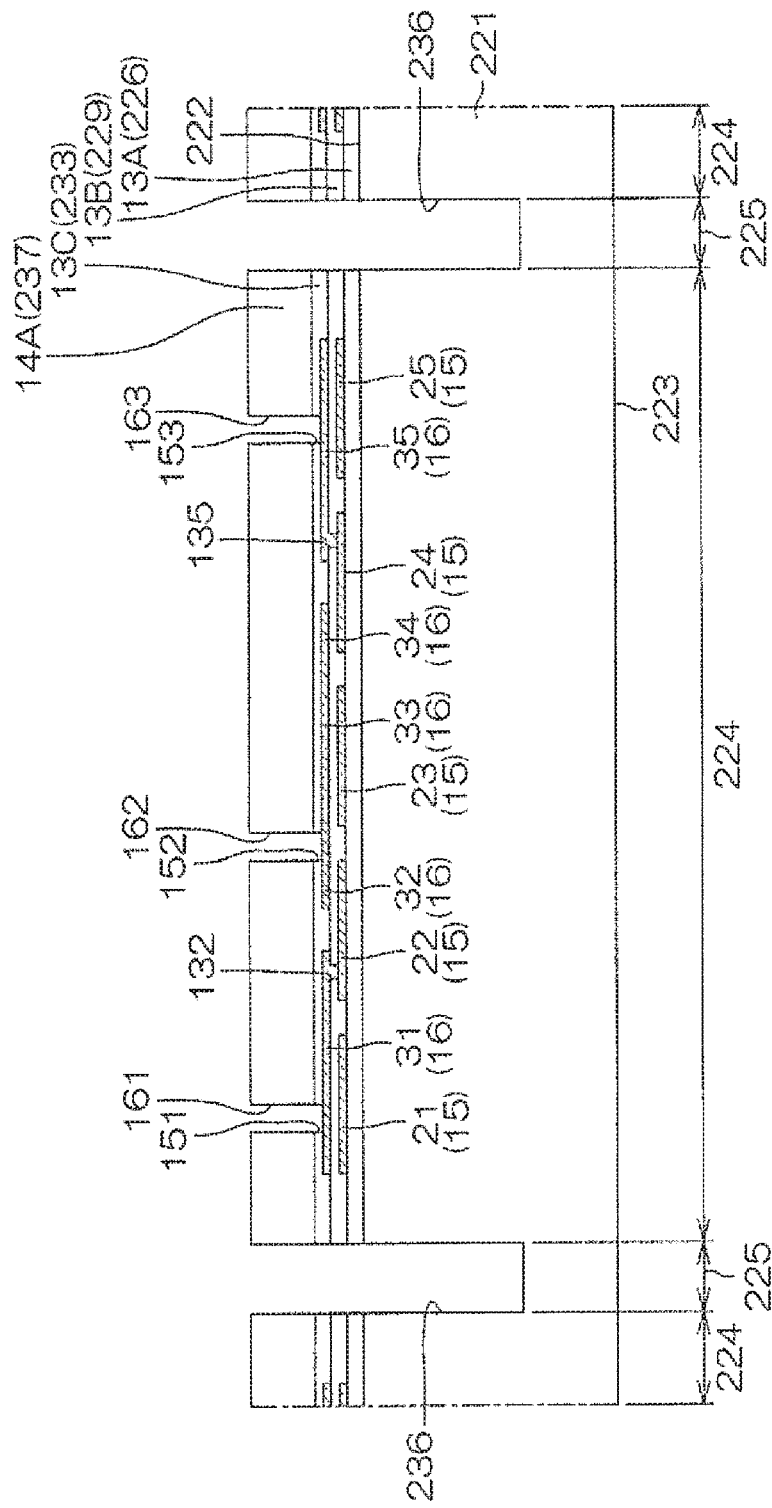
FIG. 14L is a section view of a step after FIG. 14K.
Figure 14M:
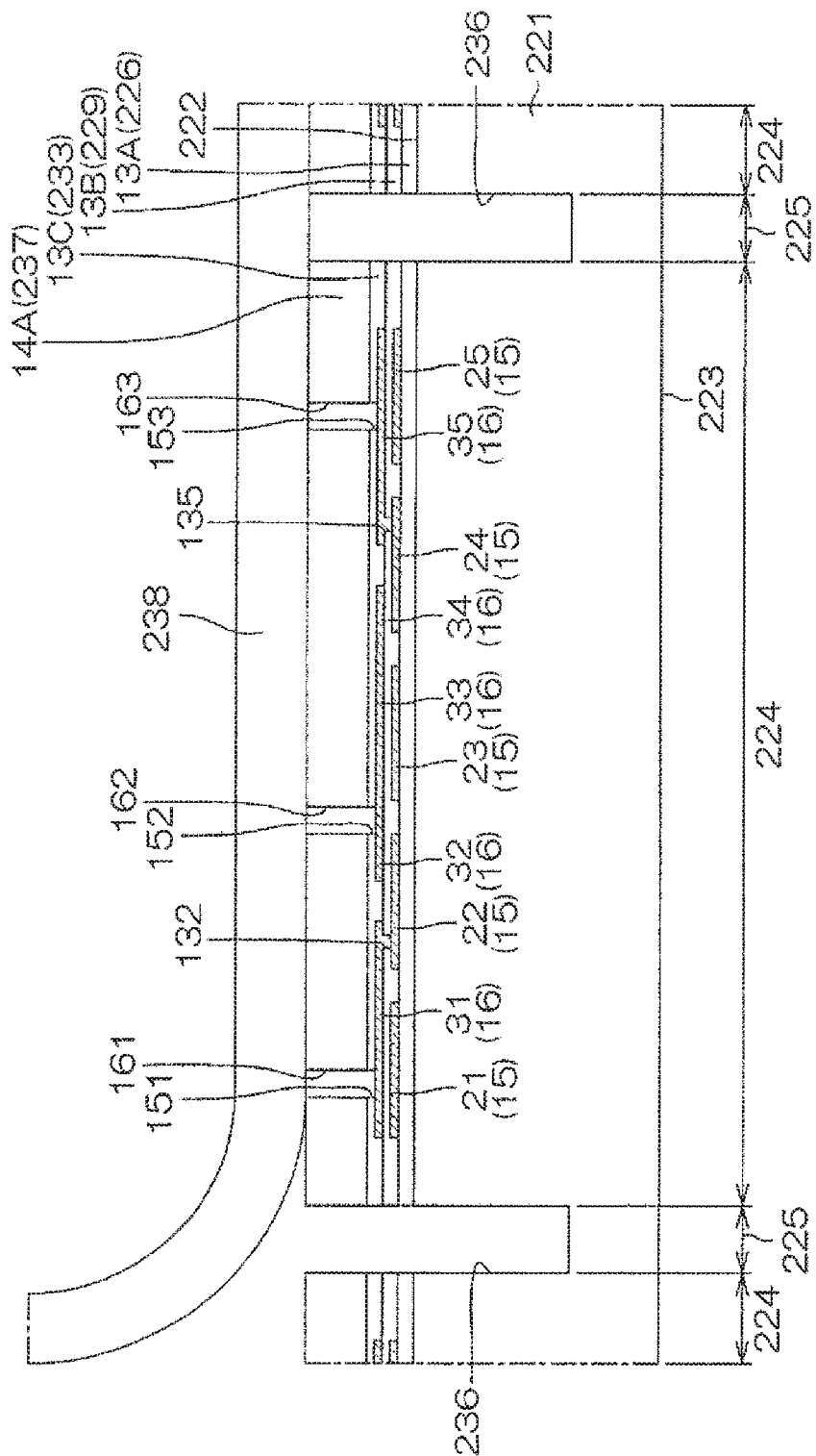
FIG. 14M is a section view of a step after FIG. 14L.
Figure 14N:
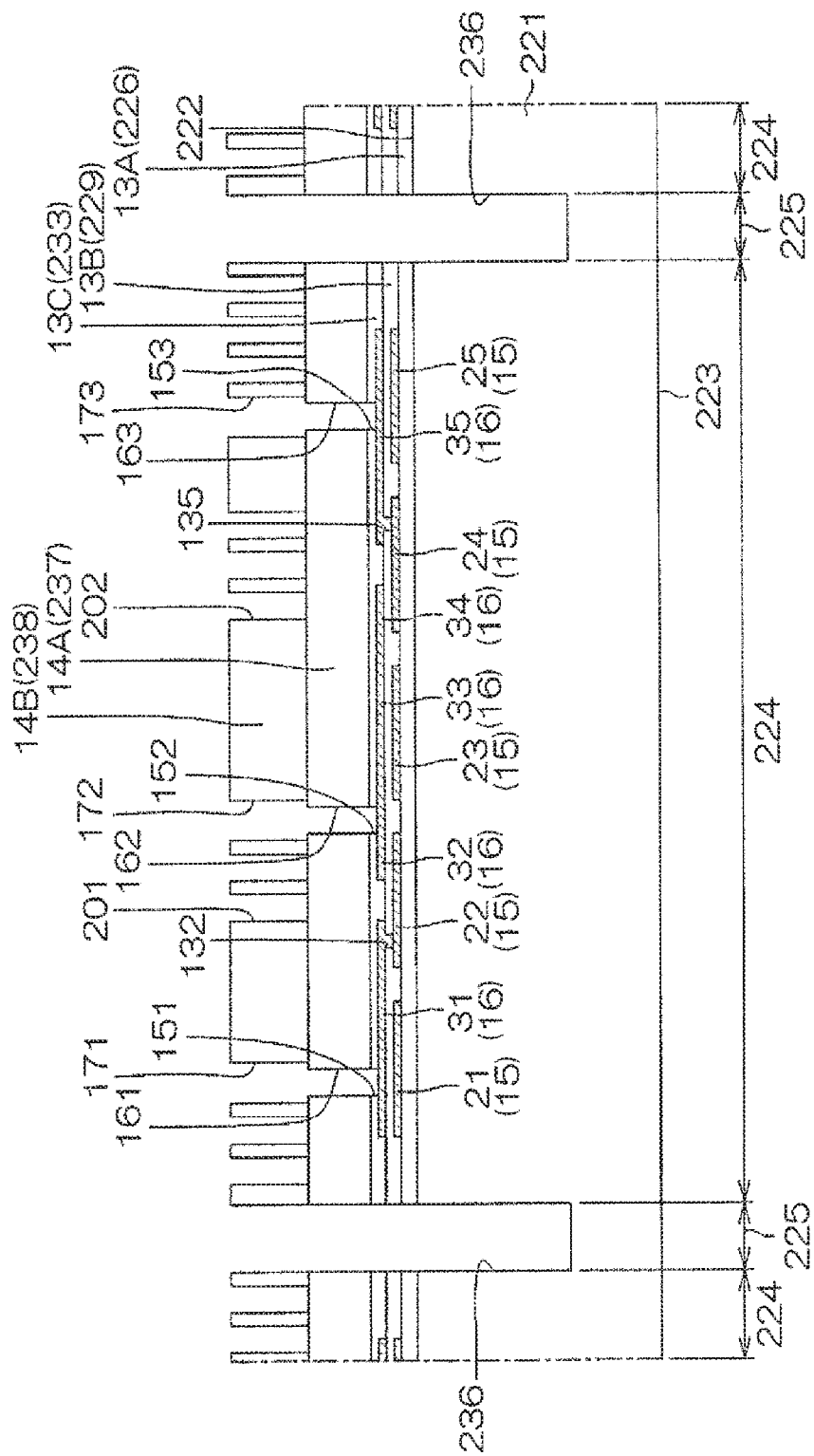
FIG. 14N is a section view of a step after FIG. 14M.
Figure 14O:
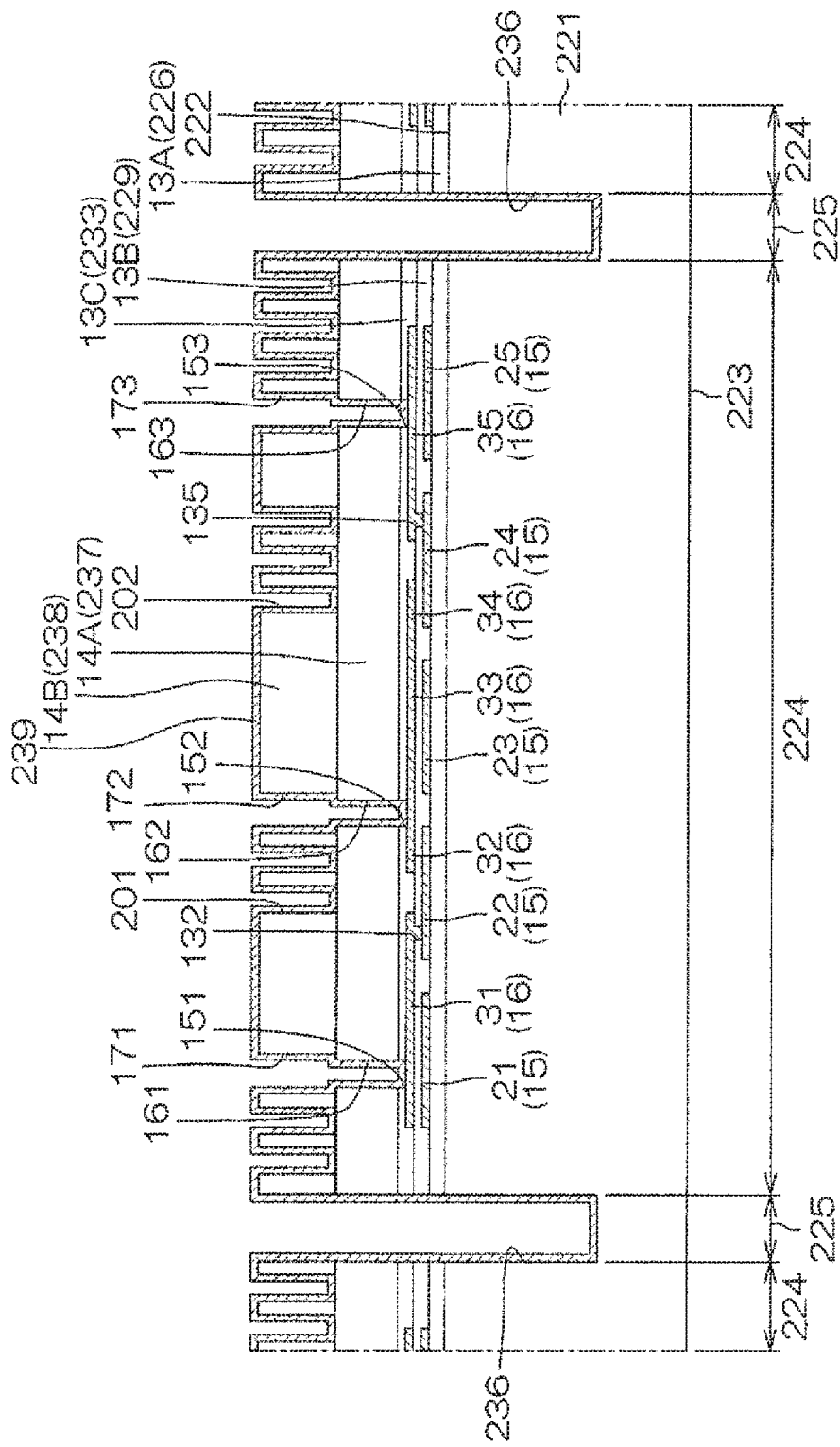
FIG. 14O is a section view of a step after FIG. 14N.
Figure 14P:
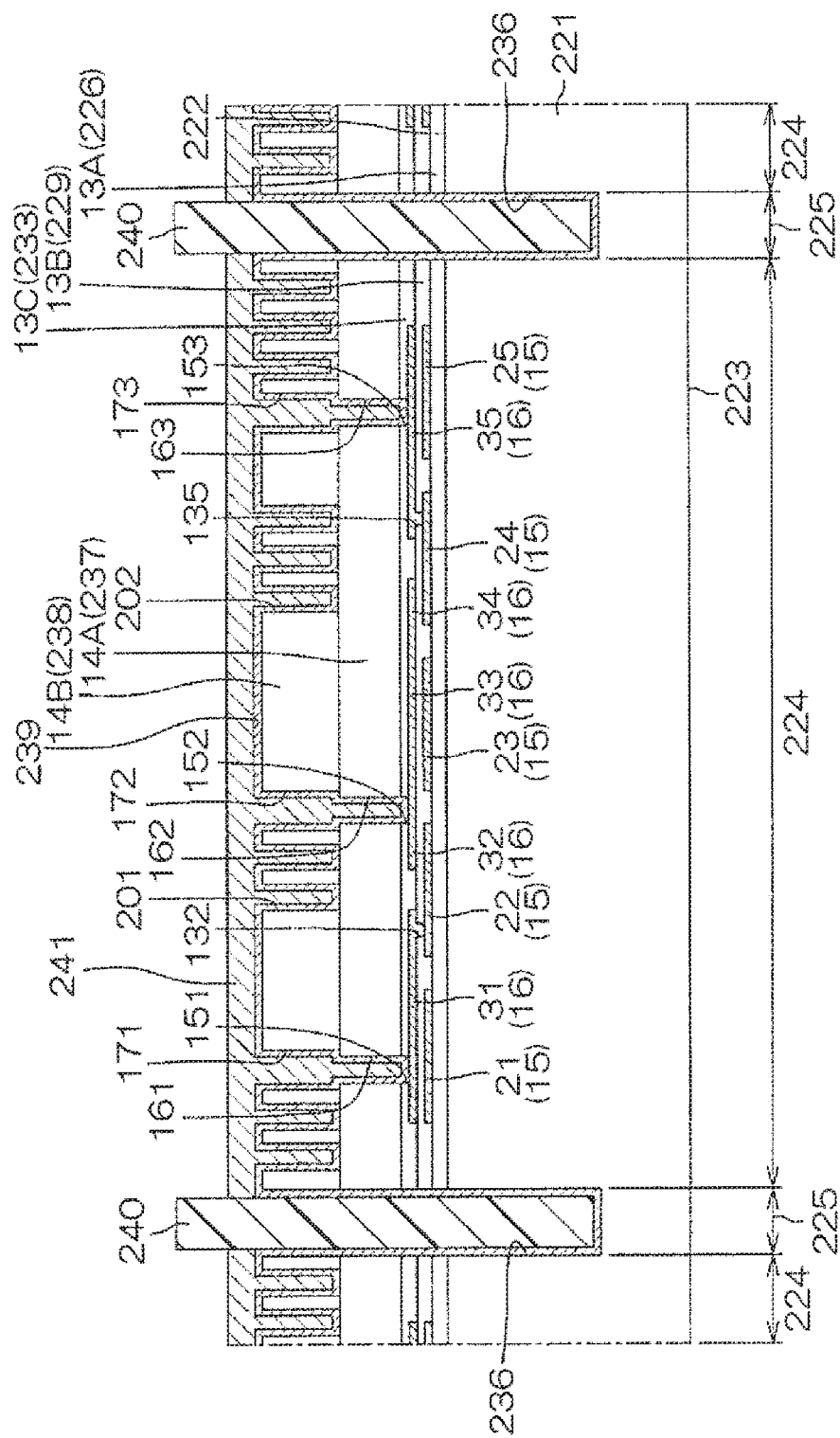
FIG. 14P is a section view of a step after FIG. 14O.
Figure 14Q:
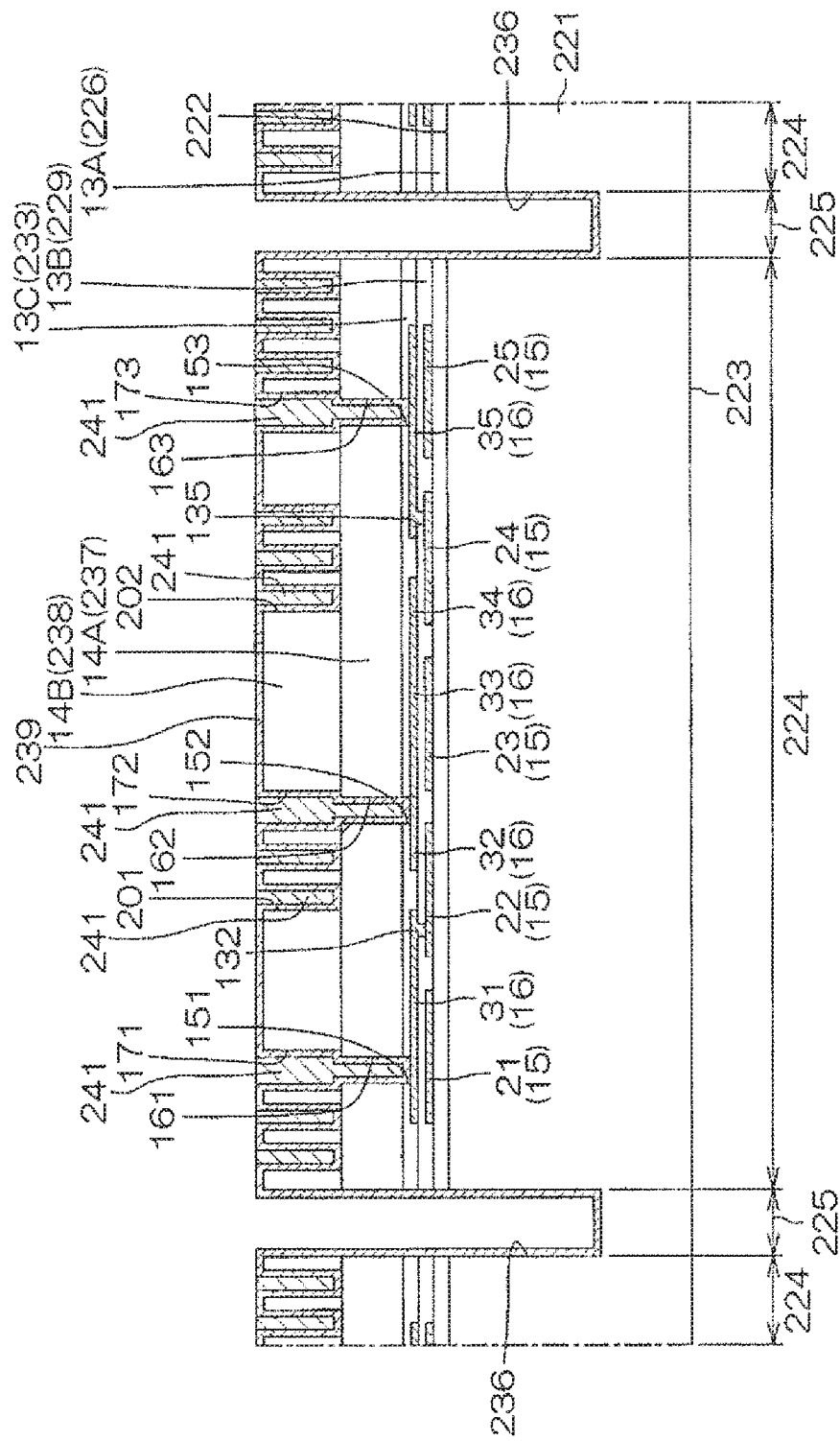
FIG. 14Q is a section view of a step after FIG. 14P.
Figure 14R:
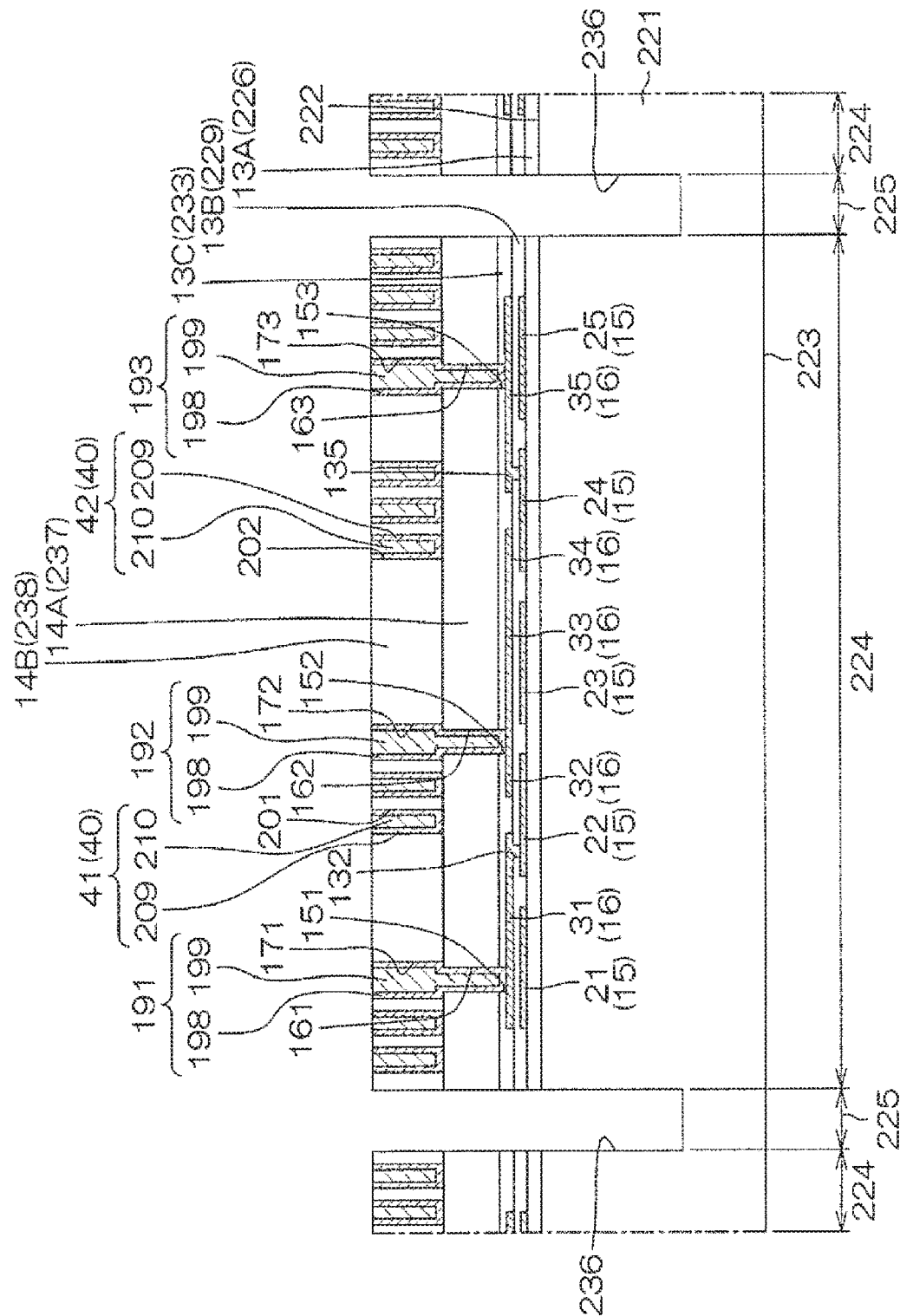
FIG. 14R is a section view of a step after FIG. 14Q.
Figure 14S:
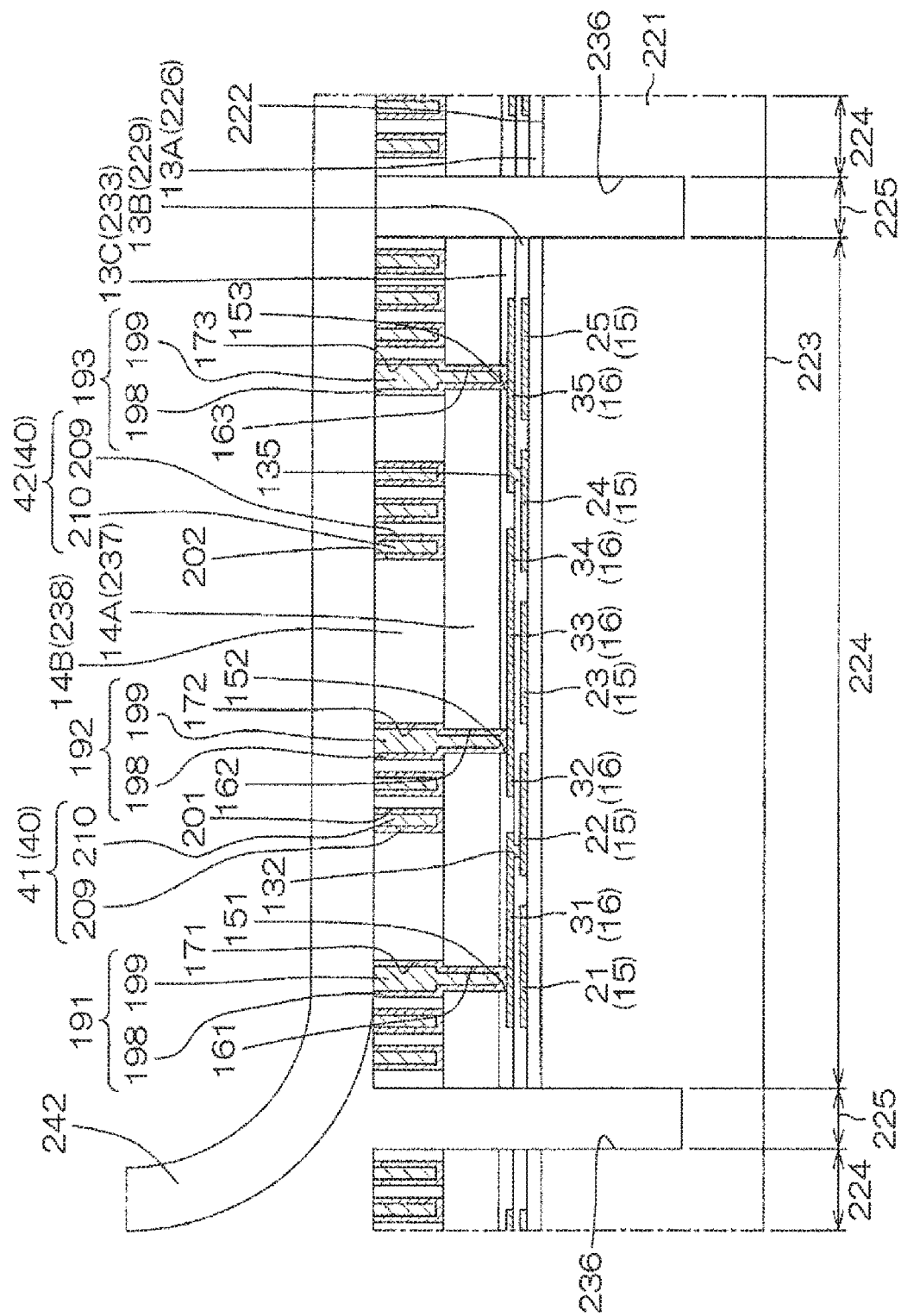
FIG. 14S is a section view of a step after FIG. 14R.
Figure 14T:
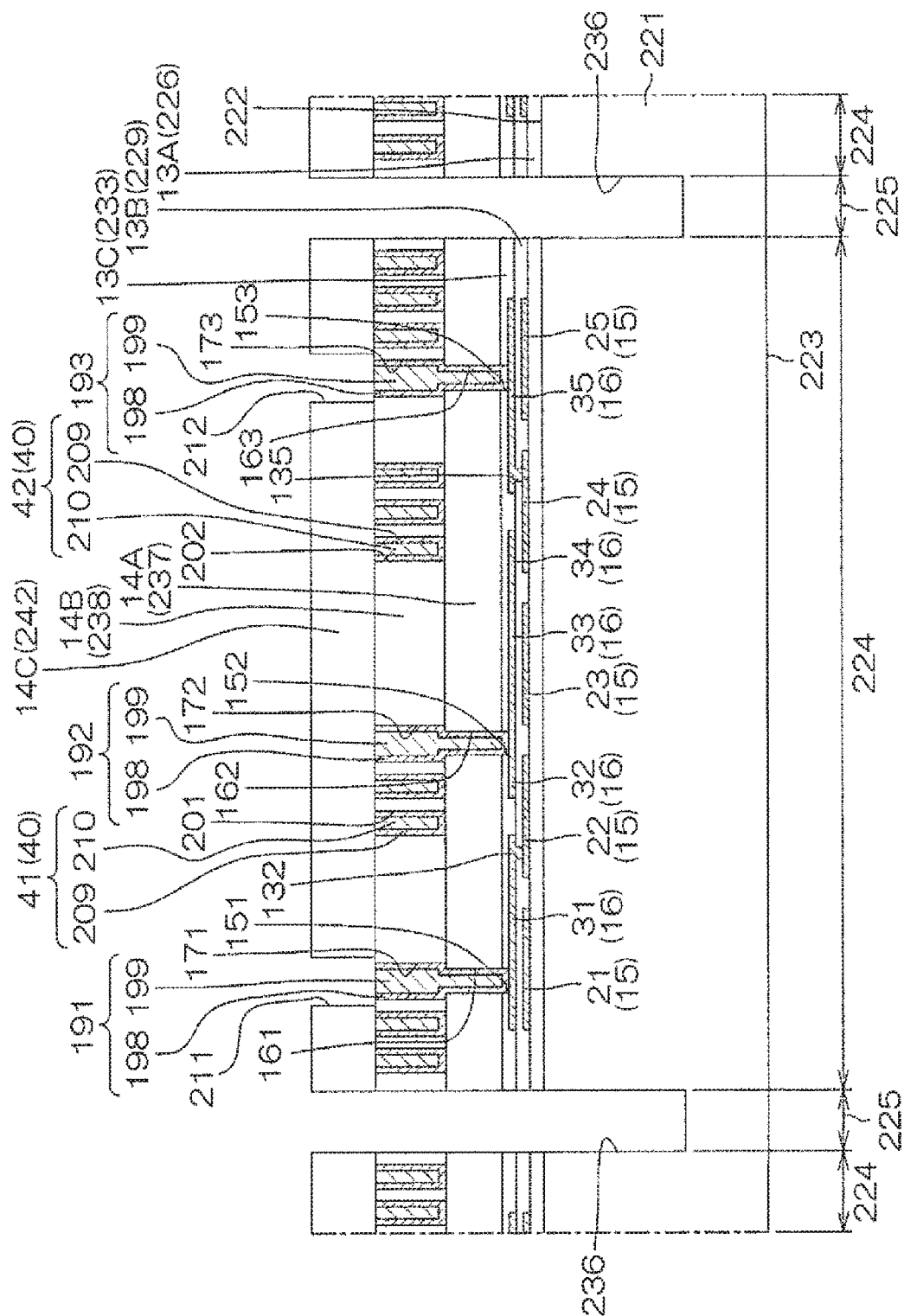
FIG. 14T is a section view of a step after FIG. 14S.
Figure 14U:
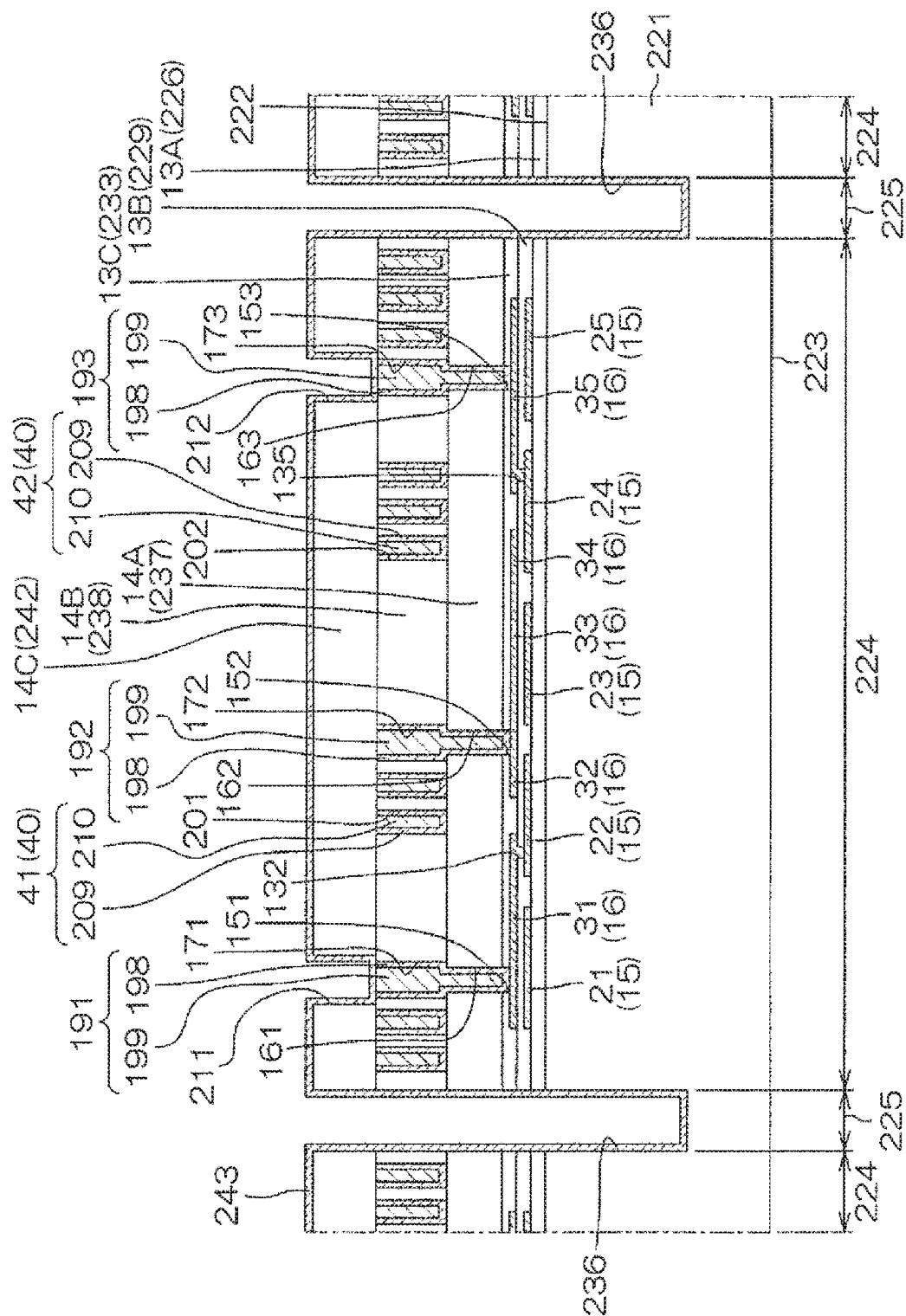
FIG. 14U is a section view of a step after FIG. 14T.
Figure 14V:
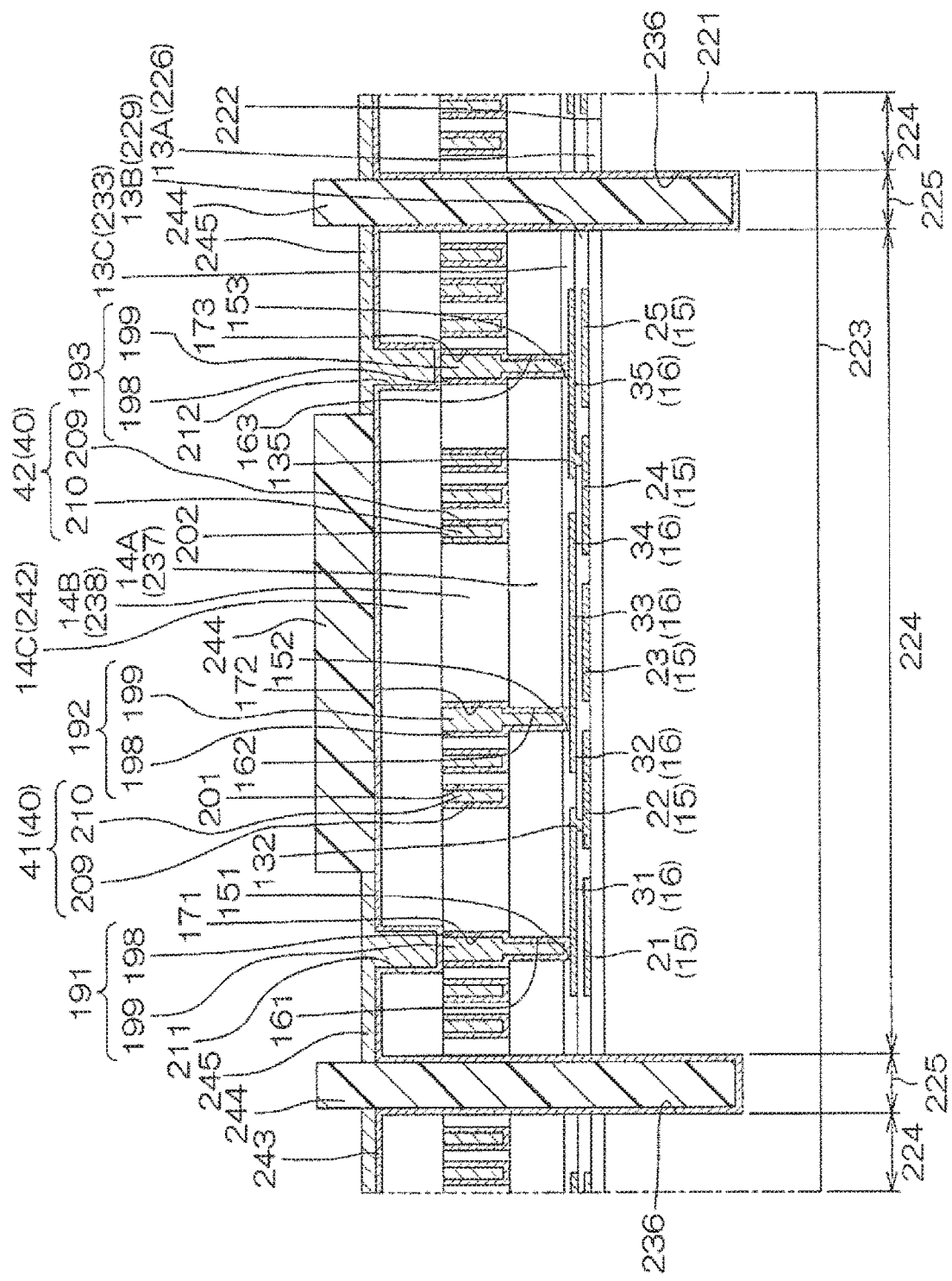
FIG. 14V is a section view of a step after FIG. 14U.
Figure 14W:
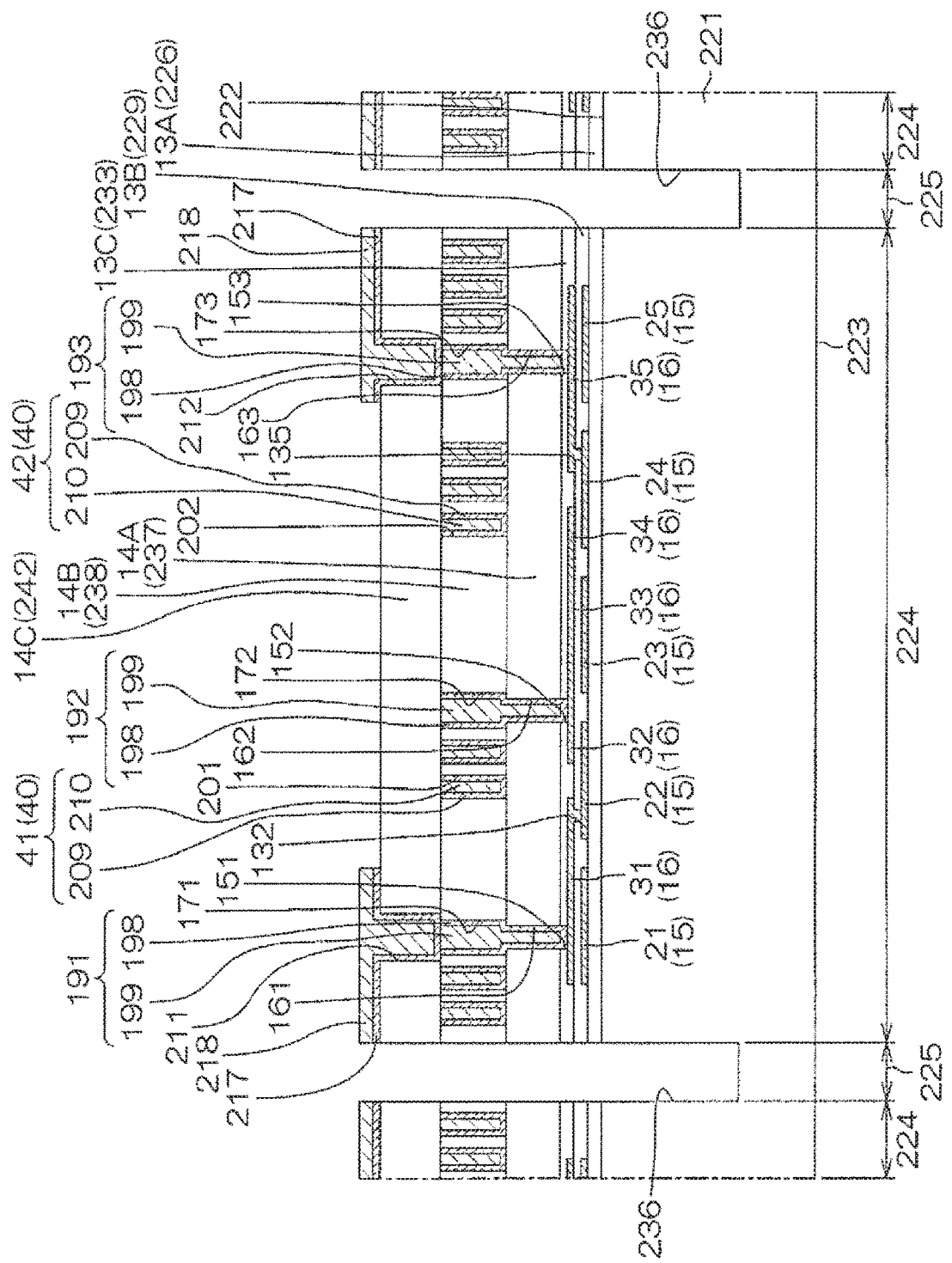
FIG. 14W is a section view of a step after FIG. 14V.
Figure 14X:
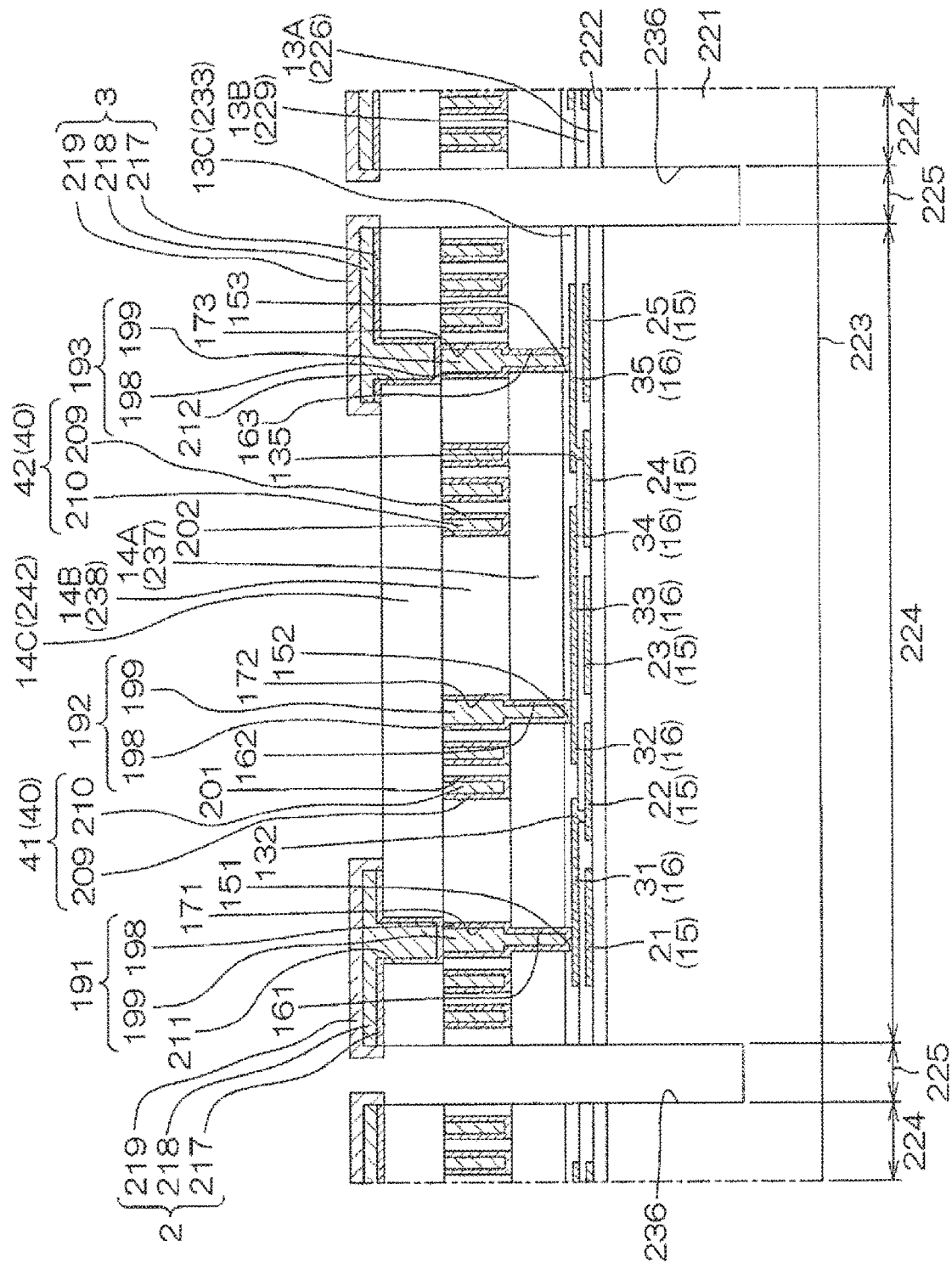
FIG. 14X is a section view of a step after FIG. 14W.
Figure 14Y:
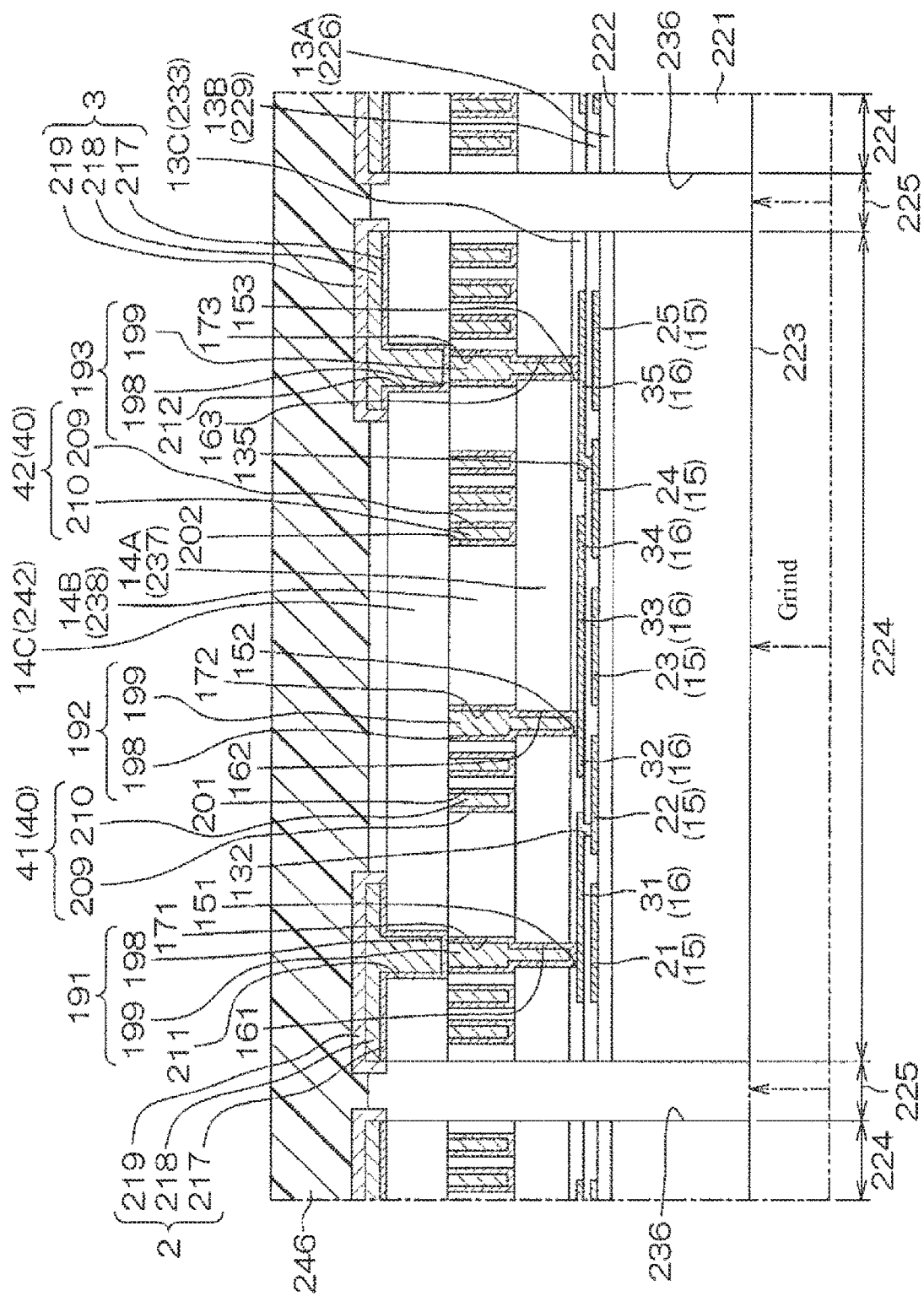
FIG. 14Y is a section view of a step after FIG. 14X.

FIG. 14A to FIG. 14Y are section views for illustrating an example of a manufacturing method for the chip component 1 in FIG. 3.

Referring to FIG. 14A, a base substrate 221 as the base of the substrate 12 is prepared. The base substrate 221 consists of a quadrilateral or circular plate-like member. The base substrate 221 includes a first base main surface 222 on one side and a second base main surface 223 on the other side. The first base main surface 222 and the second substrate main surface 223 correspond to the first substrate main surface 72 and the second substrate main surface 73, respectively.

Next, a plurality of chip regions 224 corresponding to the chip component 1 and a plurality of segmentation regions 225 dividing the plurality of chip regions 224 are set at the base substrate 221. The plurality of chip regions 224 may also be spaced by intervals in the first direction X and the second direction Y and set as an array. The segmentation regions 225 may also be set as grids extending in the first direction X and the second direction Y.

Next, a first substrate inorganic insulating layer 226 serving as the base of the first inorganic insulating layer 13A is formed on the first base main surface 222. The first base inorganic insulating layer 226 consists of a silicon oxide layer or a silicon nitride layer. In this mode, the first base inorganic insulating layer 226 consists of a silicon oxide layer. The first base inorganic insulating layer 226 may be formed by chemical vapor deposition (CVD).

Next, referring to FIG. 14B, a base lower substrate 227 serving as the base of the first to fifth lower electrodes 21 to 25, the first to sixth lower connecting electrodes 101 to 106, and the first to fourth dummy electrodes 121 to 124 is formed on the first base inorganic insulating layer 226. The base lower electrode 227 has a multilayer structure including an Al layer and a TiN layer sequentially deposited from the side of the first base inorganic insulating layer 226. The Al layer and the TiN layer may also be formed by sputtering and/or evaporation.

Next, referring to FIG. 14C, a first mask 228 having a predetermined pattern is formed on the base lower electrode 227. The first mask 228 covers regions in the base lower electrode 227 that are to become the first to fifth lower electrodes 21 to 25, the first to sixth lower connecting electrodes 101 to 106 and the first to fourth dummy electrodes 121 to 124, and exposes regions except these regions.

Next, portions that are not needed under the base lower electrode 227 are removed by etching using the first mask 228. The etching may be wet etching and/or dry etching. The etching is preferably reactive ion etching (RIE) as an example of dry etching. Thus, the base lower electrode 227 is segmented into the first fifth lower electrodes 21 to 25, the first to sixth lower connecting electrodes 101 to 106 and the first to fourth dummy electrodes 121 to 124. The first mask 228 is then removed.

A planar area of all electrodes present on the base lower electrode 227 is increased by the first to fourth dummy electrodes 121 to 124. The first to fourth dummy electrodes 121 to 124 suppress electrochemical corrosion generated by the etching step of the base lower electrode 227 in the first to fifth lower electrodes 21 to 25 and the first to sixth lower connecting electrodes 101 to 106. Thus, the first to fifth lower electrodes 21 to 25 and the first to sixth lower connecting electrodes 101 to 106 may be appropriately formed, and the first to fifth capacitors C1 to C5 having required capacitance values may also be appropriately formed.

Next, referring to FIG. 14D, a second base inorganic insulating layer 229 serving as the base of the second inorganic insulating layer 13B is formed on the first base inorganic insulating layer 226. The second base inorganic insulating layer 229 altogether covers the first to fifth lower electrodes 21 to 25, the first to sixth lower connecting electrodes 101 to 106 and the first to fourth dummy electrodes 121 to 124. The second base inorganic insulating layer 229 consists of a silicon oxide layer or a silicon nitride layer. In this mode, the second base inorganic insulating layer 229 consists of a silicon nitride layer. The second base inorganic insulating layer 229 may be formed by CVD.

Next, referring to FIG. 14E, a second mask 230 having a predetermined pattern is formed on the second base inorganic insulating layer 229. The second mask 230 exposes regions in the second base inorganic insulating layer 229 that are to form the first to sixth lower openings 131 to 136 and portions covering the segmentation regions 225, and covers regions except these regions.

Next, portions that are not needed in the second base inorganic insulating layer 229 are removed by etching using the second mask 230. The etching may be wet etching and/or dry etching. The etching is preferably chemical dry etching (CDE) as an example of dry etching. Thus, the second base inorganic insulating layer 229 is segmented into a plurality of inorganic insulating layers 13B.

Further, the first to sixth lower openings 131 to 136 are formed in each second inorganic insulating layer 13B. The plurality of second inorganic insulating layers 13B divide segmentation lines that expose the first base inorganic insulating layer 226 in the segmentation region 225. The second mask 230 is then removed.

Next, referring to FIG. 14F, a base upper electrode 231 serving as the base of the first to fifth upper electrodes 31 to 35 and the first to fourth upper connecting electrodes 141 to 144 is formed on the first base inorganic insulating layer 226 and the second base inorganic insulating layer 229 (the plurality of second inorganic insulating layers 13B). The base upper electrode 213 has a single-layer structure consisting of an Al layer. The Al layer may be formed by sputtering and/or evaporation.

Next, referring to FIG. 14G, a third mask 232 having a predetermined pattern is formed on the base upper electrode 231. The third mask 232 covers regions in the base upper electrode 231 that are to become the first to fifth upper electrodes 31 to 35 and the first to fourth upper connecting electrodes 141 to 144, and exposes regions other than these regions.

Next, portions that are not needed in the base upper electrodes 231 are removed by etching using the third mask 232. The etching may be wet etching and/or dry etching. The etching is preferably wet etching. Thus, the base upper electrode 231 is segmented into the first to fifth upper electrodes 31 to 35 and the first to fourth upper connecting electrodes 141 to 144. The third mask 232 is then removed.

Next, referring to FIG. 14H, a third base inorganic insulating layer 233 serving as the base of the third inorganic insulating layer 13C is formed on the first base inorganic insulating layer 226 and the second base inorganic insulating layer 229 (the plurality of second inorganic insulating layers 13B). The third base inorganic insulating layer 233 altogether covers the first to fifth upper electrodes 31 to 35 and the first to fourth upper connecting electrodes 141 to 144. The third base inorganic insulating layer 233 consists of a silicon oxide layer or a silicon nitride layer. In this mode, the third base inorganic insulating layer 233 consists of a silicon nitride layer. The third inorganic insulating layer 13C may be formed by CVD.

Next, referring to FIG. 14I, a fourth mask 234 having a predetermined pattern is formed on the third base inorganic insulating layer 233. The fourth mask 234 exposes regions in the third base inorganic insulating layer 233 that are to form the first to seventh upper openings 151 to 157 and portions covering the segmentation regions 225, and covers regions other than these regions.

Next, portions that are not needed in the third base inorganic insulating layer 233 are removed by etching using the fourth mask 234. The etching may be wet etching and/or dry etching. The etching is preferably CDE as an example of dry etching. Thus, the third base inorganic insulating layer 233 is segmented into a plurality of third inorganic insulating layers 13C, hence forming the inorganic insulating layer 13 on each chip region 224.

Further, the first to seventh upper openings 151 to 157 are formed on each third inorganic insulating layer 13C. The plurality of third inorganic insulating layers 14C divide segmentation lines that expose the first base inorganic insulating layer 226 in the segmentation regions 225. The fourth mask 234 is then removed.

Next, referring to FIG. 14J, a fifth mask 235 having a predetermined pattern is formed on the third base inorganic insulating layer 233 (the plurality of third inorganic insulating layers 13C). The fifth mask 235 exposes the segmentation lines, and covers regions other than the segmentation lines.

Next, portions exposed from the fifth mask 235 (the segmentation lines) are removed from the first base inorganic insulating layer 226 by etching. The etching may be wet etching and/or dry etching. The etching is preferably RIE as an example of dry etching. Thus, the first base inorganic insulating layer 226 is segmented into a plurality of first inorganic insulating layers 13A. Further, the first base main surface 222 is exposed from the fifth mask 235 (the segmentation lines).

Next, portions exposed from the fifth mask 235 (the segmentation lines) are removed from the first base main surface 222 by etching. The etching may be wet etching and/or dry etching. The etching is preferably dry etching. Accordingly, grid-like chip slots are formed on the first base main surface 222 in a top view by dividing the plurality of chip regions 224. The fifth mask 235 is then removed.

Next, referring to FIG. 14K, a first base organic insulating layer 237 serving as the base of the first organic insulating layer 14A is formed on the third base inorganic insulating layer 233 (the plurality of third inorganic insulating layers 13C). The first base organic insulating layer 237 includes epoxy as an example of photosensitive resin. The first base organic insulating layer 237 is formed by adhering a dry film resist agent including epoxy resin to the third base inorganic insulating layer 233.

Next, referring to FIG. 14L, the first base organic insulating layer 237 is exposed using a pattern corresponding to the first to seventh lower via holes 161 to 167 and the segmentation regions 225, and is developed. Thus, the first base organic insulating layer 237 is segmented into a plurality of first organic insulating layers 14A.

Further, the first to seventh lower via holes 161 to 167 are formed at each first organic insulating layer 14A. The plurality of first organic insulating layers 14A divide segmentation lines that expose the chip slots 236 in the segmentation regions 235.

Next, referring to FIG. 14M, a second base organic insulating layer 238 serving as the base of the second organic insulating layer 14B is formed on the first base organic insulating layer 237 (the plurality of first organic insulating layers 14A). The second organic insulating layer 238 includes epoxy as an example of photosensitive resin. The second organic insulating layer 238 is formed by adhering a dry film resist agent including epoxy resin to the first base organic insulating layer 237.

Next, referring to FIG. 14N, the second base organic insulating layer 238 is exposed using a pattern corresponding to the first to seventh upper via holes 171 to 177, the first and second coil holes 201 and 202, and the segmentation regions 225, and is developed. Thus, the second base organic insulating layer 238 is segmented into a plurality of second organic insulating layers 14B.

Further, the first to seventh upper via holes 171 to 177 and the first and second coil holes 201 and 202 are formed at each second organic insulating layer 14B. The plurality of second organic insulating layers 14B divide segmentation lines that expose the chip slots 236 in the segmentation regions 235.

Next, referring to FIG. 14O, a seed layer 239 is formed on the second base organic insulating layer 238 (the plurality of second organic insulating layers 14B). The seed layer 239 altogether covers structures on the side of the first base main surface 222. The seed layer 239 is formed as a film along inner walls of the first to seventh upper via holes 171 to 177, inner walls of the first and second coil holes 201 and 202, inner walls of the chip slots 236, an outer surface of the first base organic insulating layer 237 and an outer surface of the second base organic insulating layer 238.

The seed layer 239 has a multilayer structure including a Ti seed layer and a Cu seed layer. The Ti seed layer becomes the base of a Ti layer 198 of the first to seventh via electrodes 191 to 197, and the Ti layer 209 of the first and second coil conductors 41 and 42. The Cu seed layer becomes the base of the Cu layer 199 of the first to seventh via electrodes 191 to 197 and the Cu layer 210 of the first and second coil conductors 41 and 42. The Ti seed layer and the Cu seed layer may be formed by sputtering and/or evaporation.

Next, referring to FIG. 14P, a sixth mask 240 having a predetermined pattern is formed on the first base main surface 222. The sixth mask 240 exposes portions covering the plurality of chip regions 224 in the second base organic insulating layer 238, and covers regions other than these regions.

Next, a Cu layer 241 is formed on the seed layer 239 exposed from the sixth mask 240 by Cu plating. The Cu layer 241 becomes the base of the Cu layer 199 of the first to seventh via electrodes 191 to 197 and the Cu layer 210 of the first and second coil conductors 41 and 42. The sixth mask 240 is then removed.

Next, referring to FIG. 14Q, portions that are not needed in the Cu layer 241 are removed by etching. The etching may be wet etching and/or dry etching. The Cu layer 241 is removed till the seed layer 239 is exposed.

Next, referring to FIG. 14R, the exposed seed layer 239 is removed from the Cu layer 241 by etching. The etching may be wet etching and/or dry etching. The seed layer 239 is removed till the second base organic insulating layer 238 is exposed. Thus, the first to seventh via electrodes 191 to 197 and the first and second coil conductors 41 and 42 are formed.

Next, referring to FIG. 14S, a third base organic insulating layer 242 serving as the base of the third organic insulating layer 14C is formed on the second base organic insulating layer 238 (the plurality of second organic insulating layers 14B). The third base organic insulating layer 242 includes epoxy resin as an example of photosensitive resin. The third base organic insulating layer 242 is formed by adhering a dry film resist agent including epoxy resin to the second base organic insulating layer 238.

Next, referring to FIG. 14T, the third base organic insulating layer 242 is exposed using a pattern corresponding to the first to sixth uppermost via holes 211 to 216 and the segmentation regions 225, and is developed. Thus, the third base organic insulating layer 242 is segmented into a plurality of third organic insulating layers 14C, and the organic insulating layer 14 is formed in each chip region 224.

Further, the first to sixth uppermost via holes 211 to 216 are formed on each third base organic insulating layer 242. The plurality of third organic insulating layers 14C divide segmentation lines that expose the chip slots 236 in the segmentation regions 225.

Next, referring to FIG. 14U, a seed layer 243 is formed on the third base organic insulating layer 242 (the plurality of third organic insulating layers 14C). The seed layer 243 altogether covers structures on the side of the first base main surface 222. The seed layer 243 is formed as a film along inner walls of the first to sixth uppermost via holes 211 to 216, the inner walls of the chip slots 236, outer surfaces of the first to third base inorganic insulating layers 226, 229 and 233, and outer surfaces of the first to third base organic insulating layers 237, 238 and 242.

The seed layer 243 has a multilayer structure including a Ti seed layer and a Cu seed layer. The Ti seed layer becomes the base of the Ti layer 217 of the plurality of external terminals 2 to 5. The Cu seed layer becomes the base of the Cu layer 218 of the plurality of external terminals 2 to 5. The Ti seed layer and the Cu seed layer may be formed by sputtering and/or evaporation.

Next, referring to FIG. 14V, a seventh mask 244 having a predetermined mask is formed on the first base main surface 222. The seventh mask 244 exposes regions that are to form the plurality of external terminals 2 to 5, and covers regions other than these regions.

Next, a Cu layer 245 is formed on the seed layer 243 exposed from the seventh mask 244 by Cu plating. The Cu layer 245 becomes the base of the Cu layer 218 of the plurality of external terminals 2 to 5. The seventh mask 244 is then removed.

Next, referring to FIG. 14W, the seed layer 243 exposed from the Cu layer 245 is removed by etching. The etching may be wet etching and/or dry etching. The seed layer 243 is removed till the third base organic insulating layer 242 is exposed.

Next, referring to FIG. 14X, the plurality of outer surface electrodes 219 are formed on the plurality of the Cu layer 245, respectively. Each outer surface electrode 219 has a multilayer structure including an Ni layer, a Pd layer and an Au layer sequentially deposited from the side of each Cu layer 245. The Ni layer, Pd layer and Au layer are respectively formed by electroless plating.

Next, referring to FIG. 14Y, an adhesive tape 246 supporting the base substrate 221 is adhered to the structures on the side of the first base main surface 22. Next, the second base main surface 223 of the base substrate 221 is ground. The second base main surface 223 may also be ground by chemical mechanical polishing (CMP). The second base main surface 223 is ground till it is in communication with the chip slots 236.

Thus, the base substrate 221 is divided into a plurality of bases 12, so as to cut a plurality of chip components from one piece of base substrate 221. The step of grinding the second base main surface 223 may also be continued after the second base main surface 223 has become in communication with the chip slots 236. That is to say, the step of grinding the second base main surface 223 may further include a step of thinning the base substrate 221 (the substrate 12) to a required thickness. The chip component 1 is prepared by steps as described above.

The present invention may also be implemented in other modes.

In the foregoing embodiment, an example in which the organic sidewalls 94A to 94D of the organic insulating layer 14 are connected to the inorganic sidewalls 84A to 84D of the inorganic insulating layer 13 is described. However, the first to fourth organic sidewalls 94A to 94D of the organic insulating layer 14 may also cover the inorganic sidewalls 84A to 84D of the inorganic insulating layer 13.

In this case, the inorganic insulating layer 13 may also be spaced from the first to fourth substrate sidewalls 74A to 74D and formed on the first substrate main surface 72, in a manner of exposing periphery portions of the first substrate main surface 72 of the substrate 12. Further, in this case, a portion of the organic insulating layer 14 may also be connected to the first substrate main surface 72.

In the foregoing embodiment, an example in which the plurality of dummy electrodes 121 to 124 are formed on the first inorganic insulating layer 13A and the dummy electrodes 121 to 124 are not formed on the second inorganic insulating layer 13B is described. However, the plurality of dummy electrodes 121 to 124 may also be formed by the same mode on the second inorganic insulating layer 13B.

In the foregoing embodiment, the substrate 12 consisting of a Si substrate, a SiC substrate, a diamond substrate or a compound semiconductor substrate may also be adopted. When the substrate 12 consists of a Si substrate, a SiC substrate, or a compound semiconductor substrate, a circular disc-like wafer cut from a crystal block is used as the base substrate 221. In this case, the chip component 1 consisting of a so-called wafer-level chip size package is manufactured.

When the substrate 12 consists of a Si substrate or SiC substrate, the first inorganic insulating layer 13A (the first base inorganic insulating layer 226) may also be formed on the first base main surface 222 (the first substrate main surface 72 of the substrate 12) by thermal oxidation in substitution for CVD.

In the various embodiments above, the substrate 12 may be an insulating substrate. The insulating substrate may be a glass substrate, a ceramic substrate or a resin substrate. In this case, the first inorganic insulating layer 13A may be removed.

In the foregoing embodiment, an example in which the LC circuit 6 includes an elliptic filter circuit is described. however, the LC circuit 6 may adopt various modes of including at least one of the first and second inductors L1 and L2 and at least one of the first to fifth capacitors C1 to C5 by adjusting the presence and connection modes of the external terminals 2 to 5, the first to fifth capacitors C1 to C5, and the first and second inductors L1 and L2. In the description below, other examples of the LC circuit 6 are given with reference to FIG. 15 to FIG. 25.

Figure 15:
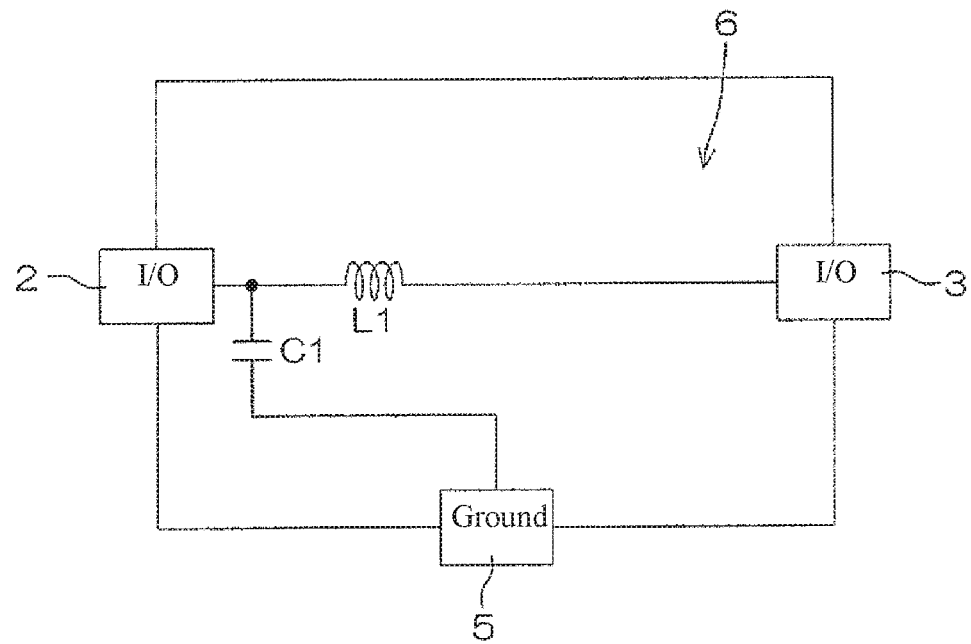
FIG. 15 is a circuit diagram of an LC circuit of a second exemplary mode.

FIG. 15 shows a circuit diagram of the LC circuit 6 according to a second exemplary mode. In the description below, components corresponding to the components described in FIG. 1 to FIG. 13 are represented by the same denotations and associated description is omitted.

Referring to FIG. 15, the LC circuit 6 includes an L-type filter circuit. The L-type filter circuit includes the first inductor L1 and the first capacitor C1. The first inductor L1 is connected to the first I/O terminal 2 and the second I/O terminal 3. The first capacitor C1 is connected to the first I/O terminal 2 and the second reference terminal 5. In this exemplary mode, the first reference terminal 4 is not provided; alternatively, the first reference terminal 4 may also be provided.

Figure 16:
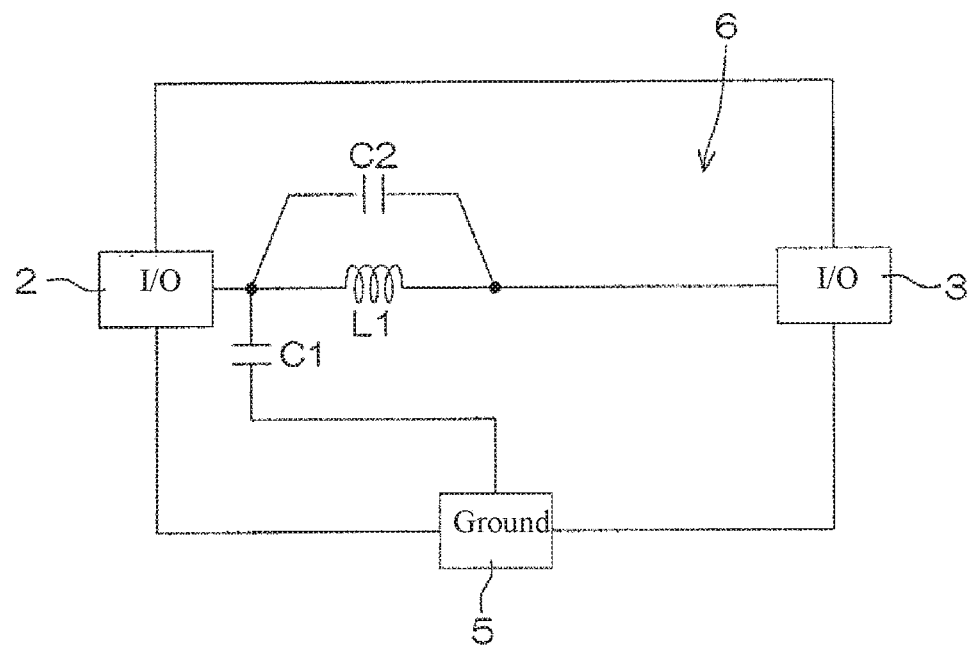
FIG. 16 is a circuit diagram of an LC circuit of a third exemplary mode.

FIG. 16 shows a circuit diagram of the LC circuit 6 of a third exemplary mode. In the description below, components corresponding to the components described in FIG. 1 to FIG. 13 are represented by the same denotations and associated description is omitted.

Referring to FIG. 16, the LC circuit 6 includes an L-type filter circuit. The L-type filter circuit includes the first inductor L1, the first capacitor C1 and the second capacitor C2. The first inductor L1 is connected to the first I/O terminal 2 and the second I/O terminal 3. The first capacitor C1 is connected to the first I/O terminal 2 and the second reference terminal 5. The second capacitor C2 is connected in parallel to the first inductor L1. In this exemplary mode, the first reference terminal 4 is not provided; alternatively, the first reference terminal 4 may also be provided.

Figure 17:
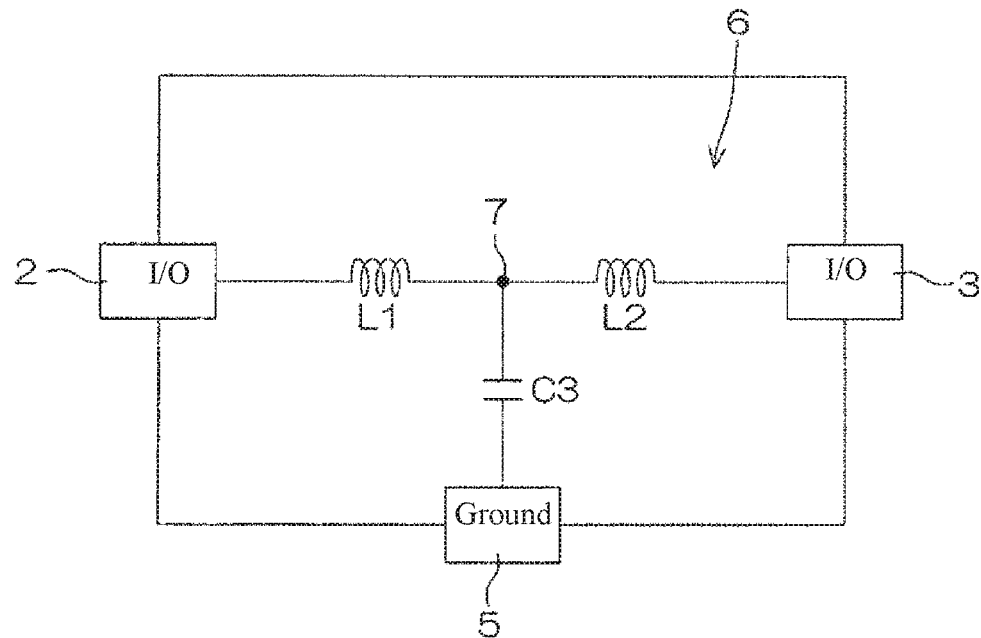
FIG. 17 is a circuit diagram of an LC circuit of a fourth exemplary mode.

FIG. 17 shows a circuit diagram of the LC circuit 6 of a fourth exemplary mode. In the description below, components corresponding to the components described in FIG. 1 to FIG. 13 are represented by the same denotations and associated description is omitted.

Referring to FIG. 17, the LC circuit 6 includes a T-type filter circuit. The T-type filter circuit includes the first inductor L1, the second inductor L2 and the third capacitor C3. The first inductor L1 is connected to the first I/O terminal 2. The second inductor L2 is connected to the first inductor L1 and the second I/O terminal 3. The third capacitor C3 is connected to the inductor connecting portion 7 and the second reference terminal 5. In this exemplary mode, the first reference terminal 4 is not provided; alternatively, the first reference terminal 4 may also be provided.

Figure 18:
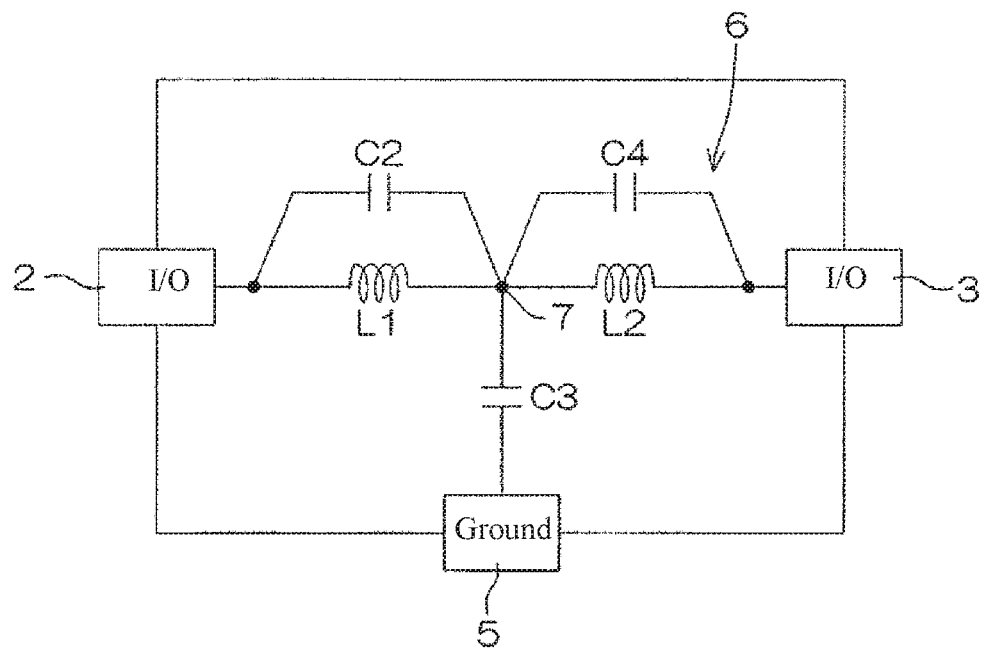
FIG. 18 is a circuit diagram of an LC circuit of a fifth exemplary mode.

FIG. 18 shows a circuit diagram of a fifth exemplary mode. In the description below, components corresponding to the components described in FIG. 1 to FIG. 13 are represented by the same denotations and associated description is omitted.

Referring to FIG. 18, the LC circuit 6 includes a T-type filter circuit. The T-type filter circuit includes the first inductor L1, the second inductor L2, the second capacitor C2, the third capacitor C3 and the fourth capacitor C4. The first inductor L1 is connected to the first I/O terminal 2. The second inductor L2 is connected to the first inductor L1 and the second I/O terminal 3.

The second capacitor C2 is connected in parallel to the first inductor L1. The third capacitor C3 is connected to the inductor connecting portion 7 and the second reference terminal 5. The fourth capacitor C4 is connected in parallel to the second inductor L2. In this exemplary mode, the first reference terminal 4 is not provided; alternatively, the first reference terminal 4 may also be provided.

Figure 19:
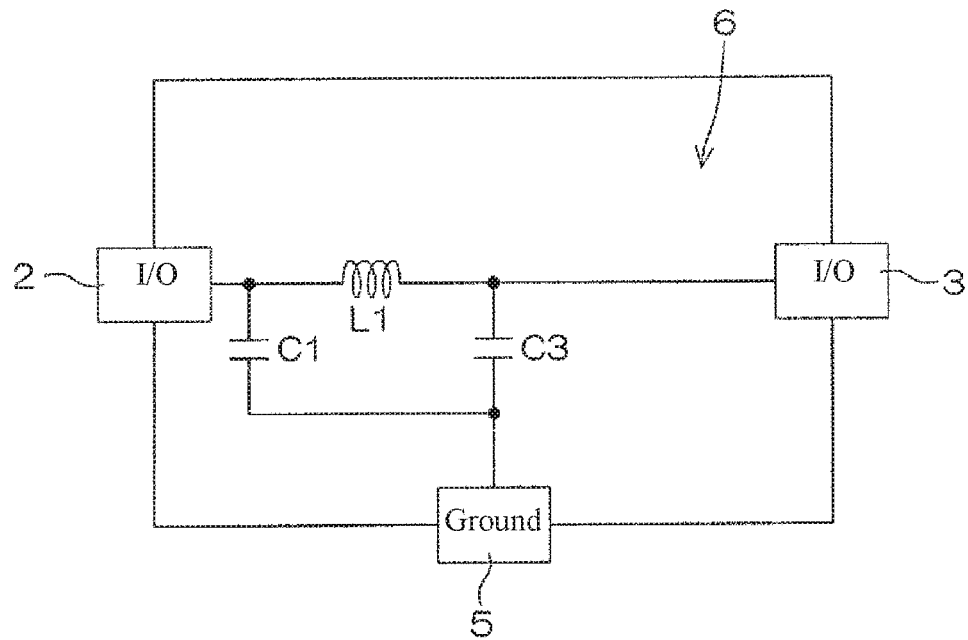
FIG. 19 is a circuit diagram of an LC circuit of a sixth exemplary mode.

FIG. 19 shows a circuit diagram of the LC circuit 6 of a sixth exemplary mode. In the description below, components corresponding to the components described in FIG. 1 to FIG. 13 are represented by the same denotations and associated description is omitted.

FIG. 19, the LC circuit 6 includes a π-type filter circuit. The π-type filter circuit includes the first inductor L1, the first capacitor C1 and the third capacitor C3. The first inductor L1 is connected to the first I/O terminal 2 and the second I/O terminal 3. The first capacitor C1 is connected to the first I/O terminal 2 and the second reference terminal 5. The third capacitor C3 is connected to the second I/O terminal 3 and the second reference terminal 5. In this exemplary mode, the first reference terminal 4 is not provided; alternatively, the first reference terminal 4 may also be provided.

Figure 20:
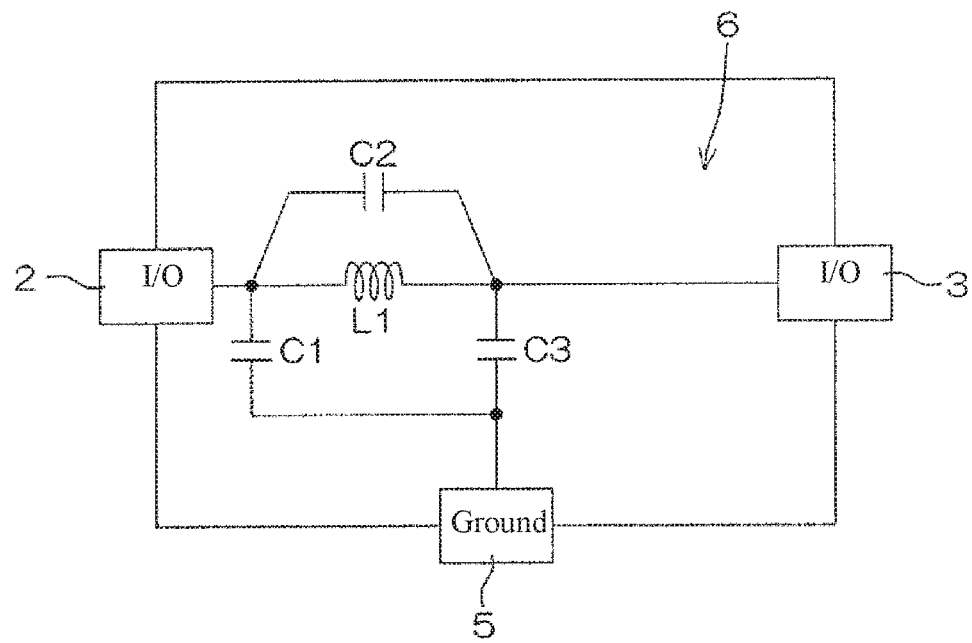
FIG. 20 is a circuit diagram of an LC circuit of a seventh exemplary mode.

FIG. 20 shows a circuit diagram of the LC circuit 6 of a seventh exemplary mode. In the description below, components corresponding to the components described in FIG. 1 to FIG. 13 are represented by the same denotations and associated description is omitted.

FIG. 20, the LC circuit 6 includes a π-type filter circuit. The π-type filter circuit includes the first inductor L1, the first capacitor C1, the second capacitor C2 and the third capacitor C3. The first inductor L1 is connected to the first I/O terminal 2 and the second I/O terminal 3.

The first capacitor C1 is connected to the first I/O terminal 2 and the second reference terminal 5. The second capacitor C2 is connected in parallel to the first inductor L1. The third capacitor C3 is connected to the second I/O terminal 3 and the second reference terminal 5. In this exemplary mode, the first reference terminal 4 is not provided; alternatively, the first reference terminal 4 may also be provided.

Figure 21:
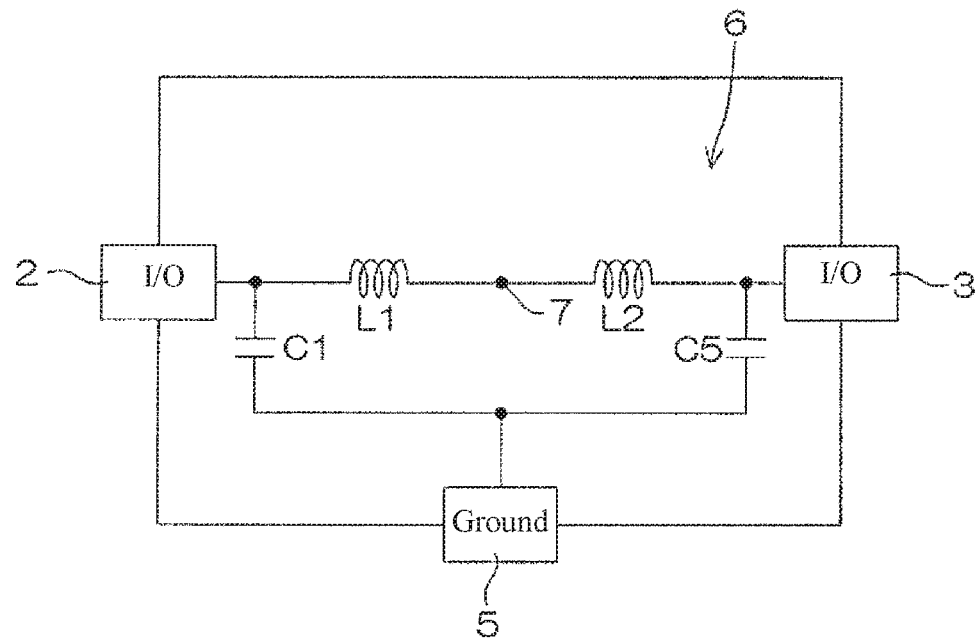
FIG. 21 is a circuit diagram of an LC circuit of an eighth exemplary mode.

FIG. 21 shows a circuit diagram of the LC circuit 6 of an eighth exemplary mode. In the description below, components corresponding to the components described in FIG. 1 to FIG. 13 are represented by the same denotations and associated description is omitted.

FIG. 21, the LC circuit 6 includes a π-type filter circuit. The π-type filter circuit includes the first inductor L1, the second inductor L2, the first capacitor C1 and the fifth capacitor C5. The first inductor L1 is connected to the first I/O terminal 2. The second inductor L2 is connected to the first inductor L1 and the second I/O terminal 3.

The first capacitor C1 is connected to the first I/O terminal 2 and the second reference terminal 5. The fifth capacitor C5 is connected to the second I/O terminal 3 and the second reference terminal 5. In this exemplary mode, the first reference terminal 4 is not provided; alternatively, the first reference terminal 4 may also be provided.

Figure 22:
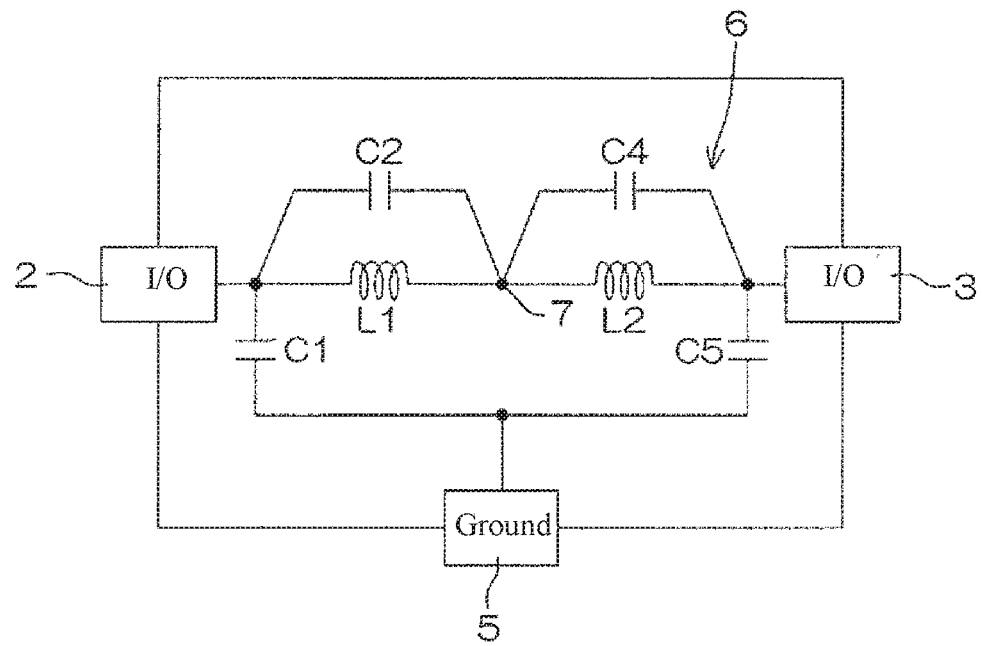
FIG. 22 is a circuit diagram of an LC circuit of a ninth exemplary mode.

FIG. 22 shows a circuit diagram of the LC circuit 6 of a ninth exemplary mode. In the description below, components corresponding to the components described in FIG. 1 to FIG. 13 are represented by the same denotations and associated description is omitted.

FIG. 22, the LC circuit 6 includes a π-type filter circuit. The π-type filter circuit includes the first inductor L1, the second inductor L2, the first capacitor C1, the second capacitor C2, the fourth capacitor C4 and the fifth capacitor C5. The first inductor L1 is connected to the first I/O terminal 2. The second inductor L2 is connected to the first inductor L1 and the second I/O terminal 3.

The first capacitor C1 is connected to the first I/O terminal 2 and the second reference terminal 5. The second capacitor C2 is connected in parallel to the first inductor L1. The fourth capacitor C4 is connected in parallel to the second inductor L2. The fifth capacitor C5 is connected to the second I/O terminal 3 and the second reference terminal 5. In this exemplary mode, the first reference terminal 4 is not provided; alternatively, the first reference terminal 4 may also be provided.

Figure 23:
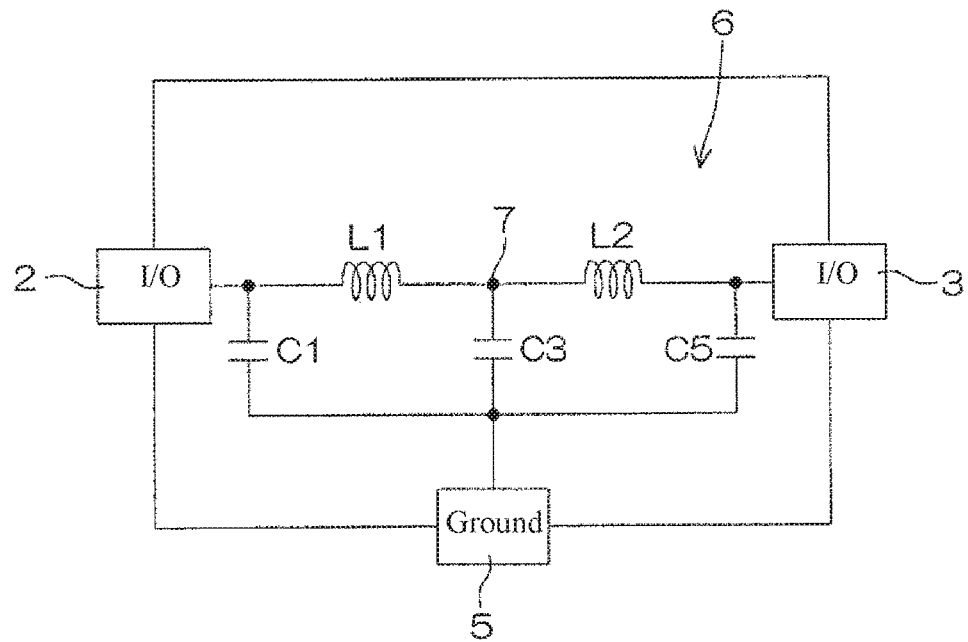
FIG. 23 is a circuit diagram of an LC circuit of a tenth exemplary mode.

FIG. 23 shows a circuit diagram of the LC circuit 6 of a tenth exemplary mode. In the description below, components corresponding to the components described in FIG. 1 to FIG. 13 are represented by the same denotations and associated description is omitted.

Referring to FIG. 23, the LC circuit 6 includes a ladder filter circuit. The ladder filter circuit includes the first inductor L1, the second inductor L2, the first capacitor C1, the third capacitor C3 and the fifth capacitor C5. The first inductor L1 is connected to the first I/O terminal 2. The second inductor L2 is connected to the first inductor L1 and the second I/O terminal 3.

The first capacitor C1 is connected to the first I/O terminal 2 and the second reference terminal 5. The third capacitor C3 is connected to the inductor connecting portion 7 and the second reference terminal 5. The fifth capacitor C5 is connected to the second I/O terminal 3 and the second reference terminal 5. In this exemplary mode, the first reference terminal 4 is not provided; alternatively, the first reference terminal 4 may also be provided.

Figure 24:
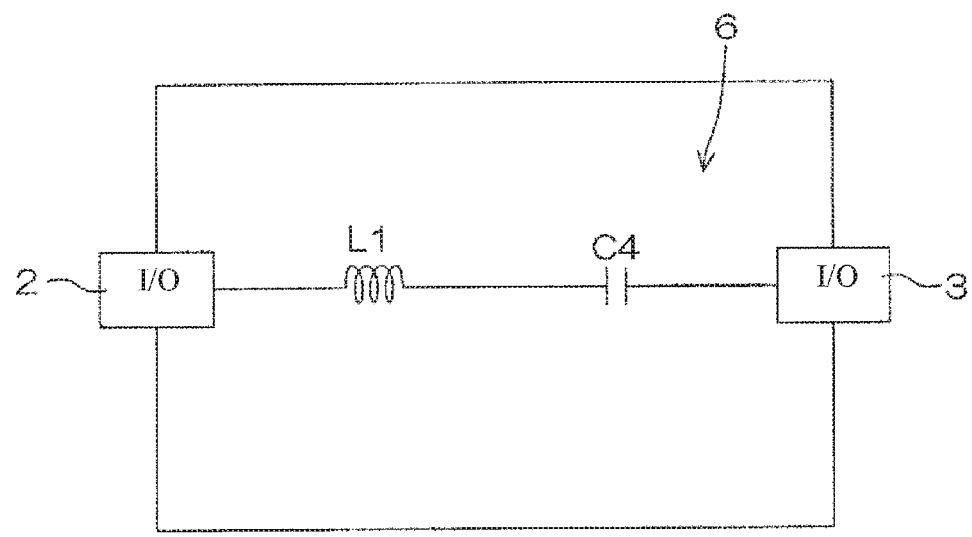
FIG. 24 is a circuit diagram of an LC circuit of an eleventh exemplary mode.

FIG. 24 shows a circuit diagram of the LC circuit 6 of an eleventh exemplary mode. In the description below, components corresponding to the components described in FIG. 1 to FIG. 13 are represented by the same denotations and associated description is omitted.

Referring to FIG. 24, the LC circuit 6 includes an LC series resonance circuit. The LC series resonance circuit includes the first inductor L1 and the fourth capacitor C4. The first inductor L1 is connected to the first I/O terminal 2. The fourth capacitor C4 is connected to the first inductor L1 and the second I/O terminal 3. In this exemplary mode, the first reference terminal 4 and the second reference terminal 5 are not provided.

Figure 25:
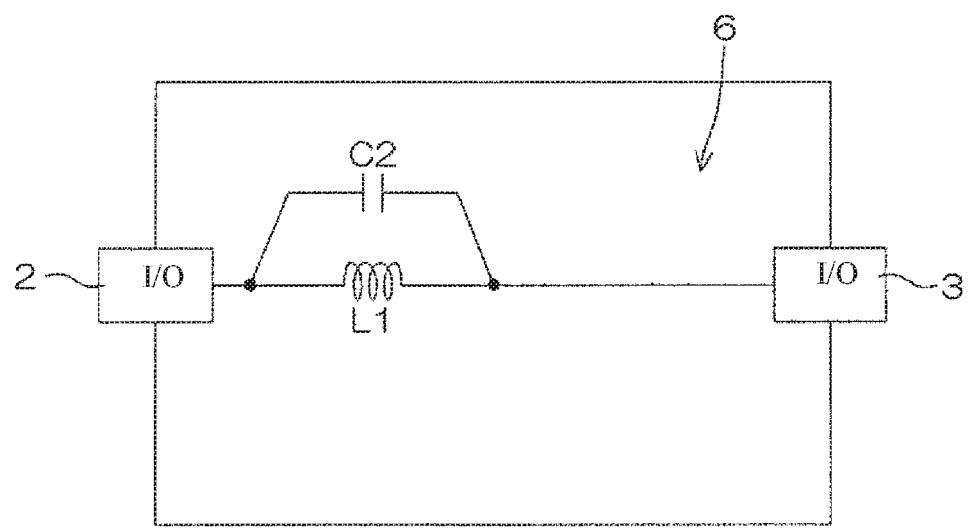
FIG. 25 is a circuit diagram of an LC circuit of a twelfth exemplary mode.

FIG. 25 shows a circuit diagram of the LC circuit 6 of a twelfth exemplary mode. In the description below, components corresponding to the components described in FIG. 1 to FIG. 13 are represented by the same denotations and associated description is omitted.

Referring to FIG. 25, the LC circuit 6 includes an LC series resonance circuit. The LC series resonance circuit includes the first inductor L1 and the second capacitor C2. The first inductor L1 is connected to the first I/O terminal 2 and the second I/O terminal 3. The second capacitor C2 is connected in parallel to the first inductor L. In this exemplary mode, the first reference terminal 4 and the second reference terminal 5 are not provided.

FIG. 15 to FIG. 25 show merely examples of the LC circuit 6. Apart from the exemplary modes of FIG. 15 to FIG. 25, various modes formed by selectively combining at least one of the first and second inductors L1 and L2 and at least one of the first to fifth capacitors C1 to C5 may also be adopted.

Details of the embodiments of the present invention are as given above. However, the specific embodiments are described to more clearly explain the technical contents of the present invention, and the present invention is not to be construed to these non-limiting embodiments. Therefore, the scope of the present invention is to be accorded with the appended claims.

What is claimed is:

1. A chip component, comprising: a substrate;
an inorganic insulating layer, formed on the substrate;
an organic insulating layer, formed on the inorganic insulating layer; and
an LC circuit, comprising a capacitor formed in the inorganic insulating layer, and an inductor formed, in a manner of being electrically connected to the capacitor, in the organic insulating layer.

2. The chip component according to claim 1, wherein the LC circuit comprises:
an L-type filter circuit, comprising one capacitor and one inductor.

3. The chip component according to claim 1, wherein the LC circuit comprises:

a T-type filter circuit, comprising one capacitor and two inductors.

4. The chip component according to claim 1, wherein the LC circuit comprises:
a π-type circuit, comprising two capacitors and one inductor.

5. The chip component according to claim 1, wherein the LC circuit comprises:
a ladder filter circuit, comprising a plurality of the capacitors and a plurality of the inductors.

6. The chip component according to claim 1, wherein the LC circuit comprises:
an elliptic filter circuit, comprising a plurality of the capacitors and a plurality of the inductors.

7. The chip component according to claim 1, wherein the capacitor comprises:
a lower electrode, disposed in the inorganic insulating layer; and
an upper electrode, disposed in the inorganic insulating layer by facing the lower electrode with a portion of the inorganic insulating layer spaced in between.

8. The chip component according to claim 7, wherein the upper electrode faces the lower electrode in a layering direction of the inorganic insulating layer.

9. The chip component according to claim 7, further comprising:
a dummy electrode, disposed by a space from the lower electrode in the inorganic insulating layer where the lower electrode is disposed, and being formed in an electrically floating state.

10. The chip component according to claim 1, wherein the inductor comprises a thickness more than that of the inorganic insulating layer.

11. The chip component according to claim 1, wherein the inductor comprises:
a spiral coil conductor, disposed in the organic insulating layer.

12. The chip component according to claim 1, wherein the LC circuit comprises:
a wiring, electrically connected to the capacitor in the inorganic insulating layer, and electrically connected to the inductor in the organic insulating layer.

13. The chip component according to claim 1, wherein the inorganic insulating layer comprises a thickness less than that of the substrate, and the organic insulating layer comprises a thickness more than that of the inorganic insulating layer.

14. The chip component according to claim 1, wherein the organic insulating layer comprises a thickness more than that of the substrate.

15. The chip component according to claim 1, comprising:
a chip body, serving as a package, comprising a multilayer structure having the substrate, the inorganic insulating layer and the organic insulating layer.

16. The chip component according to claim 1, further comprising:
a plurality of external terminals, exposed from the organic insulating layer and electrically connected to the LC circuit.

17. A chip component, comprising:
a substrate;
an inorganic insulating layer, formed on the substrate;
an organic insulating layer, formed on the inorganic insulating layer;
a capacitor, comprising a lower electrode disposed in the inorganic insulating layer, and an upper electrode disposed in the inorganic insulating layer by facing the lower electrode with a portion of the inorganic insulating layer spaced in between; and an inductor, comprising a spiral coil conductor disposed in the organic insulating layer, the inductor and the capacitor forming an LC circuit.

18. The chip component according to claim 17, further comprising:

a via electrode, crossing a boundary between the inorganic insulating layer and the organic insulating layer, electrically connected to the capacitor in the inorganic insulating layer, and electrically connected to the inductor in the organic insulating layer.

19. The chip component according to claim 17, wherein the coil conductor is thicker than the inorganic insulating layer.

* * * * *

UNITED STATES PATENT AND TRADEMARK OFFICE
CERTIFICATE OF CORRECTION

PATENT NO. : 11,410,985 B2
APPLICATION NO. : 16/898950
DATED : August 9, 2022
INVENTOR(S) : Takuma Shimoichi Page 1 of 1

It is certified that error appears in the above-identified patent and that said Letters Patent is hereby corrected as shown below:

On the Title Page

Item (73), should read:
(73) Assignee: ROHM CO., LTD., Kyoto (JP)

Signed and Sealed this
Fifteenth Day of October, 2024

Katherine Kelly Vidal
*Director of the United States Patent and Trademark Office*